United States Patent [19]

Fant et al.

[11] Patent Number: 5,664,212

[45] Date of Patent: Sep. 2, 1997

[54] NULL CONVENTION LOGIC SYSTEM

[75] Inventors: Karl M. Fant; Scott A. Brandt, both of Minneapolis, Minn.

[73] Assignee: Theseus Research, Inc., St. Paul, Minn.

[21] Appl. No.: 220,636

[22] Filed: Mar. 31, 1994

Related U.S. Application Data

[63] Continuation of Ser. No. 74,288, Jun. 8, 1993, Pat. No. 5,305,463, which is a continuation of Ser. No. 702,016, May 11, 1991, abandoned.

[51] Int. Cl.$^6$ ............................................. G06F 1/00
[52] U.S. Cl. ............................ 395/141; 364/936.1
[58] Field of Search ............................................. 395/800

[56] References Cited

U.S. PATENT DOCUMENTS 4,845,653  7/1989  Furtck ..................... 364/490

FOREIGN PATENT DOCUMENTS

| | | |
|---|---|---|
| 0 566 739 A1 | 10/1993 | European Pat. Off. |
| 0 570 584 A1 | 11/1993 | European Pat. Off. |
| 0 578 821 A1 | 1/1994  | European Pat. Off. |
| WO92/12498   | 7/1992  | WIPO. |
| WO92/16971   | 10/1992 | WIPO. |
| WO94/03929   | 2/1994  | WIPO. |

OTHER PUBLICATIONS

Tadashi Shibata & Tadahiro Ohmi, A Functional MOS Transistor Featuring Gate–Level Weighted Sum and Threshold Operations, IEEE Transactions On Electron Devices, Dec. 1992, vol. 39, No. 6, pp. 1444–1455.

Mark Edward Dean, Strip: A Self–Timed Risc Processor, Jun. 1992.

Daniel Hampel & Robert Winder, Threshold Logic, IEEE Spectrum, Apr. 1971, pp. 32–39.

Janusz A. Brzozowski & Carl–Johan H. Seger, Asynchronous Circuits—Monographs in Computer Science, Springer–Verlag New York, Inc., 1995, New York, NY.

M.R. Greenstreet, T.E. Williams, and J. Staunstrup, Self–Timed Iteration, Elsevier Science Publishers B.V. (North–Holland), IFIP, 1988, pp. 309–322.

Teresa H.–Y. Meng, Robert W. Brodersen, and David G. Messerschmitt, Automatic Synthesis of Asynchronous Circuits from High–Level Specifications, IEEE Transactions on Computer–Aided Design, vol. 8, No. 11, Nov. 1989, pp. 1185–1205.

Ted Williams, Latency and Throughput Tradeoffs in Self–Timed Speed–Independent Pipelines and Rings, Stanford University Technical Report No. CSL–TR–91–482, May 1991.

Jens Sparso and Jorgen Staunstrup, Delay–insensitive multi–ring structures, Integration, the VLSI Journal 15, 1993, Elsevier Science Publishers B.V., pp. 313–340.

(List continued on next page.)

*Primary Examiner*—David Y. Eng
*Attorney, Agent, or Firm*—Steptoe & Johnson LLP

[57] ABSTRACT

A Null convention logic system for processing NULL convention signals is comprised of interconnected processing elements. NULL convention signals can assume at least a first meaningful value indicating data and a NULL value which has no data significance. Processing elements receive a plurality of NULL convention signals and produce a meaningful output data value when the number of meaningful input data values exceeds a threshold number. The gates assert a NULL output when all inputs are in the NULL state. Processing elements exhibit hysteresis such that, as the number of meaningful input values falls below the threshold number, the element holds a meaningful output value (or a non-data non-NULL value) until all inputs are in the NULL state. The threshold number may be less than the total number of inputs. Groups of elements may be interconnected, and thresholds selected, to perform logic and other processing functions asynchronously on meaningful signal values.

36 Claims, 35 Drawing Sheets

OTHER PUBLICATIONS

Tzyh–Yung Wuu and Sarma B.K. Vrudhula, A Design of a Fast and Area Efficient Multi–Input Muller C–element, IEEE Transactions on VLSI Systems, vol. 1, No. 2, Jun. 1993, pp. 215–219.

Marc Renaudin and Bachar El Hassan, The Design of Fast Asynchronous Adder Structures and Their Implementation Using D.C.V.S. Logic, Int'l. Symposium on Circuits & Systems, vol. 4, 1994, pp. 291–294.

Richard G. Burford, Xingcha Fan and Neil W. Bergmann, An 180 Mhz 16 bit Multiplier Using Asynchronous Logic Design Techniques, IEEE 1994 Custom Integrated Circuits Conference, pp. 215–218.

Ted Williams, Self–Timed Rings and Their Application to Division, Stanford University Technical Report No. CSL–TR–91–482, May 1991.

David E. Muller, Asynchronous Logics and Application to Information Processing, Stanford University Press, Switching Theory In Space Technology, pp. 289–297, 1963.

Narinder Pal Singh, A Design Methodology For Self–Timed Systems, Massachusetts Institute of Technology, MIT/LCS/TR–258, Feb. 1981.

T.S. Anatharaman, A Delay Insensitive Regular Expression Recognizer, Dept. of Computer Science, Carnegie–Mellon University, CMU–CS–89–109, Jan. 1989.

Jens Sparso, et al., Design of Delay Insensitive Circuits Using Multi–Ring Structures, European Design Automation Conference, IEEE 0–8186–2780, pp. 15–20, Aug. 1992.

Lawrence G. Heller, et al., Cascode Voltage Switch Logic: A Different CMOS Logic Family, ISSCC 84 Digest of Technical Papers, IEEE, pp. 16–17, Feb. 1984.

Lars S. Nielsen and Jens Sparso, A Low–Power Asynchronous Data–Path For A FIR Filter Bank, IEEE 0–8186–7298–Jun. 1996, pp. 197–207, Jun. 1996.

Stephen H. Unger, Asynchronous Sequential Switching Circuits, 1969, pp. 221, 229.

Carver Mead, Lynn Conway, Introduction to VLSI Systems, 1980, pp. 242–262.

Ivan E. Sutherland, Micropipelines, Jun. 1989, vol. 32, No. 6, Communications of the ACM.

Wojcik et al., On the Design of Three Valued Asynchronous Module, IEEE Transactions on Computers, vol. C–29, No. 10, Oct. 1980, pp. 889–898.

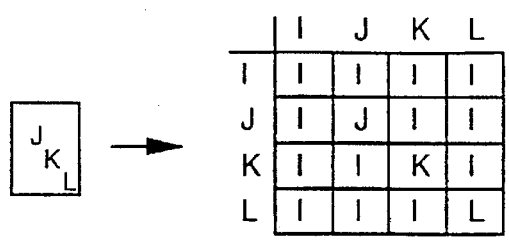
FIG. 21a
FIG. 21b
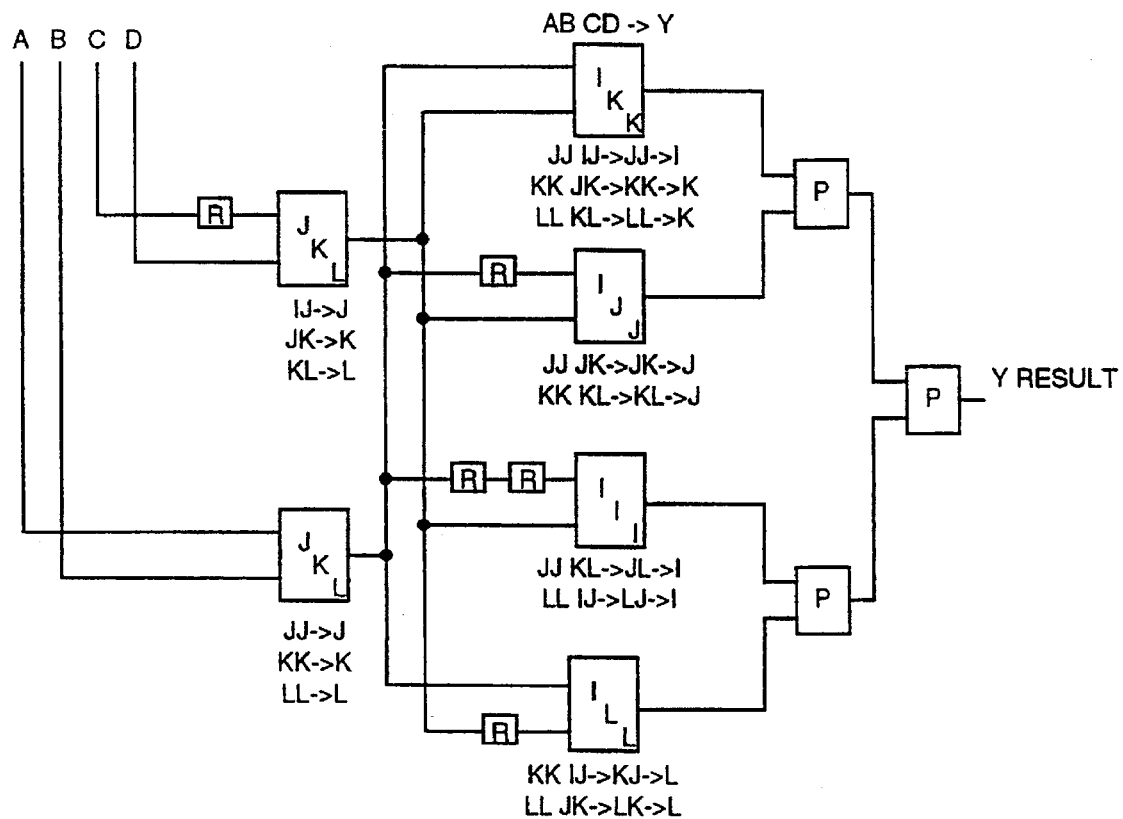
FIG. 21c

|   | J | K | L |
|---|---|---|---|
| I | U | V | W |
| M | R | S | T |
| N | O | P | Q |

FIG. 25a

|   | A | B | C |
|---|---|---|---|
| X | 0 | 1 | 2 |
| Y | 3 | 4 | 5 |
| Z | 6 | 7 | 9 |

FIG. 25b

| | | AB | | |
|---|---|---|---|---|
| | | II | IJ | JI |
| CD | II | IIII | IIIJ | IIJI |
| | IJ | IIJJ | IJII | IJIJ |
| | JI | IJJI | IJJJ | JIII |

WXYZ

FIG. 26a

| | | AB | | |
|---|---|---|---|---|
| | | 00 | 01 | 10 |
| CD | 00 | 0000 | 0001 | 0010 |
| | 01 | 0011 | 0100 | 0101 |
| | 10 | 0110 | 0111 | 1000 |

WXYZ

FIG. 26b

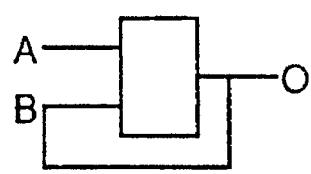
FIG. 31a
| INPUT | A | N | | | X | | | Y | | |
|---|---|---|---|---|---|---|---|---|---|---|
| | B | N | X | Y | N | X | Y | N | X | Y |
| RESULT | O | N | X | Y | X | X | N | Y | N | Y |
FIG. 31b
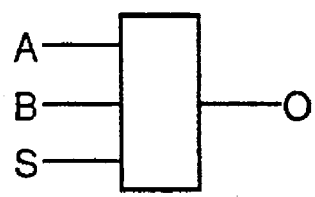
FIG. 32a
| | S | N | A | | | | | | B | | | | | | |
|---|---|---|---|---|---|---|---|---|---|---|---|---|---|---|---|
| INPUT | A | - | N | X | | Y | | | N | | | X | | Y | |
| | B | - | - | N | X | Y | N | X | Y | N | X | Y | N | X | Y |
| RESULT | O | N | N | X | X | X | Y | Y | Y | N | X | Y | N | X | Y |
FIG. 32b
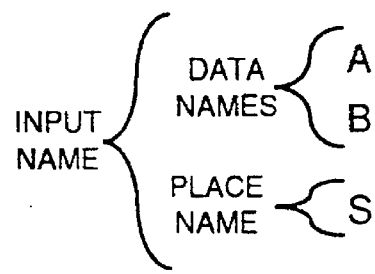
FIG. 33

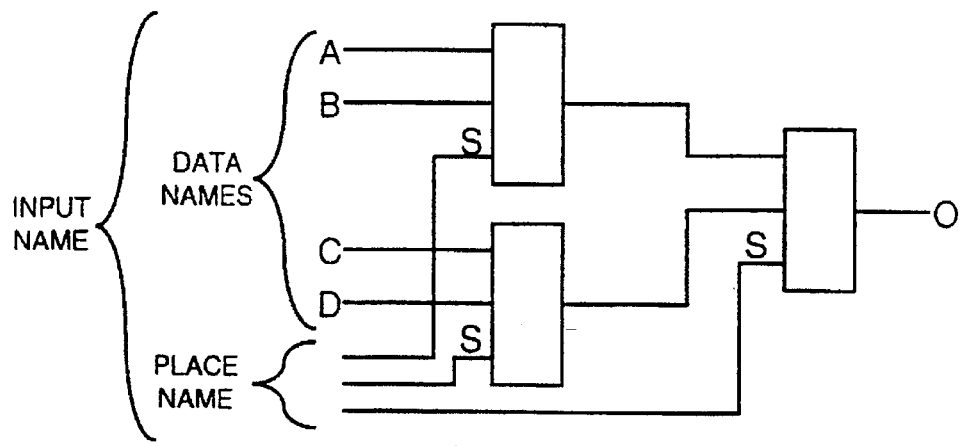
FIG. 34
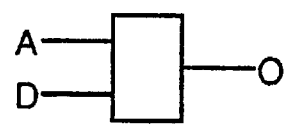
FIG. 35a
FIG. 35b
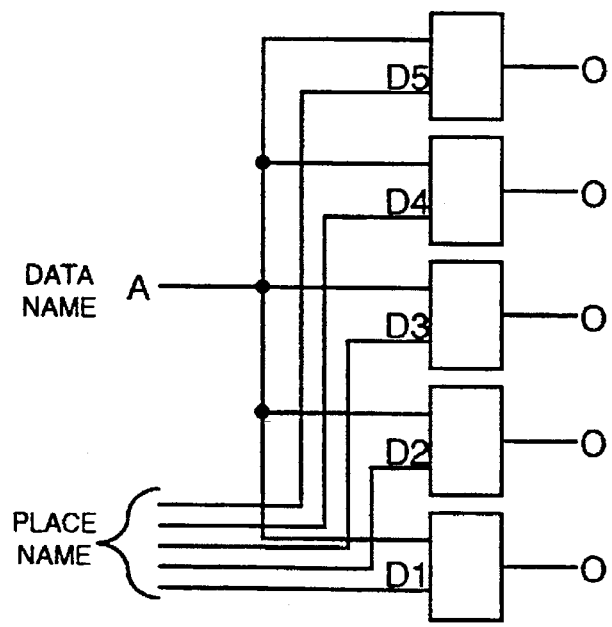
FIG. 36

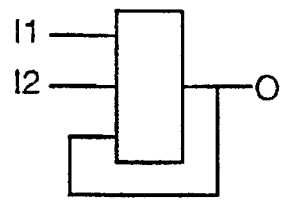
FIG. 39a
| O | N | | | | | | Y | | | | | |
|---|---|---|---|---|---|---|---|---|---|---|---|---|
| INPUT I1 | N | | | X | | | N | | | X | | |
| | | | Y | | | | | | Y | | | |
| I2 | N | X | Y | N | X | Y | N | X | Y | N | X | Y | N | X | Y | N | X | Y |
| RESULT O | N | N | N | N | Y | Y | N | Y | Y | N | Y | Y | Y | Y | Y | Y | Y | Y |
FIG. 39b
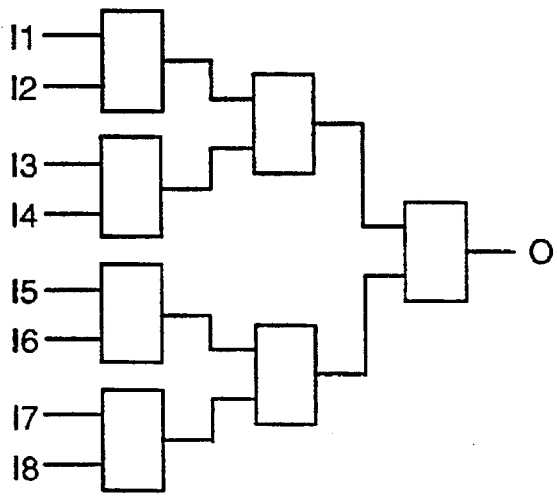
FIG. 40
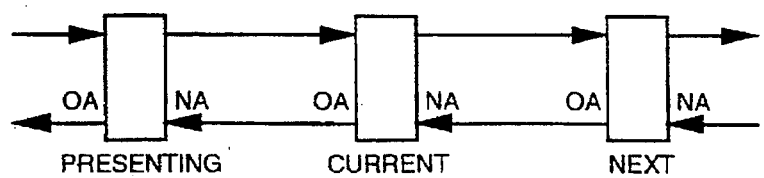
FIG. 41

| INPUT NAME | EN | N | | | | | | | | V | | | | | | | |
|---|---|---|---|---|---|---|---|---|---|---|---|---|---|---|---|---|---|
| | PNV | N | | | | V | | | | N | | | | V | | | |
| | ANV | N | | V | | N | | V | | N | | V | | N | | V | |
| | NA | N | V | N | V | N | V | N | V | N | V | N | V | N | V | N | V |
| RESULT | OA | N | N | N | N | N | N | N | N | N | N | N | N | N | N | V | V |
| | DN | N | N | N | V | N | N | N | V | N | N | N | N | N | N | N | N |
| | EN | N | N | N | N | V | N | N | N | N | N | N | V | N | V | N | V |
| STATES | | 1 | 2 | 3 | 4 | 5 | 6 | 7 | 8 | 9 | 10 | 11 | 12 | 13 | 14 | 15 | 16 |
| | | AWAITING PNV VALID | RESET DN AWAITING NA NULL | AWAITING NA VALID | SET DN AWAITING ANV NULL | SET EN | RESET DN AWAITING NA NULL | AWAITING NA VALID | SET DN AWAITING ANV NULL | INACCESSIBLE | INACCESSIBLE | RESET EN AND OA | RESET EN AND OA | AWAITING ANV VALID | INACCESSIBLE | SET OA AWAITING PNV NULL | SET OA AWAITING PNV NULL |

FIG. 42

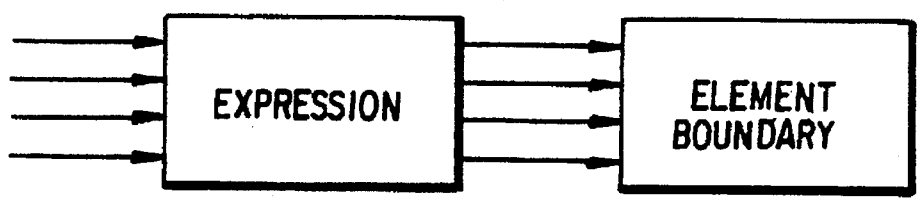
FIG. 51
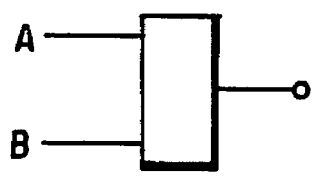
FIG. 52a
| IN | A | N | X | | | Y | | |
|---|---|---|---|---|---|---|---|---|
| | B | — | N | X | Y | N | X | Y |
| OUT | | O | N | N | X | X | N | Y |
FIG. 52b
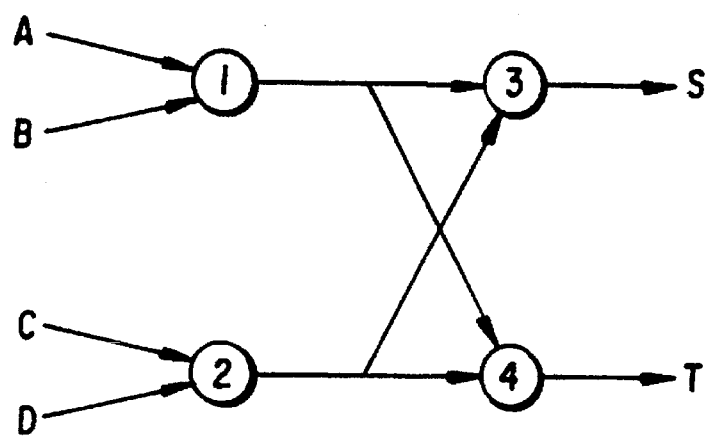
FIG. 53

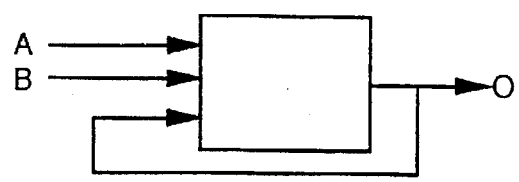
FIG. 54a
| O | N | | | | | | Y | | | | | | X | | | | | |
|---|---|---|---|---|---|---|---|---|---|---|---|---|---|---|---|---|---|---|
| INPUT A | N | | | X | | | Y | N | | | X | | | Y | N | | | X | | | Y |
| B | N | X | Y | N | X | Y | N | X | Y | N | X | Y | N | X | Y | N | X | Y | N | X | Y | N | X | Y | N | X | Y |
| RESULT O | N | N | N | N | X | Y | N | Y | Y | N | Y | Y | Y | Y | Y | Y | Y | Y | N | X | X | X | X | X | X | X | X |
FIG. 54b
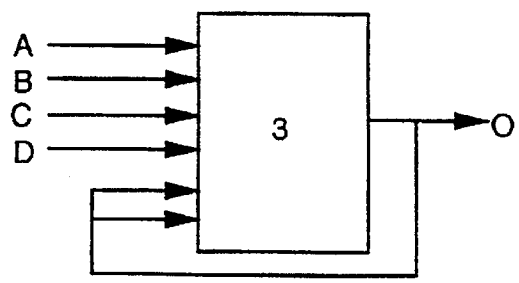
FIG. 55

| O | Y | | | | | | | | | | | | | | | | N | | | | | | | | | | | | | | | |
|---|---|---|---|---|---|---|---|---|---|---|---|---|---|---|---|---|---|---|---|---|---|---|---|---|---|---|---|---|---|---|---|---|
| INPUT A | X | | | | Y | | | | I | | | | N | | | | X | | | | Y | | | | I | | | | N | | | |
| B | X|Y|I|N|X|Y|I|N|X|Y|I|N|X|Y|I|N|X|Y|I|N|X|Y|I|N|X|Y|I|N|X|Y|I|N |
| RESULT O | Y|Y|Y|Y|Y|Y|Y|Y|Y|Y|Y|Y|Y|Y|Y|N|Y|Y|N|N|Y|Y|N|N|N|N|N|N|N|N|N|N |

| INPUT | A | N | | | | | | | | | I | | | | | | | | D | | | | | | | | |
|---|---|---|---|---|---|---|---|---|---|---|---|---|---|---|---|---|---|---|---|---|---|---|---|---|---|---|---|
| | B | N | | | I | | | D | | | N | | | I | | | D | | | N | | | I | | | D | | |
| | C | N | I | D | N | I | D | N | I | D | N | I | D | N | I | D | N | I | D | N | I | D | N | I | D | N | I | D |
| RESULT | O | N | I | I | I | I | I | I | I | I | I | I | I | I | I | I | I | I | I | I | I | I | I | I | I | I | I | D |

| INPUT | A | N | | | | | | | | | I | | | | | | | | D | | | | | | | | |
|---|---|---|---|---|---|---|---|---|---|---|---|---|---|---|---|---|---|---|---|---|---|---|---|---|---|---|---|
| | B | N | | | I | | | D | | | N | | | I | | | D | | | N | | | I | | | D | | |
| | C | N | I | D | N | I | D | N | I | D | N | I | D | N | I | D | N | I | D | N | I | D | N | I | D | N | I | D |
| RESULT | O | N | I | I | I | I | I | I | I | D | I | I | I | I | I | I | I | I | D | I | I | D | I | I | D | D | D | D |

NULL CONVENTION LOGIC SYSTEM

This is a continuation of application Ser. No. 08/074,288 filed Jun. 8, 1993, now U.S. Pat. No. 5,305,463 which is a continuation of U.S. Ser. No. 07/702,016, filed May 11, 1991, now abandoned.

BACKGROUND OF THE INVENTION

This invention relates to information processing systems and methods for manipulating and resolving data, and particularly to computer systems and methods. The invention is particularly useful for building circuits, and for building processors utilizing a plurality of such circuits.

Traditional electronic logic circuits are composed of continuously acting logic elements which are continuously asserting a potentially legitimate result. When new input data is presented to a circuit, the result asserted by the circuit might change several times before settling to the correct result. In general it is not possible to determine, in terms of the circuit output itself, when the correct result is asserted by the circuit.

The determination of completion has generally been accomplished by a representation external to the circuit, most often a system clock. Other types of external representations have also been used, such as a delay line associated with each circuit. Such external systems are provided to indicate when the output of the circuit is VALID. They do so by allowing sufficient time for the logic circuit to settle to a correct result before declaring the result values VALID.

External timing of the logic circuit requires that the control and logic representations be carefully engineered to coordinate their timing characteristics. Because they must be coordinated or synchronized, such systems are typically referred to as synchronous systems. In the case of a system clock, the circuit has to be carefully designed so that it is assured of settling to a correct result within one clock period. Similarly, a delay line must be long enough to accommodate the timing of the circuit and it must also be guaranteed that it's delayed control signal will be stable for a long enough time. Such synchronization considerations place significant complications on system design.

The existing technology of speed independent or Muller circuits does not postulate a NULL value integrated into the primitive transform elements. It relies instead on Boolean logic gates carefully arranged to provide the whole circuit with a specific resolution behavior. This cannot, however, eliminate all possible hazards due to circuit element delays. Transmission elements can introduce delays that could cause incorrect function of the circuit. The existing technology is not logically complete in that physical timing characteristics of the circuit element still have to be considered in any circuit design.

Speed independent circuits put the burden of completion integrity on the configuration of the circuit itself and cannot achieve a purely logical expression of the circuit. The NULL convention puts the burden of completion integrity on the primitive transform elements. This allows a purely logical expression of a circuit quite independent of the physical timing behavior of all circuit elements.

A known concept using a non-data representation as a control means is the spacer code of dual rail encoding associated with speed independent circuits. Dual rail encoding, however, is an interface signaling protocol between circuits and is not a concept associated with the internal organization of the circuits themselves.

Despite the need for a system or environment in the art which enables autonomously acting and coordinated logic circuits to implement independently acting and locally controlled process representations without the need for external control representations, and which overcomes the limitations and problems of the prior art, none insofar as is known has been proposed or developed.

Accordingly, it is an object of the present invention to provide an information processing system and method for manipulating and resolving data. Another object of the invention is to provide a system and method which is useful for constructing information processing units and members such as circuits and gates and for constructing configurable processors utilizing a plurality of such circuits and gates.

Yet another object of this invention is to provide a system and method which enables processors having autonomously acting and coordinated logic circuits to implement independently acting locally controlled process representations without the need for external control representations. A further object of the invention is to provide a system and method as described above which utilizes the representation of control as a value with respect to the logic circuits and gates themselves.

Still another object of the invention is to provide a system and method of utilizing a null convention in logic and processor design and function.

SUMMARY OF THE INVENTION

The present invention provides an information processing system for manipulating and resolving data, which has at least one information processing unit for resolving combinations of data and non-data values, for example a logic circuit. The information processing unit or units each have at least one information processing member, for example a logic gate, also for resolving data. The unit further has a plurality of information transmission elements, for example conductors, each element transmitting the data to and from the one or more members or units.

The information transmission elements may be electrical, optical or any other transmission means known in the art. Data manipulated and resolved by the system and the system components described above consist of values which, for example, may represent physical states on or in the elements, members and units. Such physical states represent voltage, optical energy or any other medium which may be utilized to convey information pertaining to velocity, temperature, or angular position for example. Importantly, the system and its components also transmit and resolve non-data values.

Each information processing member and unit has one or more information transmission elements connected to itself for both input or presentation of values, and for output or assertion of result values. And, although elements are capable of transmitting only one values at a time, members and units are capable of resolving combinations of values (information) which are presented either individually over time via a single element, or simultaneously via multiple elements.

Allowed values are those which are resolvable by information processing members and units, and consist of at least one data value and at least one non-data value, at least one non-data value being a null value. The set of data values includes a single value or two values, for example, such as is used in traditional binary logic. In addition to the null value, one or more intermediate values, which are distinct from the null value and the data values, may be included in the set or group of allowed values.

Accordingly, in one embodiment of the information processing system of the present invention there are two allowed values, the first allowed values being a data value and the second allowed value being a null value. In another embodiment, there are three allowed values, the first allowed value being a data value, the second allowed value being a data value, and the third allowed value being a null value. In still another embodiment, there are three allowed values, the first allowed value being a data value, the second allowed value being an intermediate value, and the third allowed value being a null value. In a final embodiment of the present invention, there are four allowed values, the first allowed value being a data value, the second allowed value being a data value, the fourth allowed value being an intermediate value, and the fourth allowed value being a null value.

Each information processing unit maps from combinations of values presented to it to combinations of values to be asserted by it. To achieve play-through, the information processing members resolve values by asserting a value for each combination of values presented to it, such that (1) for valid combinations of presented values the asserted value is a data value dependent upon the particular combination of presented values, and (2) for invalid combinations of presented values the asserted value is a null value.

To achieve hysteresis, the information processing members resolve values by asserting a value for each combination of values presented such that (1) for valid combinations of presented values the asserted value is a data value dependent upon the particular combination of presented values which remains asserted until the combination of presented values becomes all-null, and (2) for all-null combinations of presented values the asserted value is a null value which remains asserted until the combination of presented values becomes valid.

With respect to intermediate value resolution, information processing members resolve values by asserting a value for each combination of values presented such that (1) for valid combinations of presented values the asserted value is a data value dependent on the particular combination of presented values, (2) for combinations of values including intermediate values the asserted value is an intermediate value and (3) for all-null combinations of presented values the asserted value is a null value.

The information processing unit cycles through resolution and non-resolution states to allow determination of the unit's (1) completion of a data resolution and (2) readiness to perform another data resolution. A resolution state occurs when the unit is presented with a valid combination of values and is asserting a valid combination of values. A non-resolution stat occurs when the unit is presented with an all-null combination of values and is asserting an all-null combination of values.

The information processing unit can perform a specific data resolution function by asserting a predetermined combination of values for each combination of presented values. The unit can further store values by asserting a combination of values equal to a previously presented combination of values. The unit can select values by asserting a combination of values which are a subset of a first combination of presented values relative to a second combination of presented values, and can also distribute data by asserting a combination of values equal to a first combination of presented values as a subset of it's combination of asserted values relative to a second combination of presented values.

The information processing system further comprises bounding means for asynchronously coordinating value presentation to the information processing units. Each bounding means comprises a null-valid detector for determining a unit's (1) completion of a data resolution and (2) readiness to perform another data resolution; means for storing value combinations, and means for communicating with other bounding means.

The null-valid detector is preferably an information processing unit which asserts a null value when it's combination of presented values is all-null and continues asserting a null value until it's combination of presented values becomes valid, whereupon it asserts a data value and continues asserting a data value until it's combination of asserted values becomes all-null. The means for storing is preferably a unit which asserts a combination of values equal to a previously presented combination of values. The communication means comprises:

(a) means for informing all existing preceding bounding means that a first null-valid detector has detected a valid combination of presented values, the valid combination of presented values has been stored in the storing means, and that all existing preceding bounding means can now assert an all-null combination of values;

(b) means for informing all existing preceding bounding means that the first null-valid detector has detected an all-null combination of presented values and all existing preceding bounding means can now assert a valid combination of values;

(c) means for detecting that all existing succeeding bounding means have detected and stored a valid combination of values resulting from the valid combination of values stored in the storing means and asserted by the bounding means, whereupon an all-null combination of values can be asserted by the bounding means; and (d) means for detecting that all existing succeeding bounding means have detected an all-null combination of values asserted by the bounding means, whereupon a valid combination of values can be asserted by the bounding means.

A generally configurable information processing system is constructed of an information processing unit for resolving combinations of values, a unit for storing combinations of values, a unit for configuring value presentation relationships relative to a second combination of values, and bounding means for asynchronously coordinating value presentation between units.

The configuring units, for example a distributor or selector, configure value presentation relationships among at least one resolving unit and at least one storing unit relative to a combination of directive values, for example program instructions, asserted by a first bounding means and presented as the second combination of values of the configuring unit.

A resolution configuration exists during the presentation of a valid combination of directive values to the configuring unit resulting in the presentation of a valid combination of values to the storing unit. A non-resolution configuration exists during the presentation of an all-null combination of directive values to the configuring unit resulting in the presentation of an all-null combination of values to the storing unit.

Data resolution is accomplished by a progression of alternating resolution configurations and non-resolution configurations relative to a progression of combinations of directive values.

These and other benefits of this invention will become clear from the following description by reference to the drawings.

BRIEF DESCRIPTION OF THE DRAWINGS

FIGS. 21a–c illustrate how the expression of the example process can be expressed if custom interaction loci are allowed, FIGS. 25a–b show that the expression becomes a pure variable expression if 15 values are available, FIGS. 26a–b show the transform table for the example expression if only 2 values are available, FIGS. 31a and 31b show a variable structure and transform rule set to implement a memory element, FIGS. 32a–b show a variable structure and transform rule set to implement a selector element FIG. 33 illustrates the composite name form for a generally configurable processor, FIG. 34 illustrates a selector element structure, FIGS. 35a–b show a variable structure and transform rule set to implement a distributor element, FIG. 36 illustrates a distributor element structure, FIGS. 39a–b show a variable structure and transform rule set to implement a NULL-VALID detector element, FIG. 40 shows how a NULL-VALID detector can be cascaded to accommodate any size name, FIG. 41 shows how boundary elements communicate to synchronize value flow, FIG. 42 is the transform table for the protocol section of the boundary element, FIG. 51 shows an expression bounded by a boundary element that will determine its resolution completion, FIGS. 52a–b show a typical variable structure and transform rule set that does not guarantee the integrity of the NULL value wavefront, FIG. 53 shows an expression for which the NULL value wavefront is not completely determinable, FIGS. 54a–b show a variable structure and transform rule set that provides a hysteresis solution to the NULL value wavefront problem, FIG. 55 shows the feedback configuration to provide a 1 DATA value threshold locus with hysteresis to make the NULL wavefront determinable.

DESCRIPTION OF THE PREFERRED EMBODIMENT

I. OVERVIEW

Figure 1:
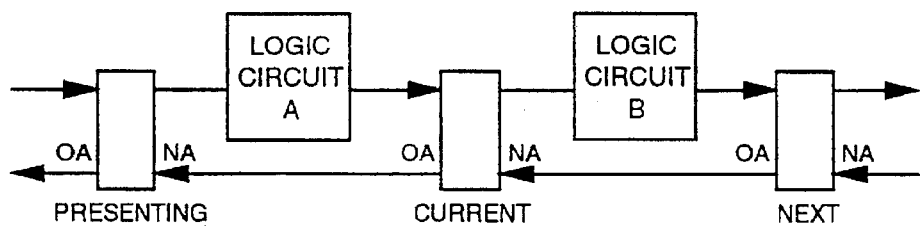
FIG. 1 shows the general structure of null convention logic circuits bounded by boundary elements.

The present invention provides a new information processing system or representational environment which eliminates the need for synchronization means such as clocks, delay lines, or peripheral transition signaling means. The system itself provides a NULL (N) value which represents control. The NULL value is utilized as a flag of invalidity such that when it is asserted, data on a particular input is not valid. If, on the other hand, a nonNULL or data value is asserted, then the input is valid. The NULL value is added to the traditional binary values of TRUE (1) and FALSE (0) to yield a three-value logic system. Alternatively, the NULL value can be added to a single data value to yield a two-value logic system. In this case a dual-rail encoding can be used to obtain two data values necessary for conventional logic representations.

Since the representation of control is added as an extra value to the logic of an information processing circuit or unit itself, instead of in the form of an independent external representation, the circuit is made autonomously determinable and the engineering coordination and synchronization complications associated with two independent representations are thus avoided. The circuits and information processing gates or members provided thereby autonomously express their own completion of data resolution, thus enabling them to operate completely asynchronously in relation to each other.

An essential characteristic of such asynchronous transmission control is that events are controlled locally and are no longer constrained to occur at specific times or during discrete intervals. Accordingly, circuit design is made more simple and straightforward. Moreover, this can be accomplished using standard binary logic.

As shown for example in the table below, the addition of a NULL value to an existing logic circuit does not alter the established logic of the representation. For example, standard two-value logic gates are replaced by corresponding three-value logic gates. The NULL value indicates meaninglessness within the representation.

|   | N | 0 | 1 |   |   | N | 0 | 1 |   |   | N | 1 |
|---|---|---|---|---|---|---|---|---|---|---|---|---|
| N | N | N | N |   | N | N | N | N |   | N | N |   |
| 0 | N | 0 | 0 |   | 0 | N | 0 | 1 |   | 0 | 1 |   |
| 1 | N | 0 | 1 |   | 1 | N | 1 | 1 |   | 1 | 1 |   |

AND      OR      NOT

The NULL value is added to the existing truth tables so that if either input to a gate is NULL, the output will be NULL. An input to a gate is VALID only when both inputs are nonNULL. An INVALID input is one with at least one NULL value. As soon as both inputs are nonNULL, the input is valid and a nonNULL (DATA) value will be asserted. No gate will assert a VALID output unless it's input is VALID. Each gate exhibits a distinct resolution event (the output transition from NULL to nonNULL) whenever a VALID input is presented to it. Each gate indicates the completion of it's own logical transformation process.

A practical example of the use of the NULL value convention is an AND logic gate implemented with a transistor circuit and having the three voltage values of +5, 0, and −5. If 0 is assigned to represent the NULL value, the −5 and +5 are VALID data values. When 0 is asserted to either input of the AND gate, the output will be forced to 0. If non-0 values (−5 or +5) are asserted on both inputs to the gate, the output is the logical AND of the two values the non-0 voltages represent. If 0 is never asserted (except perhaps in transition), then the gate acts just like a standard logic gate.

As previously discussed, the NULL value convention can also support single-data-value representations. Referring to the table below, this form of representation only has two values, NULL (N) and DATA (D). Two-value NULL convention logic is related to threshold logic. Since there is only one nonNULL value, data must be represented by quantities of DATA values. In the truth tables, D is DATA and N is NULL. For the threshold 1 table a single DATA value will set the output to DATA. For the threshold 2 table both inputs must be DATA for the output to be DATA.

|   | N | A |   |   | N | A |
|---|---|---|---|---|---|---|
| N | N | A |   | N | N | N |
| A | A | A |   | A | N | A |

Threshold 1      Threshold 2

In addition to utilizing the NULL value at the gate level of a circuit, the NULL value may also be utilized at the circuit level to indicate the proper transfer of data between circuits. The representation element that manages the presentation of data between two NULL convention logic circuits is called a boundary element. As shown in FIG. 1, null convention logic circuits bounded by such elements A and B behave as independently proceedable units that accept data, process it, and then pass it on to other circuits or units. The input data, in addition to expressing values, is either VALID or all-NULL, thus incorporating the control information necessary for determining it's representational validity The assertion and presentation of value combinations involves a handshake protocol convention between two circuits. In the protocol of two control variables each with two values, the input data itself serves as one of the control variables. The input data in addition to expressing the values of the data is either VALID or all-NULL These two states of VALID and all-NULL in the data itself provide two values for one of the handshake variables. So the data stream itself becomes one of the handshake variables.

An input is received and stored in a current boundary element and stably asserted until the next boundary element can receive it. Then the current boundary element is freed up to receive another input. Data flows through a representation as packets from boundary element to boundary element. As discussed with respect to FIG. 1, between boundary elements there can be any NULL convention logic circuit that will perform some transform on the data. A NULL convention logic circuit bounded by boundary elements will cycle through completely NULL states and completely VALID states so that the NULL convention criteria that allows determination of the completion of the resolution of a NULL convention logic circuit is satisfied.

Boundary elements can be associated in various structures, for example a simple pipeline structure. The pipeline is completely autonomous. A VALID input presented to the first element in the pipeline will begin a sequence of interactions that will propagate the data from element to element all the way through the pipeline. As each element sees a VALID input, it will receive it and assert it to the next element in the pipeline. Several data packets can be simultaneously propagating through the NULL convention pipeline just like any other pipeline. The propagation rate of the pipeline is determined by the longest transmission delay between two boundary elements. Boundary elements can also be associated in fan-in, fan-out, and circular configurations.

A VALID input at a circuit representing a desired process utilizing associated boundary elements will trigger the progression of events that is the represented process. As the events proceed, the circuit resets itself to be triggered again. As completed processing results arrive at the output of the circuit, their completion is signaled by the assertion at the output of the values comprising the completed processing results themselves.

Boundary elements are preferably used to partition a representation into discrete independently proceedable units that may be complex internally, but that have relatively simple interfaces between them. This allows many representational elements to be simultaneously operating, increasing the throughput of the circuit.

The system of the present invention can process data with NULL values via its information processing members (logic gates) that resolve combinations of data values. In contrast, the prior art technology can merely transmit an indeterminant value along with data values over transmission elements (wires, for example). As a result of this advantage the system is speed independent at every level in that the information processing units (circuits) and members (gates) of this system report their own completion.

The NULL convention logic system provides a representational environment in which autonomously acting and coordinated NULL convention logic circuits can implement independently acting and locally controlled process representations. External global control representations are not needed. The system of this invention is applicable to digital computers, telephone switching systems, and in a variety of control systems, particularly those amenable to asynchronous processing and control.

In the description below, process expression is discussed first in general terms (II), and then in greater detail to demonstrate the need for the NULL value convention in process expression, in terms of a process for resolving data (III). The generally configurable process expression is then introduced, and particularly with respect to a system for manipulating and resolving data (IV). Finally the completion integrity of successive resolution cycles and the intermediate non-data value is discussed (V).

II. A MODEL OF PROCESS EXPRESSION

This discussion introduces a model of process expression that focuses on the nature of process itself. The model will lay a foundation for exploring process expression.

Process is defined in very general terms then the invocation model of process expression is introduced. A series of examples present the two domains of expression within the model and illustrate the fundamental principles of process expression.

A. PROCESS

Process is change occurring to existential entities due to interactions among those entities. Process begins with the possibility of interactions among entities. There may be many possible interactions but each process is the actualization of only one possibility. Process is a confluence of possibility and actuality. All of the details of each possible interaction may be prespecified in detail before the fact, but which possible interaction will actually occur cannot be specified until the time of occurrence. The possibility and the actuality of a process are inherently separate aspects of the process and must be separately expressed. These aspects will be called the possibility expression and the actuality expression.

The possibility expression is an inherently incomplete specification of a process. It must defer as an open question the specification of which of the possible interactions will occur. The actuality expression provides the answer to this question and by combining with a possibility expression completes the specification of a particular interaction. The possibility and actuality expressions must correspond in the sense that the answer of the actuality expression must fulfill the question of the possibility expression. A computer and program is the possibility expression and data is the actuality expression.

B. THE INVOCATION MODEL

There must be existential entities. The entities must support a property of changeability in addition to their own existence. There must be a means of specifying how these entities associate to interact and them must be a means of specifying what changes accrue from interaction.

The existential entities will be called variables. A value is the nonexistential property of a variable that can change during interaction. Every variable is always asserting exactly one value. Variable association rules specify which variables can associate with each other to interact. Value transform rules specify which values can interact and how these values will change. The model consists of variables, values, variable association rules and value transform rules. Variables interactively associate according to variable association rules. Values asserted by the variables change according to value transform rules.

1. Variable Association Rules

The variable association rules specify which variables can interact. If two or more variables are associated then those variables are interactively proximate. If variables are not associated by any association rule then they are not proximate and cannot interact.

The association rules differentiate the variables by specifying exactly how each variable is interactively proximate with one or more other variables. Each variable has a place in the process universe and each is differentiated by its place in relation to the other variables. If an association rule states that all variables are or may be in interactive proximity then each variable is in no particular place in relation to the other variables and there is no way to differentiate one variable from another. If an association rule states that no variables are associated then it doesn't matter whether variables can be differentiated, they cannot interact and are effectively nonexistent.

2. Value Transform Rules

The value transform rules specify what changes occur to interacting values. A value transform rule specifies a combination of values as the name of the rule and a set of result values. The combination of values that forms the name of a value transform rule specifies that that combination of values is interactively proximate and will interact. If a combination of values does not form the name of any value transform rule then that combination of values is not proximate and they will not interact. The result values of the rule specify the values that will result from the interaction.

Similarly to variables, values receive their differentiation and place in the interaction universe from the value transform rules. Only values that appear in value transform rule names are interactively proximate and then only in the combinations specified by the names. Values appearing both in value transform rule names and also as result values in other value transform rules form relationships among value transform rules that forge the structure of the value interaction universe and establish each value's place in it. A value is differentiated by its place in relation to all the other values in the process universe as specified by the set of value transform rules for the process.

3. Primitive Process Interaction

A primitive process interaction occurs when an actuality expression arises and an interaction rule name is formed. This occurs when at least two variables are in interactive proximity and their values are in interactive proximity (the values form the name of a value transform rule). If two variables are in interactive proximity but their values are not in interactive proximity (they do not form a value transform rule name) no interaction will occur. Conversely values can be interactively proximate but if their asserting variables are not interactively proximate no interaction will occur.

The possibility expression of the process is a set of value transform rules and the existence of the variables. Each value transform rule is one possible interaction. The question of which possible interaction will proceed is posed by the names of the rules. The question is which rule name will be formed.

The answer is provided when two or more variables become interactively proximate and their values form the name of one of the value transform rules. Like the sorcerer invoking his demons by name to perform his magical transformations the named rule is invoked and the values are transformed. Hence the invocation model. The values of interactively proximate variables forming a transform rule name is the actuality expression for the interaction. It is the delivery of the deferred specification, the answer to the question of which of the possible interactions will proceed.

4. Interaction Composition

The next stage of process expression beyond a single interaction is a progression of dependent interactions. The dependency relationships among the interactions are expressed as name formation dependency relationships. The name formed for one interaction depends on the result values of one or more other interactions. The dependency relationship can be expressed as direct association relationship between each value of a name of one interaction and a result from another interaction that provides that value. It is still not possible to predetermine which transform name will be formed for each interaction but it can be predetermined where the interaction's transform name will come from within the expression.

These dependency relationships form a network of association relationships of result values to name values among the interactions. This network of association relationships provides each interaction with a place in relation to all the other interactions.

Figure 2:
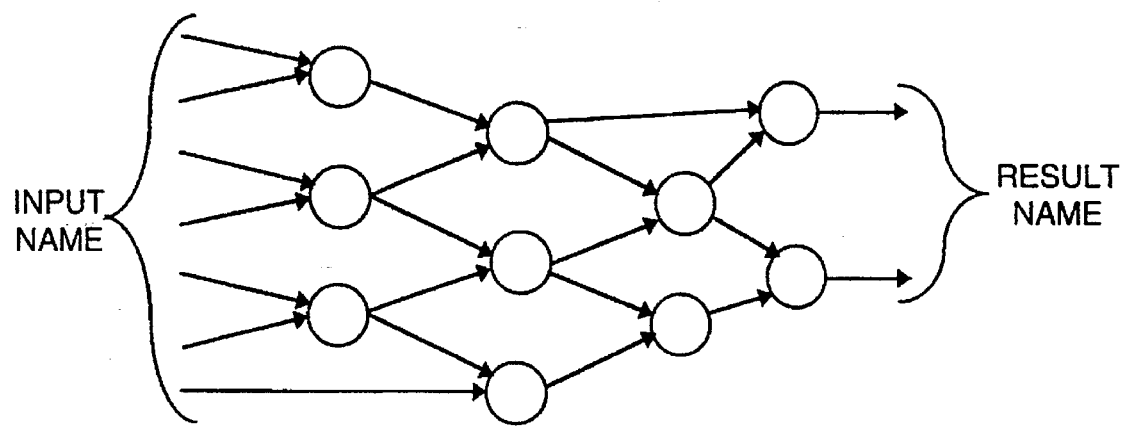
FIG. 2 shows a network of association relationships with no cycles.

FIG. 2 shows a network of association relationships with no cycles. Although any configuration of association relationships is possible, only association networks with no cycles are discussed in detail. Other association configurations will become apparent to those skilled in the art.

Each individual interaction is still expressed by its own possibility expression consisting of a set of value transform rules. These individual possibility expressions are combined into a larger composite possibility expression through the name formation dependency relationships. Most of the interactions receive their transform name values from specified local places in the structure of associations. A few name values, however, are not associated to any local places and they must come from someplace external to the structure of association relationships. These unassociated name values taken collectively are the composite actuality expression for the composite possibility expression. A composite actuality expression will also be referred to as the input name for the composite possibility expression. The result values of the composite possibility expression will be referred to as the result name.

The composite possibility expression is a complete stand alone specification of possibilities dependent only on its composite actuality expression. It is a larger self contained unit of expression (a possibility expression and an actuality expression) than the interaction.

These name formation dependency association relationships among interactions can be expressed within the invocation model either in terms of value transform rules or in terms of variable association rules. This means that the model possesses two quite different domains of expression.

C. TWO DOMAINS OF EXPRESSION

The value transform rules and the variable association rules provide the model with two domains of differentiation and interactive association. A process can be expressed almost exclusively in terms of differentiation and interactive association of values by value transform rules or almost exclusively in terms of differentiation and interactive association of variables by variable association rules. Between these two extremes there is a large intermediate landscape of cooperative expression with gradations of expression from each domain.

1. Pure Value Expression

At one extreme all differentiation and interactive association is in terms of values and specified by value transform rules. There is no differentiation in terms of variable association rules. Variables are all simultaneously associated or they associate indiscriminately. There is no way from the point of view of interaction to tell one variable from another. All differentiation in the expression is by different values. All interactive association is specified by correspondence of unique values. This form of expression will be called a pure value expression.

A natural example of this form of expression is a chemical reaction. The molecules are variables. The composition of each molecule determines its interaction possibilities and is its value. A liquid or gas is natures version of the association rule that specifies that there is no differentiation of variables.

The variables (molecules) will indiscriminately associate in the liquid or gas and there is no way to tell one variable from another except by the value it asserts. The molecules get together forming transform rule names and interact to form new molecular values. Another example of this form of expression is subatomic particles. The variables (particles) indiscriminately associate in free space and there is no way to tell one variable (particle) from another except by the value it asserts. The particles get together forming transform rule names and interact to form new particles and composite structures.

2. Pure Variable Expression

At the other extreme all differentiation and interactive association is in terms of variables and specified by variable association rules. There is no differentiation in terms of value transform rules. There is a set of values and a set of value transform rules for all possible input names that those values can form. This means that all values are constantly in interactive proximity. There is no way from the point of view of interaction to tell one value from another. All differentiation in the expression is by variable association. All interactive association is specified by specifically associated variables. This form of expression will be called a pure variable expression.

A natural example of this form of expression is a network of neurons. The artificial computer is also primarily of this form.

Within the model there must always be a bit of each domain in every process expression. There must always be variables that associate and there must always be values that transform. Nevertheless the two ends of the territory will be referred to as pure value and as pure variable.

3. The Intermediate Expression Territory

Expression in the intermediate territory between pure value and pure variable is a cooperative endeavor between variable differentiation and value differentiation. A very simple example of this cooperative expression is the representation of numbers with different bases. Base two numbers have only two values and very simple value transform rules (logical truth tables) but have lots of digits that must be properly associated. Base ten numbers have ten values and larger, more complex value transform rules (traditional addition and multiplication tables) but have fewer digits to be associated. These gradations of expression ranging from mostly in terms of value differentiation and value transform rules to mostly in terms of variable differentiation and variable association rules will for convenience be called simply value expressions and variable expressions.

D. VALUE EXPRESSION

In a value expression there is no differentiation of variables. All differentiation is in terms of values and specified by value transform rules. Transform rules will be represented in the format of the transform name followed by the result values enclosed in brackets, for example:

"name [result, result, . . .]."

Consider an example expression with 4 differentiated values A, B, C and D and two value transform rules that interactively associate those values. A and B interact and transform into D. C and D interact and transform into B. The two transform rules for the example are:

AB[D] or BA[D]
CD[B] or DC[B]

The linear string representation makes it appear that ordering is significant when actually it is not. The input names AB and BA are equal and are both specified for this example. There can be no order relationships among the values because there can be no order relationships among the variables when they are interactively proximate. They are simply two values interacting. AB and BA are the same input name.

The value transform rule is the simplest most primitive form of process expression. No part of the rule can be reduced to simpler terms or be more precisely stated. The values are primitive and indivisible and the interaction result is complete in itself and unambiguous.

The value transform rules specify completely who does what with whom. As far as the variables are concerned anybody can do anything with anybody but in terms of the values only As can interact with Bs and only Cs can interact with Ds. As cannot interact with Ds nor Bs with Cs and so forth. There cannot be the A of this variable and the A of that variable because there is no this variable or that variable. Value difference is the only way to tell anything apart for this expression. A value expression can be elaborated and extended to more expressional complexity by adding more values and more value transform rules.

A pure value expression differentiates all parts of the expression by values. The input values form the name of a transform rule. The result specified by the transform rule is a different value from the input values so there is no ambiguity about when the interaction is complete. The input values disappear and the result values appear. The new value can form a new unique input name with other values and a new interaction can occur which results in new values which can form further unique input names and so on. The process progresses in a succession of fulfilled interaction possibilities determined by the formability of unique transform rule names. Each interaction possibility is dependent on one or more previous interactions to provide the values to form its input name. The set of transform rules below illustrates a value expression that proceeds in stages of unique input name formation dependencies.

AB [C, D]
CC [D, E]
DD [G, F]
EF [F, G]
GG [X, Y]

If there are some As and Bs present they will begin interacting and generating Cs and Ds. The CC and DD interaction cannot occur until there are some Cs and Ds available. The CC and DD interactions will generate Es, Fs and Gs which will form the input names of the EF and GG, transforms will interact and finally produce Xs and Ys. For this process the possibility expression is the set of value transform rules and the variable association rule that all variables are or will become interactively proximate. The actuality expression is the presence of the As and Bs.

The process is resolved in distinct discrete stages. The completion of each stage is established by the presence of result values and the absence of input values for that stage. When Xs and Ys appear the resolution of the process is completed. It is deterministic and directional. It can's run backwards and start generating As and Bs. All of these characteristics are determined solely by the differentiation and specific association of values as specified by the value transform rules.

1. Traditional Computation with Value Expressions

The value expression form is unfamiliar territory in the contemplation of process expression and computation. Traditional computation expresses results (numbers) in the same form as the input was expressed (numbers). For the value expression this means that the results are expressed with the same values. This can lead to ambiguities in the direction of progression of resolution and indeterminability of completion. But the value expression form can accommodate these issues. The following examples will illustrate that the while the pure value end of the process expression landscape is associated mainly with natural expressions such as chemistry, physics and biology it is a fully capable computation environment.

There is in fact an important value expression system in the history of computational thought. This is the Roman numeral system without the subtractive principle. (This means that 9 is VIIII instead of IX). The digits of Roman numerals are generally presented in a certain order for convenient reading but without the subtractive principle the order has no significance to their meaning. No matter what arrangement the digits are presented in they represent the same number. Each digit of a number is a variable, each variable has a value. The variables have no particular association relationships among themselves. The meaning of each digit is differentiated entirely by its value. The magnitude of the number is determined solely by the values present.

| Possible values are: | M,D,C,L,X,V,I |
|---|---|
| Transform rules are: | IIIII [V] |
| | VV [X] |
| | XXXXX [L] |
| | LL [C] |
| | CCCCC [D] |
| | DD [M] |

The only interactions possible in this Roman numeral expression are those specified by the value transform rules. Vs don's interact with Xs because there is no rule with the appropriate name. The above value transform rules are a complete expression of the process for addition in Roman numerals. Given two Roman numbers these rules will reduce them to a minimal single number representation. The numbers 1978 and 22 are used as examples.

MDCCCCLXXVIII XXII

Figure 3:
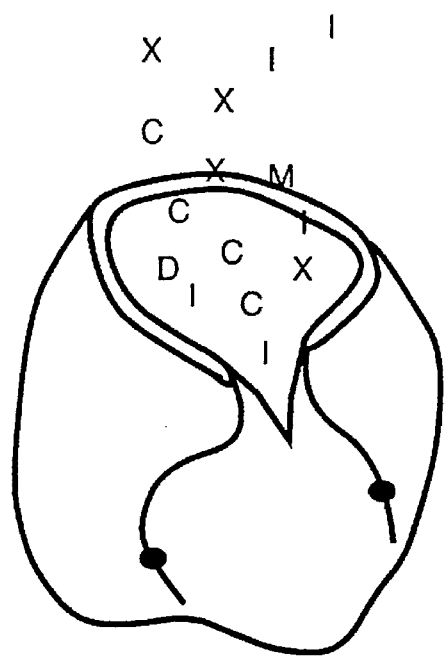
FIG. 3 illustrates a variable association rule as a bag that isolates variables and also keeps them together.

To add the two numbers one simply throws them into a hypothetical bag and shakes as illustrated by FIG. 3. The bag itself is the variable association rule. It states that variables cannot wander off and that external variables cannot intrude. Shaking the bag specifies that all variables will eventually associate. There is no variable differentiation. Variables associate indiscriminately and there is no way to tell one variable from another inside the bag except by its asserted value. The possibility expression is the set of value transform rules and the bag itself. The actuality expression is the values thrown into the bag.

The five is will eventually get together and form the name IIIII. This will invoke the value transform rule IIIII and the five Is will transform into a V. There are then two Vs which will eventually make an X. The five Xs will make an L, the two Ls a C the five Cs a D and finally the two Ds an M. What remains in the bag are two Ms. No more interactions are possible because there are no value transform rules for Ms.

MDCCCCLXXVIII+XXII=MM

There are a couple of difficulties with this expression. First, it is not possible to determine when the expression inside the bag is fully resolved either from inside or outside the bag. Second, some of the transform rules require the confluence of five variables which might take a long time to occur. The Roman numeral system, however, was never intended to be autonomously resolving as it assumed a rather intelligent interpreter that could get all the proper variables together and could tell when its resolution was done.

The following examples will demonstrate that fully determinable autonomous expressions can be expressed in isolated pure value expression environments. So that the reader can more easily follow the examples the expressions from now on will be various forms of binary integer addition. The next example introduces the first form of this expression and is an expression whose transform rule names are never more than two values long.

| Possible values are | A,B,C,D,E |
|---|---|
| Transform rules are | AA [B] |
| | BB [C] |
| | CC [D] |
| | DD [E] |

This expression behaves similarly to the Roman numeral expression. If it is assumed that A=1, B=2, C=4, D=8, E=16 it can be seen that these expressions are equivalent to binary numbers. A number is represented by specifying the appropriate digits. As with the Roman numerals there is no significance to spatial arrangement of the variables. Numbers are added by throwing them in the bag and shaking.

DAC+BCA=EC; 13+7=20

This expression will complete more readily because no interaction requires the confluence of more than two variables but there is still no way to tell when the computation is completed. For an expression to establish its own completeness there must be a distinct last interaction. With the current expression there might not even be a first interaction.

AC+BD=ABCD

Combining these two numbers directly results in a minimally represented number without any interactions at all. If no interactions occur there can be no last interaction to indicate completion.

To guarantee the completeness of a progression of interactions there has to be a guaranteed completeness to the form of the values entering into the interactions. Completeness in this case means expressing the nonasserted place values as well as the asserted place values of the number. Another character will be attached to each value to indicate its assertion or nonassertion 1 means a value is asserted and 0 means it is not asserted so now AC would be represented as A1C1B0D0E0 or E0D0C1B0A1 since order does not matter. If each two characters such as A1 or B0 is considered a single value then the number of distinct values has simply been increased to achieve more expressional differentiation. The 2 character coding simply makes the meaning represented by each value more obvious to the reader.

Each input number must now be represented by five values and it can be guaranteed that there will be an interaction for each possible place value whether that place value is asserted or not. This is a mild form of a variable association rule specifying that variables are always present in specific size groups and that each group has representative values from specific value groups. There is still, however, no order relationship imposed on the values.

For the new example the possible values are coded with two characters for convenience as follows:

|  |  |
|---|---|
| Possible values are: | E0,E1,D0,D1,C0,C1,B0,B1,A0,A1 |
| Transform rules are: | A0A0 [B0,A0] B0B0 [C0,B0] |
|  | A0A1 [B0,A1] B0B1 [C0,B1] |
|  | A1A0 [B0,A1] B1B0 [C0,B1] |
|  | A1A1 [B1,A0] B1B1 [C1,B0] |
|  | C0C0 [D0,C0] D0D0 [E0,D0] |
|  | C0C1 [D0,C1] D0D1 [E0,D1] |
|  | C1C0 [D0,C1] D1D0 [E0,D1] |
|  | C1C1 [D1,C0] D1D1 [E1,D0] |
|  | E0E0 [E0] |
|  | E0E1 [E1] |
|  | E1E0 [E1] |
|  | E1E1 [E0] |

The integer addition example now looks like:

E0 D1 C1 B0 A1+E0 D0 C1 B1 A1 =E1 D0 C1 B0 A0; 13+7=20

To resolve the expression one still just throws all the variables into a bag and shakes. As interact only with As, Bs with Bs, Cs with Cs, Ds with Ds and Es with Es. Each interaction generates a unique carry value which will interact with its corresponding values until no more interactions are possible. If the two input numbers are represented as five variables with each variable being a different one of the five flavors of value; Ax,Bx,Cx,Dx,Ex then the rules guarantee that the result will be a similar number of five variables. The form of the input name and result name is simply a convention among expressions.

Even with this completeness it is still not certain when the resolution of the process is complete. The E rule will be invoked twice, once for the input values and once for the carry value from the D rule. There is no way to tell which invocation is the last one.

To eliminate the ambiguity separate rules and values must be specified for the input interactions and the carry interactions. Then there can be a definite last interaction which will be the carry into the E interaction.

Because of minor combinatorial explosion in the possible values in this example they will be presented in two parts. The characters for the positional flavor and positional assertion are represented by two separate tables. For instance the transform rule presented as AxAx[SBy,Az] when expanded in relation to the x x>>y z table really represents four separate transform rules: A0A0[SB0,A0], A0A1[SB0,A1], A1A0[SB0,A1] and A1A1[SB1,A0].

|  |  |
|---|---|
| Possible values are: | Dx,Cx,Bx,Ax |
|  | UDx,UCx |
|  | TDx,TCx,TBx |
|  | SDx,SCx,SBx |
|  | RDx,RCx,DONE x = 0,1 |

| Transform rules are: |  | Precedence of occurrence relationships: |
|---|---|---|
|  | AxAx [SBy,Az] | 1 |
|  | BxBx [SCy,TBz] | 1 |
|  | SBxTBx [RCy,Bz] | 2 |
|  | CxCx [SDy,TCz] | 1 |
|  | SCxRCx [ UCz] | 3 |
|  | TCxUCx [RDy,Cz] | 4 |
|  | DxDx [ TDz] | 1 |
|  | RDxSDx [ UDz] | 5 |
|  | TDxUDx [ Dz, DONE] | 6 |
| for all rules: | x    x >> y    z |  |
|  | 0    0 >> 0    0 |  |
|  | 0    1 >> 0    1 |  |
|  | 1    0 >> 0    1 |  |
|  | 1    1 >> 1    0 |  |

The integer addition example now looks like:

E0D1C1B0A1+E0D0 C1B1 A1=E1 D0 C1 B0 A0 DONE

The new R, S, T and U values separately track the carry values and the carry interactions. The DxDx rule is the input interaction and the TDxUDx rule is the carry propagation into D which is necessarily the last interaction. The result looks just like the previous result except that a new result value, DONE, is confidently generated by the last interaction.

All of the additional complexity of specification to achieve complete control is just a matter of more values and more value transforms that track intermediate values through the interactions to establish a consistent and regular behavior that possesses a distinct last interaction. No new concepts or primitive elements needed to be introduced. Control is not a primitive of process expression. It emerges from the defined expressional primitives properly arranged. It is simply extra expression beyond what is required to just transform the data.

A familiar process has been completely expressed with full generality in a pure value environment. The expression is complete and self contained. Given the values, the transform rules and the variables it will proceed quite independently and autonomously in an orderly progression of distinct interactions leading to a distinct last interaction which determines completion. There is no ambiguity in its behavior and it needs no external assistance to effect its resolution.

E. NAME FORMATION DEPENDENCY RELATIONSHIPS

How an input name is expressed and resolved depends on the resolution resources available. The most critical resource for any expression is the value transform rules available. If a very large number of Value transform rules with names eight values long were available then the previous example expression could be resolved in a single interaction. The example used value transform rules with names only two values long. Consequently the expression could not be resolved in a single interaction.

An input name that is too long to be resolved in a single interaction must be resolved a piece at a time by a necessarily dependent progression of multiple interactions each resolving a smaller input name which is a piece of the larger input name. The eight value input name had to be broken up into 4 separate input interactions. The results of these input interactions must be combined to form input names for inner interactions and so on until the proper result values for the eight value input name are determined. The inner interactions depend on the results of the input interactions to form their input names. This dependence of the formation of the input name for one interaction on the result of one or more other interactions is name formation dependency. Name formation dependency relationships for value expressions are expressed by value correspondence between result values and name values.

For a value expression this association of result to input name formation is expressed by value correspondence. In the last example above for instance the transform rule named RDxSDx is really 4 transform rules RD0SD0, RD0SD1, RD1SD0 and RD1SD1. Only one of these input names will be formed and the corresponding rule invoked. Which name is formed depends on the CxCx rule which will result in SD0 or SD1 and the TCxUCx rule which will result in RD0 or RD1. The results of these two interactions will form one of the four names of the RDxSDx rules. Within the context of the expression the values to form an RDxSDx name cannot come from anywhere else but the resolution of a CxCx interaction and of a TCxUCx interaction. The RDx of the RDxSDx transform name is a direct association to the RDx result value of the CxCx transform rules.

Figure 4:
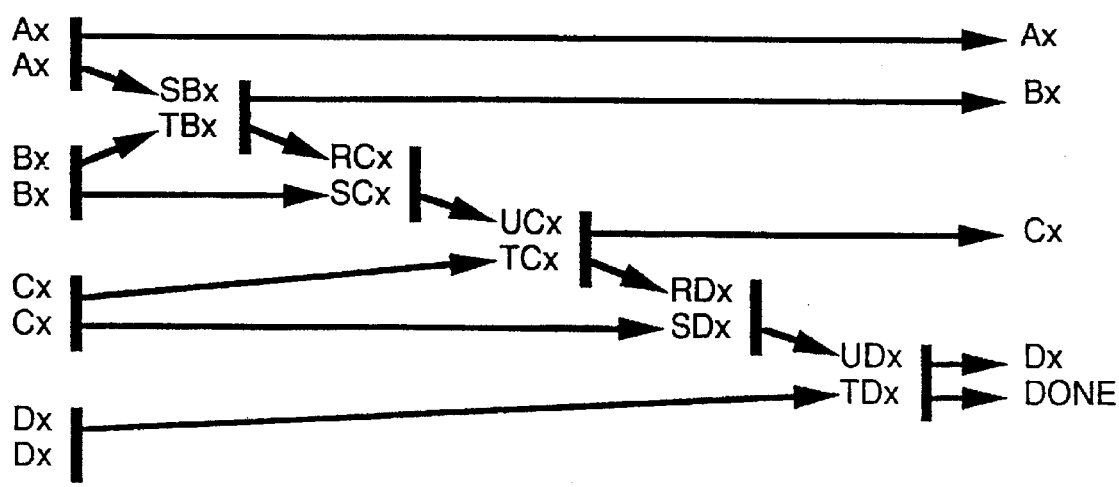
FIG. 4 illustrates the precedence of occurrence relationships among interactions for the example process.

The precedence of occurrence relationships for the example as shown in the preceding TABLE and in FIG. 4 indicate the order in which the interactions can occur. This order is determined by the input name formation dependencies of the expression embodied in the transform rules. The 1 interactions can all occur simultaneously or at any time. Interaction 6 is guaranteed to be the last interaction. The input name formation dependency relationships in the expression fully represent all the possible concurrency. For instance the TCxTCx input name cannot be formed and the interaction will not occur before the CxCx and SCxRCx interactions occur. Even though the CxCx interaction can occur immediately the interactions dependent on it will not occur until CxCx occurs no matter when that is. The control expressed in the expression is complete and general. No matter how long it takes for each interaction to occur or how long it takes for the variables to get together, the expression will resolve correctly and completion of resolution can be determined by the assertion of the DONE value. The DONE value can perhaps open the bag and deliver the result.

This progression of interactions could resolve in a soup of just the eight input variables. Each interaction has two input values and produces one or two result values. There will never be more that eight values asserted at any instant and there are only 5 result values. This view of resolution of the expression has the eight variables changing their asserted values as the transform names are formed. Two variables get together, realize that they form a transform name and change their asserted values to effect the transform. So the input variables are also the result variables. The following table illustrates the value populations after each interaction stage.

| Interaction stage | 1 | 2 | 3 | 4 | 5 | 6 |
|---|---|---|---|---|---|---|
| | Ax | Ax | Ax | Ax | Ax | Ax | Ax |
| | Ax | SBx | Bx | Bx | Bx | Bx | Bx |
| | Bx | TBx | RCx | | | | |
| | Bx | SCx | SCx | UCx | Cx | Cx | Cx |
| | Cx | TCx | TCx | TCx | RDx | | |
| | Cx | SDx | SDx | SDx | SDx | UDx | Dx |
| | Dx | TDx | TDx | TDx | TDx | TDx | DONE |
| | Dx | | | | | | |

Before the first interaction there are 4 interactable names. After the first interaction stage the only interactable name is SBxTBx. After the next stage the only interactable name is RCxSCx and so on. The result values are isolated from the input variables by the event of the interaction. When AxAx interacts the input values disappear and the result Ax appears. There are no more Axs and Ax does not enter into any other transform name so it cannot interact further. When the DONE value is generated there are one each of Ax, Bx, Cx, Dx and DONE laying around that cannot interact further and these constitute the result values.

The interaction is the event that marks the progress of the resolution. The interaction forms a distinct event with a before and an after that are isolated from each other because the input values and result values do not exist simultaneously. Names form and disappear as they resolve. From each interaction new values arise to form new names which in their turn interact, disappear and leave new values and new interaction possibilities.

F. THE NEED FOR NULL VALUES

If one assumes conservation of variables, which is not necessary, then of the eight input variables only five are needed to assert the result values leaving three variables that are essentially expressional waste. These three variables must assert some value that is not relevant to the expression. For instance if the RCxSCx interaction generated UCx and also Bx the extra Bx would form a transform name with the result Bx or one of the input Bxs which in either case would mightily confuse the resolution of the expression. So these three variables must assert values different from the values of the expression. These will be called NULL values because they are meaningless to the expression.

A NULL value for a value expression form is any value not specified in the set of value transform rules. The example expression can resolve in a veritable sea of variables as long as all the other variables except the eight input variables are asserting NULL values. The environment that an input name is formed in must be in an initial state in which all values of all proximate variables are NULL to the expression.

What is NULL to one value expression might be quite meaningful to another value expression. So there could be many expression resolving quite independently in a single frothing sea of variables.

G. VARIABLE EXPRESSION

In the previous examples the differentiations and associations that produced an orderly computation were specified entirely in terms of value differentiation and association by value transform rules. The variables themselves were indiscriminately associated so did not contribute to the differentiation of the expression. They served as the medium of value assertion adequately available whenever needed. What is the nature of an expression in terms of variables differentiated and associated by variable association rules?

Figure 5:
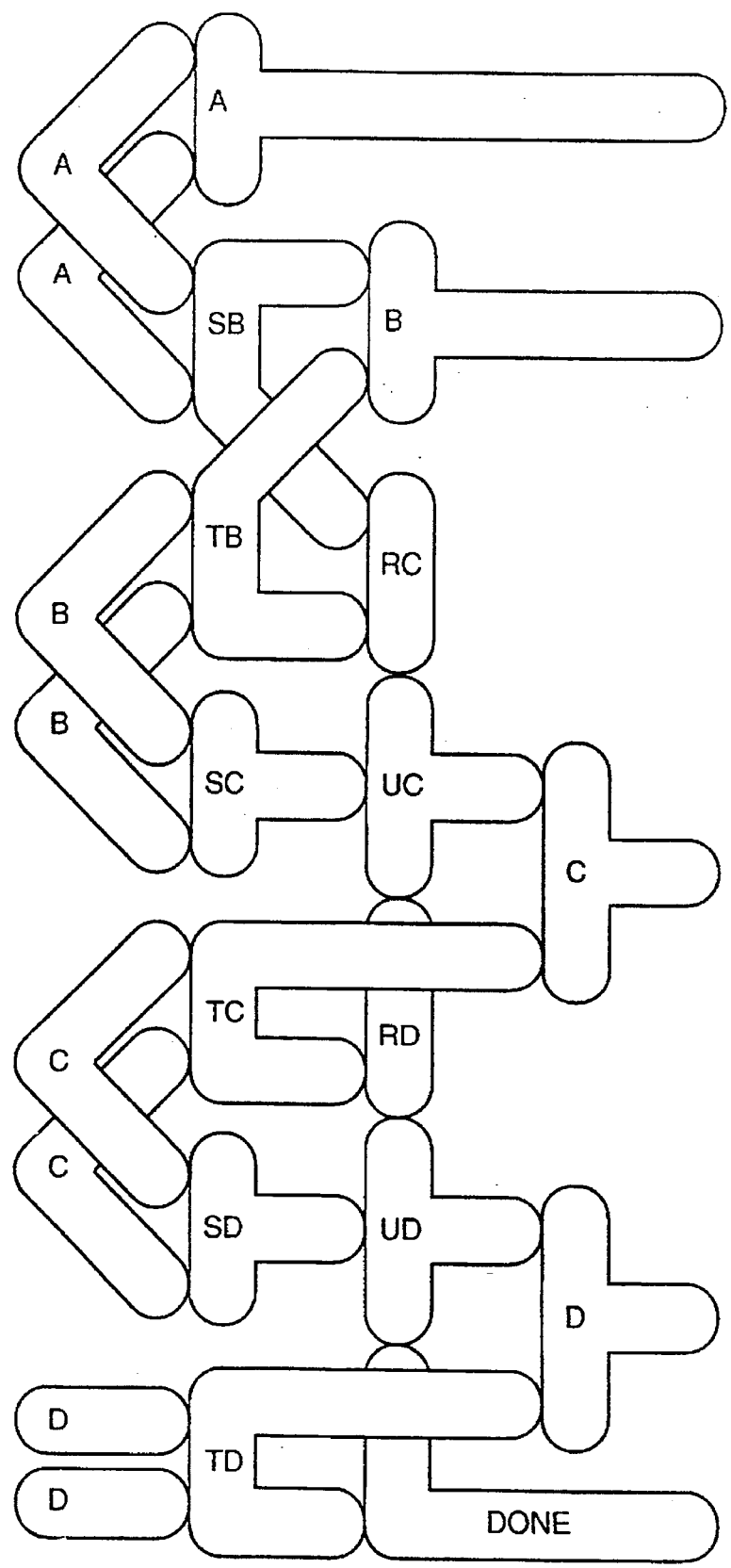
FIG. 5 shows a rigid structure of interacting variables that might be expected to express the example process.

The variable association form of expression will be introduced by attempting to derive an expression directly from the last example value expression of four bit binary addition. The derivation will begin by associating variables to mimic the input name formation dependency diagram shown in FIG. 4 of the value expression. The same set of values and transform rules will be used initially. The diagram of FIG. 5 shows the complete example of the candidate variable association expression. Each enclosed area is a variable. Areas whose boundaries touch are association relationships. The variable association rules are embodied in the diagram and the diagram itself can be considered the expression of the variable association rules.

Each value asserted during the resolution must have a variable to assert it. Each value asserted in the expression except for the input values must result from an interaction. The variable that is to assert the result value of an interaction must be able to see the formed input name for that interaction. The variables must therefore be associated in such a way that each result asserting variable is associated with the variables that will form the input name to its interaction. The result asserting variable is also considered to embody the transform rules of the particular interaction.

For instance the AxAx[SBy,Az] transform in the value expression used two variables that simply changed values. For the variable expression it requires four variables; two variables that assert the input values AxAx and two variables that assert the result values SBy and Az. Furthermore the input name formed by the two input variables must be visible to both of the result variables so the two input Ax variables have to be associated with both the SB variable and the result A variable in a fanout configuration.

The entire expression is derived in terms of these considerations. The label of a variable in the diagram indicates the variable set it can assert. For instance the variable labeled TD can assert TD0 and TD1 and embodies the transform rules with TD result values. The transform rule set AxAx[Az] is associated with the result A variable. The transform rule set AxAx[SBy] is associated with the SB variable.

The variables are no longer freely associating but are frozen into a rigid structure by the association rules. The nature of interaction for the variable expression is quite different from the nature of interaction for the value expression. The nature of the variables and values haven's changed but the nature of their possible relationships is different. The example variable expression was straightforwardly derived but it will not work as it is presented. Discovering why this expression will not work and what is required to make it work will serve as an introduction to the variable form of expression.

1. Continuously Interacting Structure

Figure 6:
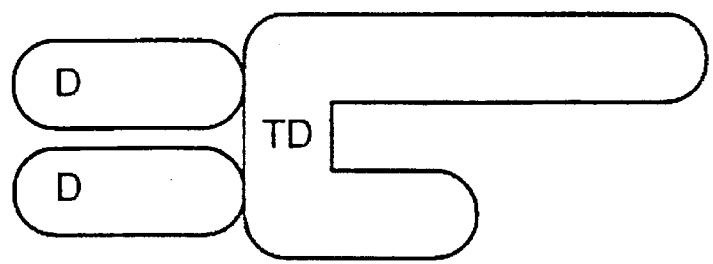
FIG. 6 illustrates the relationships between input variables and the result asserting variable.

The variable association rules specify that the associated variables are interactively proximate permanently and continuously. In the portion of the example shown in FIG. 6 the two input D variables are not associated and cannot see each others values. The TD variable, however, can see both the input D values and respond to the input name formed by the values asserted by the two variables and assert the result value for that transform name.

After TD recognizes a D,D input name and transforms its own value the variable relationships do not change. TD is continuously seeing any input name formed by the two input Ds and it must continuously respond to that formed input name. TD cannot not assert a value. Nor can it just assert some nondescript value if it does not recognize a transform name. Its behavior must be completely defined so it must be always recognizing a valid input name and asserting a result value. Therefore there must be a set of value transform rules that span all the possible input names that can be formed by the input Ds.

Because a variable is always asserting a result value in relation to a formed input name, for a result value to be stably asserted the input name seen by the asserting variable must be stably maintained. In other words the input Ds must maintain their asserted values if TD is to maintain its asserted result value. TD's asserted result value contributes to an input name for another variable in the expression and must itself be stably maintained. This continues through the entire expression until all the variables of the expression have interacted and asserted the proper result values. So all the input values must be maintained stably until the entire expression is resolved.

These resolution properties are quite different from those of a value expression. An interaction in a value expression occurs only when a transform name is formed. The input values that formed the input name disappear and the result values appear marking a distinct progress event in the resolution of the expression. These new values are inherently stably asserted by their variables until they form new input names, interact and themselves disappear. The value expression inherently resolves in a progression of discrete events ending with the assertion of the result values. The variable expression on the other hand is continuously resolving and asserting result values and this creates several difficulties with process expression.

2. Name Formation Ambiguity

Figure 7:
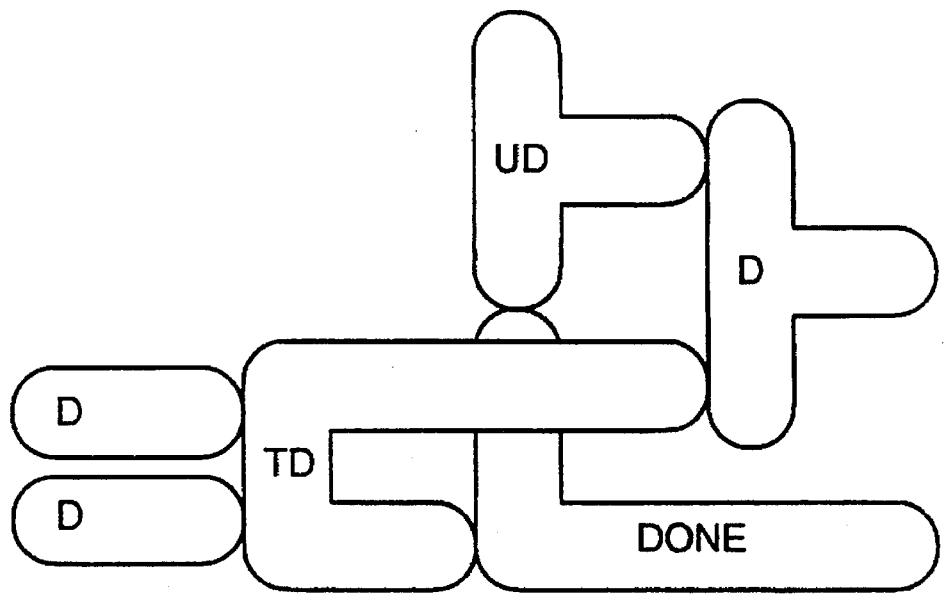
FIG. 7 illustrates the difficulty directionality of interaction between directly associated variables.

The first problem with the continuous resolution nature of the variable expression is that the example variable expression exhibits ambiguity of input name formation and direction of result propagation because of the reuse of a value set. The portion of the example shown in FIG. 7 illustrates this ambiguity.

Variables do not posses any inherent directionality of interaction. Variable TD is associated with the input D variables as well as the result D variable. Clearly there are input D values and result D values but there is no way for the TD variable to know which variable a D value comes from. All it can see is three D values. Assume that the input name asserted by the two input variables is D0D1 but the variable TD is seeing three D values instead of just two D values. The result D variable is having a backwards influence on a variable that recognizes two value input names formed of D values. What result value should the TD variable assert when there are several simultaneously valid two value D input names visible to it?

The D variables have been referred to as input and result because that was their role as mapped from the pure value expression where they were indeed unambiguous input and result values. Because of this discrete event nature of the value expression the input D values did not get mixed up with the result D value. As far as each variable in the variable expression is concerned it is still in a pure value environment looking for a input name in a sea of values. The sea for each variable is now a small stagnant puddle but the variable doesn't know that. Variable interaction is completely directionless. Therefore when variables are associated there is no inherent input end and result end. So the influence of name formation in a variable expression propagates through variables in all directions at once.

This is why the example expression shown in FIG. 5 will not work. The result values can get confused with the input values in name formation and asserted values can influence interactions backwards in the expression. This is not an invalid form of expression. A molecule for instance or a gravitational system are variable association expressions that are formed with continuous interaction pulsing through their structure in all directions simultaneously. This discussion, however, is pursuing process expressions that proceed in a more or less orderly manner to a more or less definite result. So strict directionality of interaction influence must be imposed on the variable expression.

3. Need for Value Isolation

Figure 8:
FIG. 8 illustrates how many isolation variables must be between any two variables that assert the same value set.

Referring to FIG. 7, the only way to establish directionality within the defined model for a variable expression is to differentiate the input from the result with different values. To establish directionality all variables directly associated must assert different value sets. In FIG. 8 it can be seen that variables 1 and 3 cannot assert the same value set without confusing variable 2. Only 1 and 4 can assert the same value set without forming ambiguous input names for 2 or 3. So there must be at least three sets of value transform rules with nonintersecting value sets to directionalize a variable expression and variables asserting identical value sets must be at least three associations apart.

It can be seen in FIG. 5 that several variables violate this rule. It is obvious that the result values can get mixed up with the input values through the variables TB, TC and TD. The only way to fix this ambiguity is to isolate the assertions of identical value sets by inserting extra buffering variables into the expression that assert different value sets.

This may seem a complex requirement to impose on an expression but the problem in general is quite simply solved. By adding enough variables to an expression and choosing two value sets that the process expression proper does not use it can be assured that there are always two variables between each variable asserting a process expression proper value and hence the use of any identical value set by the process expression proper will always be three variable associations apart. These two inbetween variables with their value sets can form a standard directional interconnection unit through which all process expression proper variable associations are formed. This standard interconnection unit will be called an interaction locus.

H. THE INTERACTION LOCUS

The interaction locus isolates its input value associations from its result value associations and establishes directionality of interaction for variable expressions. It doesn's matter what value sets are used inside the locus as long as they are different from the value sets used by the process expression proper. Now that all process expression proper variables and values are isolated such that identical process expression proper values will not lead to input name formation ambiguities the process expression proper can be rendered entirely in terms of a single value set.

Figure 9:
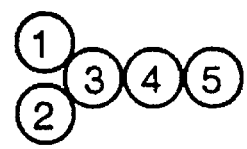
FIG. 9 illustrates how variables can be arranged in a standard association unit called an interaction locus that isolates identical input and result value sets.

FIG. 9 illustrates the role of the interaction locus. Variables 3 and 4 are the isolation variables. Variables 3, 4 and 5 are the interaction locus. Variables 1, 2 and 5 are process expression proper variables. 1 and 2 are the input variables and 5 is the result variable. Variables 1, 2 and 5 will assert the value set 0, 1. Variable 3 will assert the value set X, Y. Variable 4 will assert the value set S, T. The following value transform rules sets will be associated with each variable.

| Variable 3 | Variable 4 | Variables 1,2,5 |
| --- | --- | --- |
| 00[X] | X[S] | S[0] |
| 01[Y] | Y[T] | T[1] |
| 10[Y] | | |
| 11[X] | | |

Variable 3 only recognizes input names of 0, 1 and asserts result values X, Y. It embodies the value transform rules for the interaction. Variable 4 only recognizes input names X, Y, and asserts result values S, T. Variables 1, 2, and 5 only recognize input names S, T and assert result values 0, 1. An x asserted by variable 3 will result in a 0 asserted by variable 5. A y asserted by variable 3 will result in a 1 asserted by variable 5. The interaction locus establishes the directionality of influence and isolates the input values from the result values. The process expression proper variables 1, 2 and 5 all recognize and assert the same value set but their values never get mixed up because they are all isolated from each other by the isolating variables of the interaction locus. The process expression proper can now be entirely expressed in terms of a single value set in terms of associated interaction loci. The interaction locus recognizes the value set 0, 1 as input values and asserts the value set 0, 1 as result values.

Figure 10:
FIG. 10 shows one way to graphically represent an interaction locus.

Different transform sets can be assigned to variable 3 of the interaction locus to provide interaction loci with different name transformation functions. Variable 4 is just a buffer variable always associated with variable 3 and variable 5 is the result assertion variable always associated with variable 4 so the three variables can be considered as a single unit of expression. The expression unit can be identified by the transform rule set associated with it. The input variables 1 and 2 are the result variables of some other interaction locus. The new directionalized expression of an interaction locus might look something like the expression shown in FIG. 10.

Figure 11:
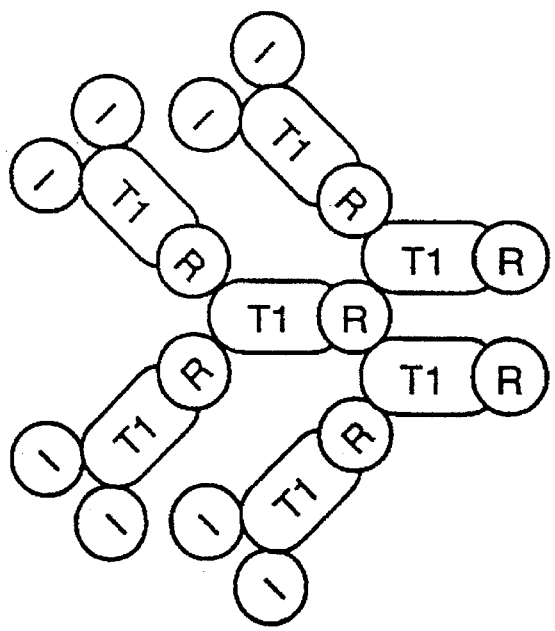
FIG. 11 shows how several interaction loci can be directly associated to render a larger process expression.

T1 represents the isolation variables and the transform rule set associated with the interaction locus and part of the interaction locus that will receive and recognize the formed input names. R represents the result assertion part of the interaction locus. T1 is the input end and R is the output end. An expression of associated loci might look like the expression shown in FIG. 11. The elements with 1 are the input variables asserting the input name to the expression.

Figure 12:
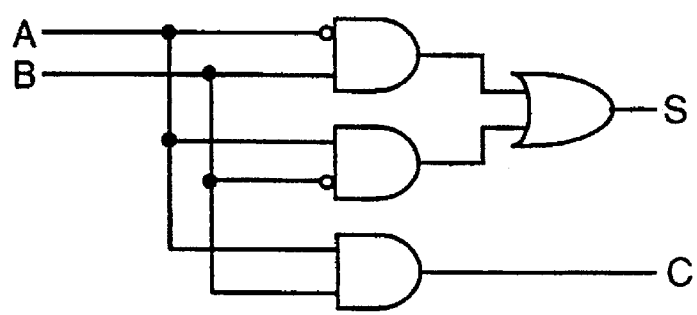
FIG. 12 shows that the standard graphic form of representing logic circuits is identical to the more general form developed from the theory.

A little graphic stylizing will provide a more familiar look to the expression as illustrated in FIG. 12. Each interaction locus transform set can be represented by a different shape and that shape can explicitly indicate the direction of interaction. With the convention of the interaction locus a variable association expression can be viewed in the familiar terms of interconnected transform elements or function elements, such as logic gates or members.

The interaction locus establishes directionality of interaction with a convenient and uniform convention by isolating the input values from the result values of an interaction. A directionalized variable expression can be rendered without interaction loci. One could very carefully associate variables and assign values and transform rule sets so that the isolation criteria is satisfied. Its just more involved. Variable expressions also do not have to be directionalized.

A bounding convention

Directionalized interaction, however, is critical for extensible computation. Data value resolutions such as arithmetic could not exist without directionalized interaction. Real world examples include the electromagnetic switch, the electronic tube and the transistor. For the electromagnetic switch the input current value influences a magnetic field value which influences the physical position value of the switch which influences the result current values. Identical input and result value domains are isolated by different value domains just like the interaction locus derived within the model. The tube and transistor similarly use different physical interaction domains to isolate the input from the output. A current value on an input wire influences a charge value in a vacuum or semiconductor which influences electron flow in the same medium which influences the current in the result wire.

The interaction locus is a bounding convention. It encapsulates an expression that can be quite arbitrarily represented itself but which presents a specific convention of interactive behavior to all other interactive elements participating in the convention. This bounding convention establishes the first instance of what might be called from one viewpoint an imposed expressional abstraction or from another viewpoint an emergent expressional facility. In either case it establishes a uniformity and regularity that makes the whole considerably more than the sum of its parts.

If one looks at a variable expression variable by variable as just associated variables the interaction loci might not be at all evident. There is no guarantee in any expression that all the interaction loci look the same. The only requirement is that the boundaries look the same to each other. Their insides may vary dramatically.

In a modern computer for example the transistor circuits that implement a logic gate or information processing member may vary dramatically between chips made by different manufacturers. Some interaction loci have magnetic values inside and some have mechanical values inside. Imagine an expression of a processor made from chips from different manufacturers expressed solely in terms of transistors, capacitors and resistors with no clue as to where the boundaries of logic value expression were or that logic value expression had anything to do with the expression. Without the overlay of logic gates on the expression it would be just a huge network of electronic elements and extremely difficult to understand.

But the overlay is exactly that. There is nothing intrinsically "real" about it. It is just a convention that must be maintained among consenting expressional elements. The interaction locus is an imposed regularity and uniformity that imparts an abstract level of meaning to the expression that the individual elements can know nothing about and cannot anticipate the existence of. It allows an expression of complex meaning, the possibility of which could not be projected from the nature of the variables and values themselves.

I. DIRECTLY ASSOCIABLE INTERACTION LOCI

The example expression can now be rendered in terms of these interconnected interaction loci. The following three interaction loci transform sets will be defined and will be called ADD, CARRY and DONE. Ignore for the moment that DONE is nondiscriminative and always asserts a 1.

| ADD | CARRY | DONE |
|---|---|---|
| 00[0] | 00[0] | 00[1] |
| 01[1] | 01[0] | 01[1] |
| 10[1] | 10[0] | 10[1] |
| 11[0] | 11[1] | 11[1] |

Figure 13:
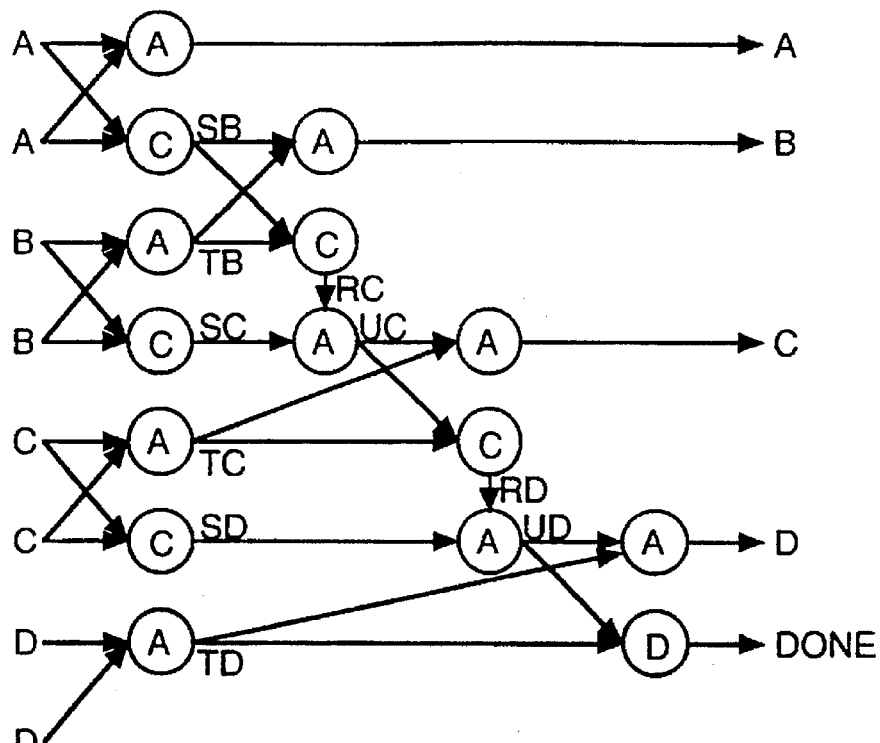
FIG. 13 is a directly associated expression with interaction loci which still cannot determine its own completion.

The example process of four bit binary addition begun in FIG. 5 can now be constructed entirely in terms of the value set 0, 1 and the interconnection of these three types of interaction loci as shown in FIG. 13. The ADD locus is A. The CARRY locus is C. The DONE locus is D.

The variable type labels are attached to the interconnection variables in the example to show this example's correspondence with the previous examples. It will be seen that there is a one to one correspondence between the variables of the initial variable expression example and this example. What were directly associated variables in the initial example are now directly associated interaction loci. It will be convenient to continue referring to the connecting transmission paths as variables that associate the interaction loci.

In the example names are always formed and interaction activity is occurring continuously. There are no necessary and discrete interaction events. If several transform rules in an expression specify the same result value then it is possible for a new input name to form and no change event to occur in the expression. For example if the input Ds change their formed name from a name that specified the same result value then TD will continue asserting the same result value and no event will have occurred as a result of the newly formed input name. This raises the problem of determining when a resolution of an input name has completed. The problem of completion reveals a number of further problems with variable expressions.

The first difficulty is that a DONE value is always asserted. The input values to the DONE variable cannot be differentiated. Both UD and TD may be either 1 or 0. The second difficulty is that even if a DONE condition could be determined from UD and TD it cannot be guaranteed that the result D value will be asserted before or simultaneously with the DONE value. In the value expression they were both generated by a single interaction but in the variable expression they are asserted by different interactions that may resolve at different speeds. So it is possible that the DONE value could be generated before the result D value. So the issue of resolution completion is still indeterminate for this expression.

J. THE NEED FOR A NULL VALUE IN VARIABLE EXPRESSIONS

There is no way for an expressional element to become meaningless within the context of a variable expression. All variables are constantly associated and all values are constantly forming valid input names and interacting. Elements of a value expression, on the other hand, can disappear from the expression and become meaningless. A variable that was participating in the resolution can suddenly assert some NULL value that is not part of a transform name of the expression and become meaningless to the expression. Elements of a variable expression cannot just drop out of the expression. The variables are locked in a rigid association structure and any value that they assert is inevitably influential in the expression and the expression must account for them. Therefore every possible formed input name must be accounted for by a transform rule. Any NULL value in a variable expression must be included in the transform rule names and be integral to the expression. So for a variable expression there must be a specific value assigned to mean NULL.

The introduction of a NULL value can resolve the problem of resolution completion. The NULL value essentially allows a variable to express meaninglessness within the structure of associations. The basic strategy for the transform rules is to specify a NULL result value if their input name includes a NULL value. In this manner formed input names can be recognized as valid or invalid. A valid input name is one with no NULL values. So although there are always input names formed and recognized, an invalid input name can suddenly become a valid input name providing a distinct resolution progress event. The variable recognizing this suddenly valid input name will transform its asserted result value from NULL to a nonNULL result value.

The following set of transform rules applied to the example expression will allow the assertion of the DONE value to be a distinct event in the resolution.

| ADD | CARRY | DONE |
| --- | --- | --- |
| 00[0] | 00[0] | 00[1] |
| 01[1] | 01[0] | 01[1] |
| 10[1] | 10[0] | 10[1] |
| 11[0] | 11[1] | 11[1] |
| anyNULL[NULL] | anyNULL[NULL] | anyNULL[NULL] |

The expression must begin with all asserted values in the expression NULL including the input values. For the value expression this requirement was simply that no values defined in the expression were asserted in the variable soup. If there were any defined values initially asserted besides the input name values the resolution would be confused. The variable expression has the same problem. If any of the variables in the expression are already asserting nonNULL result values when the input name is applied to the input variables the resolution will be confused. Therefore all the variables in the entire expression must be asserting NULL values when the valid input name values are applied.

It is this initial state of NULL that insures the occurrence of progressive interaction events. As each input name is recognized by each interaction locus the asserted NULL values will change to meaningful nonNULL values in an orderly progression of value transforms propagating through the expression until all the result values are valid. The expression must be reinitialized to NULL before another input name resolution can be started. This can be accomplished by simply presenting a NULL input name. The NULL result values will propogate through the expression just as the valid result values did. So the NULL convention requires that there be an alternating cycle of valid input names with NULL input names.

With the above transform rule sets and with the expression in an initial NULL state with the input values NULL and all interaction loci asserting NULL values The DONE variable can make a distinct transition from NULL to nonNULL. The entire expression will continue to assert NULL values as long as the input name values are NULL. As the input name values become nonNULL the interaction loci begin to assert valid result values. When the two input As are valid the result A and SB values will become valid. The result B cannot become valid until the input Bs are valid.

Figure 14:
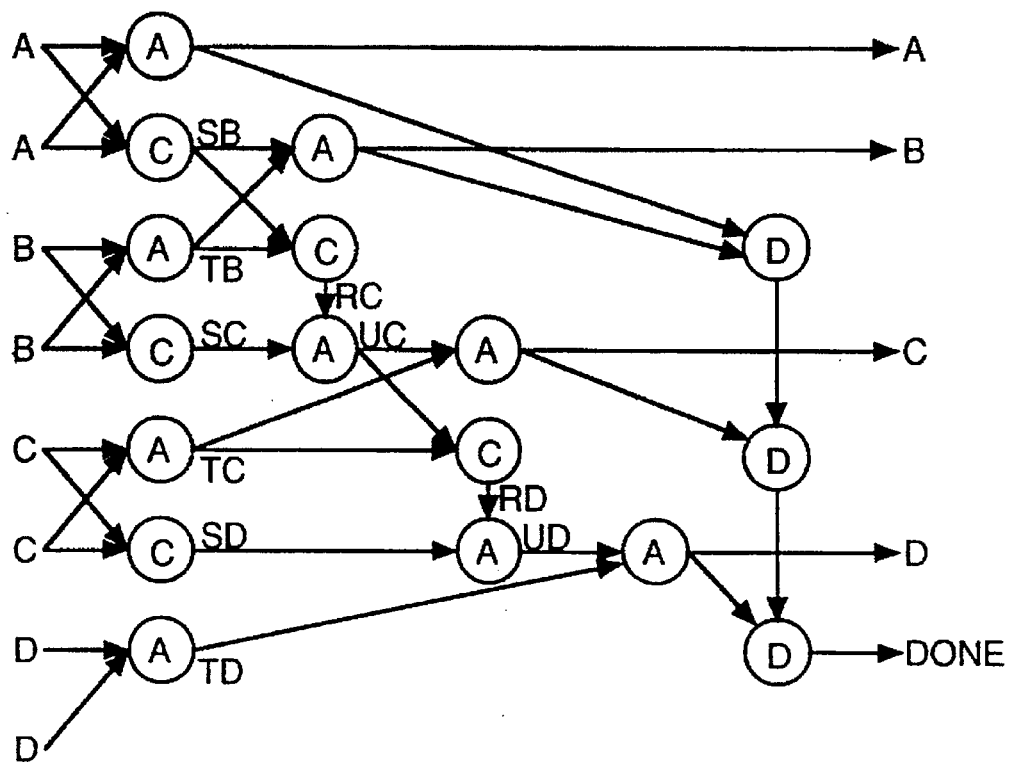
FIG. 14 is a configuration of interaction loci that will work with a NULL value added to the value sets of the interaction loci.

Since all the result values are dependent on the formation of the input name the result name will not be fully valid until the input name is fully valid. For instance both input Ds can be valid but if one of the other input values is not valid then the result D will remain NULL awaiting a valid carry value. The result D will not become valid until RD and UD become valid. D will be the last result value to be generated and DONE relying on the same input name can assert the completion of the resolution by becoming nonNULL. The assertion of the DONE value is now a distinct completion event but there are still the race conditions that will allow the possibility of DONE being asserted before the valid D is asserted. The solution to this requires some reorganization of the expression as shown in FIG. 14.

The result of the DONE variable is now directly dependent on the validity of all of the result values of the expression. A valid DONE value will not be asserted until after all the result values are validly asserted. The expression can now autonomously assert its own completion. With the NULL convention and the interaction locus convention this is finally a variable association expression of the example 4 bit binary addition process that will work.

The NULL convention scales up through combinations of interaction loci to endow a large expression of associated loci with the same behavior as a single locus. The large expression will only express a completely valid result name when a completely valid input name is present. Because no single locus changes its result from NULL until a valid input is present there are no race conditions. The result values will propogate through an expression in an orderly wavefront of valid result values with no invalid spurious values asserted anywhere in the expression at any stage of the resolution and finally a valid result name for the expression is asserted. The concurrency of the expression is fully and reliably managed. When a result value goes nonNULL it is asserting a valid result of a valid input name.

This final example is a familiar form of expression which can be viewed as interconnected processing elements or functional elements. The configuration of associated interaction loci is the possibility expression. The input values presented to the input of the configuration is the actuality expression It is still just variables associated by variable association rules asserting values that form input names that interact and transform according to value transform rules. The variable expression relies on the same primitive conceptual elements that the value expression relies on.

K. SUMMARY

A view of process was presented which characterized process in terms of change occurring to existential entities due to interactions among those entities. Interactions occur in the context of a configuration of possible interactions. Which possible interactions will occur is determined at interaction time by the appearance of a specification which determines which possible interactions will proceed. The possible interactions are specified by a possibility expression and the actually occurring interactions are determined by an actuality expression that appears at the time of interaction.

The invocation model of process expression was introduced as a conceptual accounting for general process expression. It consists of two primitive elements, variables and values, and two forms of composition rules for these elements, variable association rules and value transform rules. The variables and values are the existential elements of the model. Variables are pure existential entities. Every variable is always asserting a value which determines its interaction possibilities that can change during interaction.

Variable association rules specify which variables are interactively proximate and hence interactable. Value association rules specify which values are interactively proximate and can interact and also what result values will be asserted when the proximate values interact.

These primitive elements can not only specify individual interactions but they can specify compositions of multiple interactions to express a larger process as a progression of interactions in terms of dependency relationships among result values and the values of actuality expressions (input names). These dependency relationships can be expressed two ways within the model. They can be expressed as correspondence between combinations of result values and names of value transform rules or they can be expressed as association relationships among variables by variable association rules. This means that there are two distinct but inextricable realms of expression within the invocation model; the value expression form and the variable expression form. It is the relationship between these two realms of expression that relate many forms of expression generally thought to be quite distinct and unrelated. Of these two realms one seems to be more fundamental than the other.

In a value expression differentiation and association of meaning within the expression is almost entirely in terms value transform rules. Variables are not explicitly differentiated and consequently cannot be explicitly associated. They are either all constantly associated or are indiscriminantly associating. Interactions occur as interactable names are formed.

A value expression can stand alone as an independent autonomous expression on the basis of the primitive definitions of the model. An interaction in a value expression is a distinct resolution progress event. The input values disappear and the result values appear. An interaction is inherently directional because the result values cannot be confused with the input values. Result values are independently maintained by their asserting variables from interaction to interaction. An expression resolves in an orderly progression of interactions and unambiguously expresses its own completion by the existence of the result values.

In a variable expression differentiation and association of meaning within the expression is almost entirely in terms variable association rules. There must be values but all possible names are interactable so there can be no differentiation and specific association among the values. They are all constantly interactively proximate. Interactions occur wherever variables are associated.

The variable expression form on the other hand, requires a liberal dose of convention for it to be an autonomous expression with the same expressional qualities that are inherent for the value expression form. It required the NULL value convention to provide distinct interaction events. It required the interaction locus bounding convention to avoid input name formation ambiguity and establish directionality of resolution progress. These conventions were, however, definable from the primitive elements of the invocation model. No new primitives needed to be introduced.

It is all just associated variables asserting values that interact according to value transform rules in a dependent progression of input name formation and resolution. The invocation model of process expression has been introduced as a conceptual foundation for considering process expression of both natural and artificial processes. The implication is that there is no fundamental difference between natural and artificial expressions. Humans do it in much the same way that nature does it. Process expression far from being an artificial undertaking that can be arbitrarily adjusted to fit any desired conceptual model is found to have inherent limitations and necessary relationships much like the hard physical sciences.

All forms of process expression are related by the necessity to differentiate existential elements and express changes of existential differentiation through interactive associations of those elements. All processes resolve in a dependent progression of actual interactions within a context of possible interactions.

III. THE PROCESS EXPRESSION LANDSCAPE

This discussion explores the nature of process expression with varying quantities of value differentiation and variable differentiation. The discussion will begin with an arbitrarily defined baseline example process presented as a pure value expression. The discussion will progress through several forms of process expressions all representing the same example baseline process in different forms. Finally the pure variable form of process expression will be derived.

A. THE BASELINE EXAMPLE PROCESS

The example process for this discussion consists of 15 existential distinctions 6 of which can interact in 9 possible ways producing one of 9 possible results. A pure value expression is used as the baseline expression of the process because it is straightforward and intuitively understandable. The 15 existential distinctions in the process are differentiated with 15 unique values. All 9 possible interactions among the 15 distinctions are specified in terms of value transform rules.

Tables will be used in this section to represent sets of value transform rules because they are more compact and more convenient to read than the character string representations. It should be remembered that the table is not a single transform rule but just a convenient presentation of a set of transform rules. The corresponding character string expressions of the transform rules for the baseline example are also presented for this example to show the correspondence of the two forms of representation. The baseline example process was defined by simply filling in the table with arbitrary values.

|   | A | B | C |
|---|---|---|---|
| X | 0 | 1 | 2 |
| Y | 3 | 4 | 5 |
| Z | 6 | 7 | 9 |

AX[0]   XA[0]
BX[1]   XB[1]
CX[2]   XC[2]
AY[3]   YA[3]
BY[4]   YB[4]
CY[5]   YC[5]
AZ[6]   ZA[6]
BZ[7]   ZB[7]
CZ[9]   ZC[9]

All the existential differentiation in the process is expressed by unique values. There is no case where the same value expresses two distinctions. The set of value transform rules is a complete expression of all the interaction possibilities among the 15 distinctions. The pure value representation uses transform rules with input names two values long and will resolve in a single interaction step.

B. LIMITED VALUES

The discussion will begin with the possibility that there are not enough values to directly represent all the distinctions of the example. Suppose for instance that there are only 4 values available I, J, K and L to represent the 15 distinctions of the process. The expression of the distinctions will have to be encoded by using multiple values to represent each distinction previously represented by a single unique value. An arbitrary assignment of encodings might be as follows:

|    | II | IJ | IK |
|----|----|----|----|
| IL | JK | JL | KI |
| JI | KJ | KK | KL |
| JJ | LI | LJ | LK |

IIL[JK]      ILII[JK]
IJL[JL]      ILIJ[JL]
IKIL[KI]     ILIK[KI]
IIJ[KJ]      JIII[KJ]
IJJI[KK]     JIIJ[KK]
IKJI[KL]     JIIK[KL]
IJJJ[LI]     JIJII[LI]
IJJJ[LJ]     JJIJ[LJ]
IKJJ[LK]     JJIK[LK]

As a result of the encoding identical values are now used to represent more than one distinction. For instance the input names IJ and JI represent two different distinctions so the Is and Js of each input name must be differentiated. This can only be done by differentiating among the variables expressing the values. This J means something different from that J because it is expressed by a different variable with a specific association relationship to the variable of the second J. Differentiation lost by limiting value differentiation must be made up by differentiation of variables. The encoded input name must be expressed by 4 differentiated variables. The 4 variables cannot be interactively proximate.

Even though identical values are differentiated by different variables when these variables are associated at an interaction place the variables become interactively proximate and loose their differentiation and the identical values lose their differentiation. The interaction place of interest for this discussion is the interaction locus defined in the previous chapter and in this respect it is like any other place of interaction. The interaction locus cannot discriminate that this value came from the first variable and that value came from the second variable. Inside the interaction locus there is a collection of values just like a pure value representation and some of these are identical values. For instance if the input name to a locus were IJJI the locus can only determine that there are 2 Is and 2 Js. The input name could easily have been IIJJ. At the interaction locus all ordering is lost and only quantities of values can be discriminated. Therefore an arbitrary encoded input name cannot be unambiguously discriminated in a single interaction in a single interaction locus. In fact the only form of encoded input name that can be unambiguously discriminated by a single interaction locus is an input name with all values identical. For the current example the only unambiguously discriminable input names are IIII, JJJJ, KKKK and LLLL. There is only one possible input name with 4 Is only one with 4 Js and so on.

Furthermore an interaction locus can generate only one value for one result variable. Since the values in the locus are not differentiated the locus cannot decide that this value goes to the left result variable and the other value goes to the right result variable. Any number of input variables can be mixed into the locus but the internal mix cannot be unmixed to several result variables. This in itself further limits the discrimination possible in an interaction locus. If there are only four possible values that the result variable can assert then only four distinct input names can be discriminated by the locus.

An interaction locus with 4 input variables for the current example can only discriminate 4 unambiguous input names and can assert only 4 result values. A locus with only two input variables can still unambiguously discriminate only 4 input names; II, J J, KK and LL and assert 4 result values so in general there is a rapidly diminishing return of expressiveness for associating more than 2 input variables to an interaction locus. All of the examples of this discussion will assume 2 input interaction loci.

The discrimination power of the interaction locus is considerably less than the expressivity of its possible input names. The encoded input name clearly cannot be resolved in a single interaction locus. A single interaction locus can only resolve a small piece of the encoded input name. There must be a coordinated cooperation of many interaction loci to represent the complete example process with each locus providing a partial resolution of a small piece of the input name. It is this progression of partial resolution results that determines the input name formation dependencies among the interaction loci and provides the structure of the expression.

Before continuing it will be remembered that for a variable expression to be autonomous one of the values must be assigned the NULL meaning. This would leave only 3 of the 4 values representing process proper values or a fifth value would have to be added to represent 4 process proper values. Having mentioned the need for the NULL value the issue will be ignored for the bulk of this section and only reintroduced at the end to establish the nature of the pure variable expression. The following discussion will sound more familiar in relation to current practice and experience if the NULL value issue is ignored. Traditional forms of representation deal only with representation of process proper distinction and control is introduced as carefully coordinated external expressions such as system clocks, delay lines and other timed events.

The variable association expression will be presented as a directed graph. A node is an interaction locus. The arms are the associating variables. A spanning set of transform rules is associated with each locus that will resolve all the possible input names.

Since the resolution duties that each locus can perform are very limited the expression must be a coordinated progression of interaction loci. What is the fundamental rationale of forming such an expression? How are value transform rules assigned at each locus? How are the input name formation dependency relationships determined? The pure value expression was direct and intuitive but the encoded expression is neither direct nor obvious. It was easy to specify that A and Z go to 5 but how can it be specified that IJ and JJ go to LJ with the tools at hand?

There is no particular pattern to the example encoded table so the only general way to approach the expression is to recognize each possible input name and generate the appropriate result names. Each input name can be recognized individually and that recognition expressed by differentiated variables. The correct set of result values can then be asserted and these values collected to a single set of result variables.

The first stage of resolution is to recognize the input names. It has already been shown that a single interaction locus cannot discriminate between the input names IJ-JI and II-JJ so it must take multiple loci just to discriminate input names. Can a single locus discriminate just IJ from all other input names? The answer is again no because the input name JI might be a valid input name. The only possibility is to transform the expected input name into an unambiguous standard recognition name with 2 identical values and discriminate this standard recognition name.

So the first task for an interaction locus is to transform single values. This can be done with appropriate explicit transform rules at each locus or it can be done with a more general rotation locus which can be applied multiple times to get the desired transform. The values can be put in some circular sequence and the rotation locus simply states that each value is transformed into the neighbor in a particular direction. Any value can be transformed into any other value through the appropriate number of loci. The example rotate locus is shown in the table below. A rotate locus will be graphically represented as a small square with an R in it as shown in FIG. 15.

| I | J |
|---|---|
| J | K |
| K | L |
| L | I |

The standard recognition name will be chosen to be LL. To recognize a specific input name the input values will be rotated such that the specific input name will be rotated to LL. If LL is not the result of the rotation then the input name was not the specific input name to be recognized.

Figure 15:
FIG. 15 illustrates a configuration of rotation loci to convert a given input name to a standard recognition name.

The rotate configuration shown in FIG. 15 will set up the input name IJ for recognition. If the input name presented on variables A and B is IJ then the result of the rotates will be the name LL. If the result name is not LL then the input name was not IJ.

Figure 16:
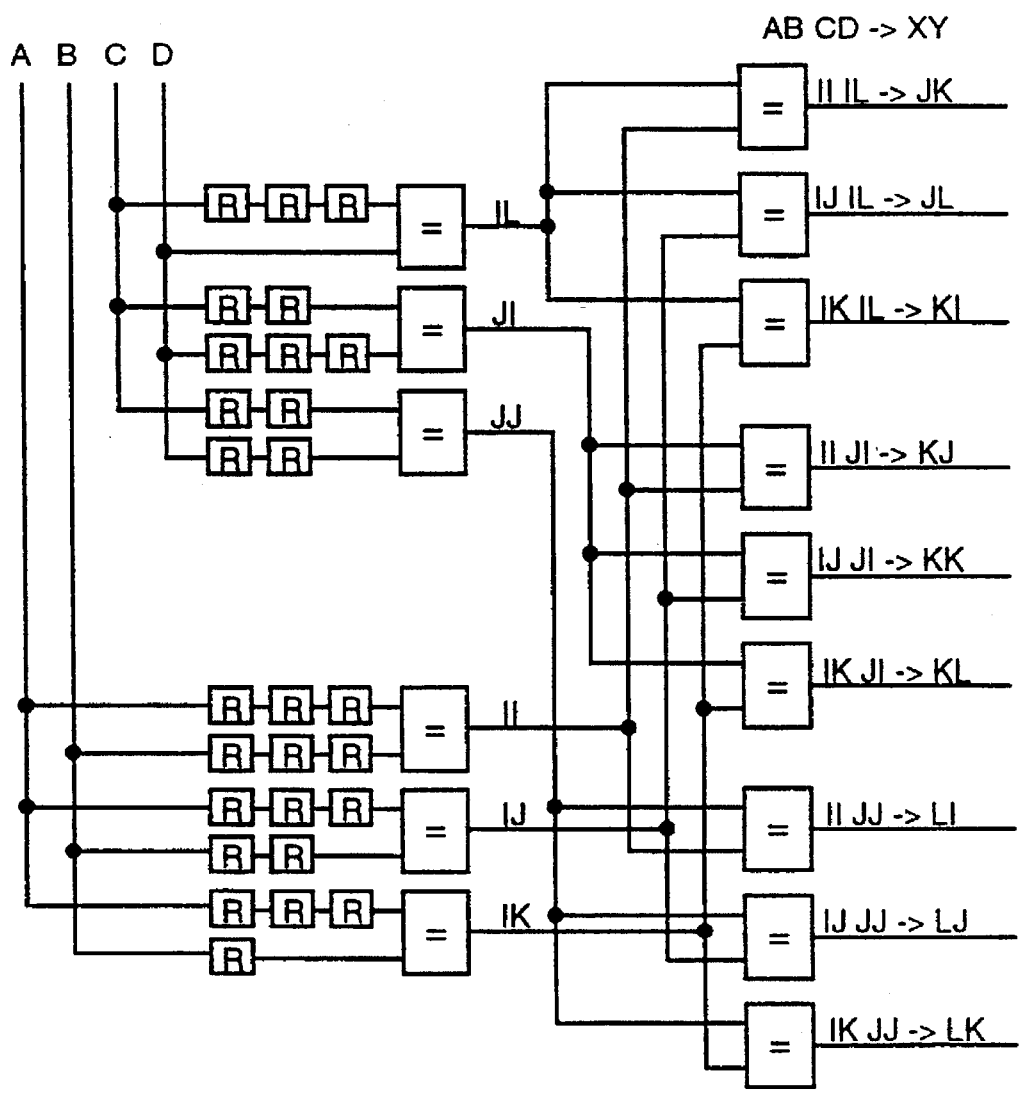
FIG. 16 is the input section of an expression that will recognize all of the possible input names of the process.

The next task for an interaction locus is to discriminate LL from all other input names. The equality locus recognizes exactly one input name. The example equality locus is shown in the table below. An equality locus will be graphically represented as a rectangle with an =sign inside as shown in FIG. 16.

|   | I | J | K | L |
|---|---|---|---|---|
| I | I | I | I | I |
| J | I | I | I | I |
| K | I | I | I | I |
| L | I | I | I | L |

This set of transform rules generate an L for the input name LL and an I for all other input names. The table is representing a control or logical significance and has established the convention that I means FALSE and that L means TRUE.

Since an interaction locus cannot discriminate order among values and cannot tell IJ from JI. All value pairs with mirror symmetry must resolve to the same result value. Therefore all tables of transform rules that use identical value sets for both input variables must exhibit diagonal symmetry. The only input names that an interaction locus can unambiguously recognize are the names along the diagonal for which both values are the same.

With these two interaction locus transform rule sets all the input names can be recognized. Each of the 9 possible input names is individually recognized by a separate group of interaction loci forming a recognition stage. The input variables are just routed to each of the input name recognition stages. One of the stages will recognize an input name and its result value will be L (TRUE). All the rest of the stages will have failed and their result will be I (FALSE).

For the example expression the input variables are labeled A, B, C and D and the result variables are labeled X and Y as shown in the table below.

|      |    | AB |    |    |
|------|----|----|----|----|
|      | II | IJ | IK |    |
| CDIL | JK | JL | KI |    |
| JI   | KJ | KK | KL | XY |
| JJ   | LI | LJ | LK |    |

FIG. 16 shows the input name recognition section for the example expression. In the example there are 9 possible input names of four values each. Since a single locus can only recognize two value input names the input name recognition is broken into two stages in which input names of 2 values are recognized and then these recognitions combined to recognize the 9 four value input names. The recognition itself is represented by nine distinct variables. Only one variable at a time can assert TRUE while the rest must assert FALSE. Of course they can all be false if the input name matches none of the recognized input names.

Figure 17:
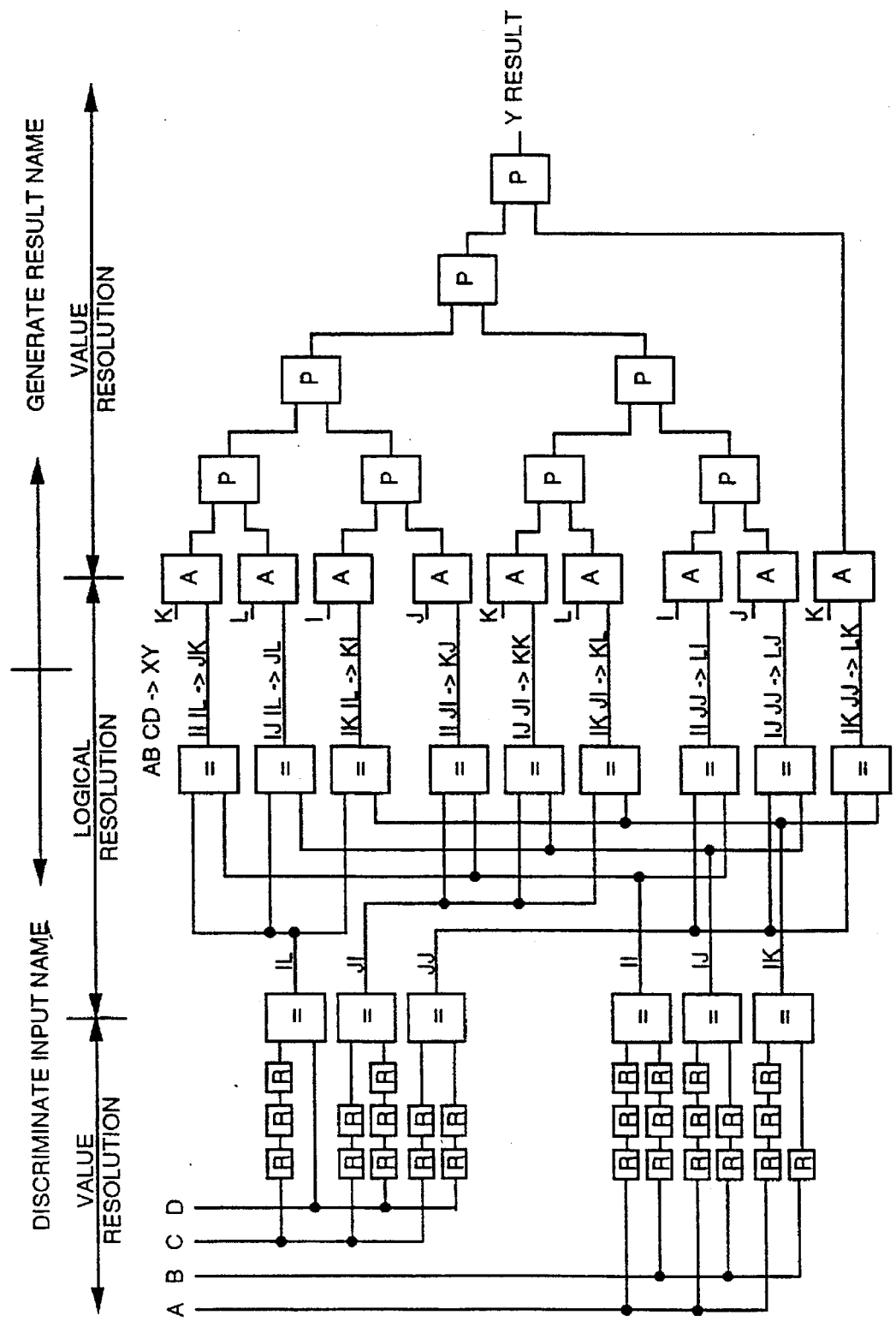
FIG. 17 is the complete expression that will transform each possible 4 variable-4 value input name to a specific 4 variable-4 value result name.

The single assertion of TRUE from one recognition stage is used to generate the result name associated with the recognized input name. The next task for an interaction locus is to assert a particular value if enabled by a TRUE value and to assert a default result value if not enabled. The transform set shown in the following table implements the assertion locus. An assertion locus will be graphically represented by a rectangle with an A inside as shown in FIG. 17.

|   | I | J | K | L |
|---|---|---|---|---|
| I | I | I | I | I |
| J | I | I | I | J |
| K | I | I | I | K |
| L | I | J | K | L |

One input variable of the assertion locus is set constantly to the desired value and the other input is the enable variable which will be L or I. If it is L then the constant value will be asserted on the result variable. If the enable input value is I then the default value of I will be asserted on the result variable. Choosing I as the default result value is an arbitrary convention that all other loci must relate to once it is established. It is generally convenient to choose the default result value to be the same as the FALSE value.

So all the assertion loci except one will assert I and the selected one will assert a nondefault value which may also be I. All these values must then be combined through a priority network such that any nondefault value overrides all the default values and is asserted by the result variable for the whole expression. This prioritized collection of asserted values is the last general duty of an interaction locus. Either transform set shown in the following table will implement a priority locus. A priority loces will be represented graphically by a rectangle with a P inside as shown in FIG. 17.

|   | I | J | K | L |   |   | I | J | K | L |
|---|---|---|---|---|---|---|---|---|---|---|
| I | I | J | K | L |   | I | I | J | K | L |
| J | J | J | K | L |   | J | J | I | I | I |
| K | K | K | K | L |   | K | K | I | I | I |
| L | L | L | L | L |   | L | L | I | I | I |

At each of these loci either two is will be presented or one I and another value. In all cases the other value will be asserted on the result variable of the locus and will make its way through a tree of such loci to the result variable of the whole expression.

FIG. 17 shows the entire example expression to assert the value for the Y result variable including value generation and prioritized collection. The 9 assertion loci with one input set to a constant generate the Y result value for the recognized input name. The asserted value is then directed to the result variable via the tree of Priority collection loci. The Y result value is shown because it takes on all 4 values and makes a better example than the X result. The X result value is generated by a similar assertion and priority network driven in the same way by the same input name recognition TRUTH variables.

The expression can be viewed as consisting of two halves. The first half recognizes the input names. The second half asserts the proper result value on the result variables. Looked at another way the expression can be viewed in three parts. There is an input section that relates directly to the input values and recognizes pieces of the input name. There is an internal section strictly in terms of logic values which combines the partial recognition pieces to recognize the larger input name. Then there is the result section which asserts the result values based on the logic values of the internal section.

This initial example provides a convenient context within which many other issues of process expression can be discussed.

C. OPTIMIZATION

Figure 18:
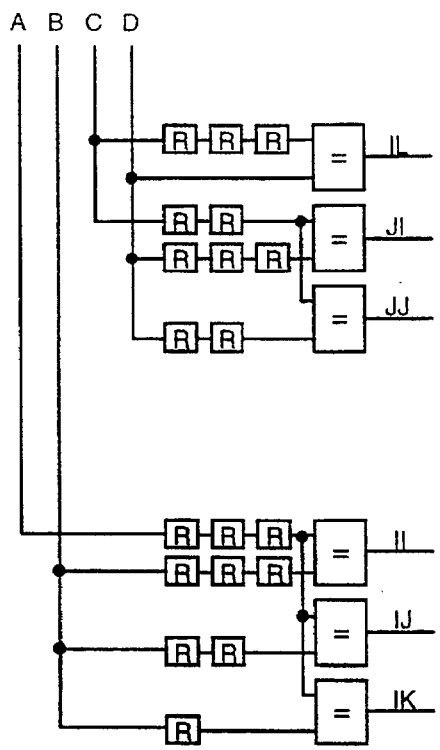
FIG. 18 shows how the input name recognition stage can be optimized.

This expression can be optimized in several straightforward ways. In the input name recognition stage, redundant rotations can be eliminated. If the same rotation is applied to the same variable more than once the result of a single rotation stage can be fanned out to accommodate the other inputs as shown by FIG. 18.

Figure 19:
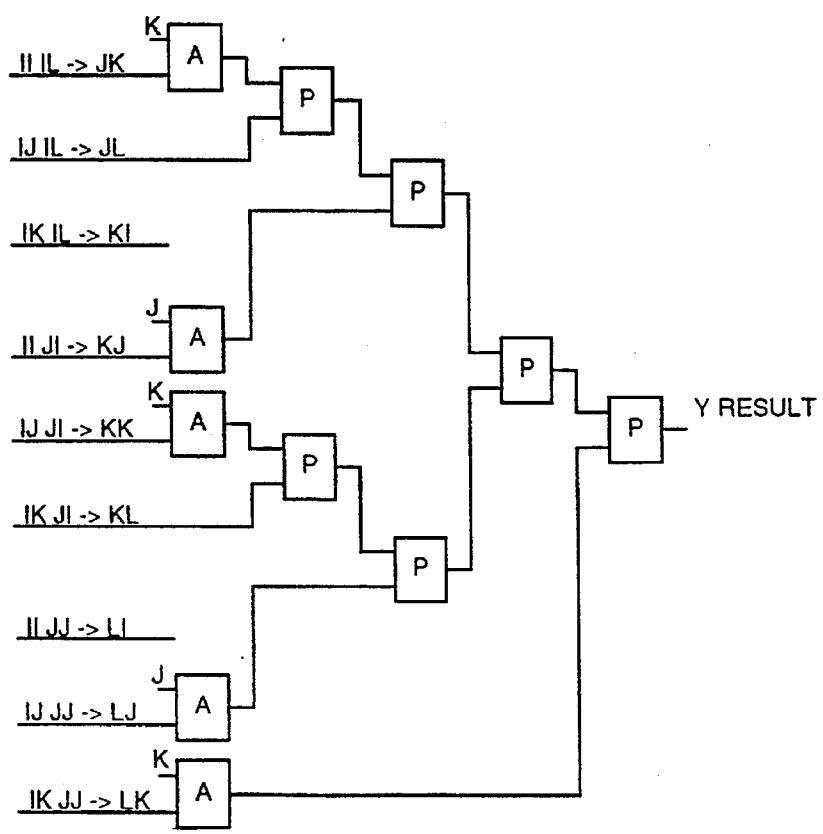
FIG. 19 shows how the result collection and assertion stage can be optimized.

Referring to FIG. 19, in the result generation stage the logical control values do not have to be asserted as constants because the logic control variable is already L or I. The L can just be passed through. Is do not have to be passed through at all because I is the default value. If no higher priority value is selected the result will be I.

It will be noticed that only J and K are specifically generated for result values. The recognition stages that generate I value results for the Y variable are still retained to control the result generation stage for the X result variable. If there were an II result value the recognition stage for this input name could be eliminated entirely.

Figure 20:
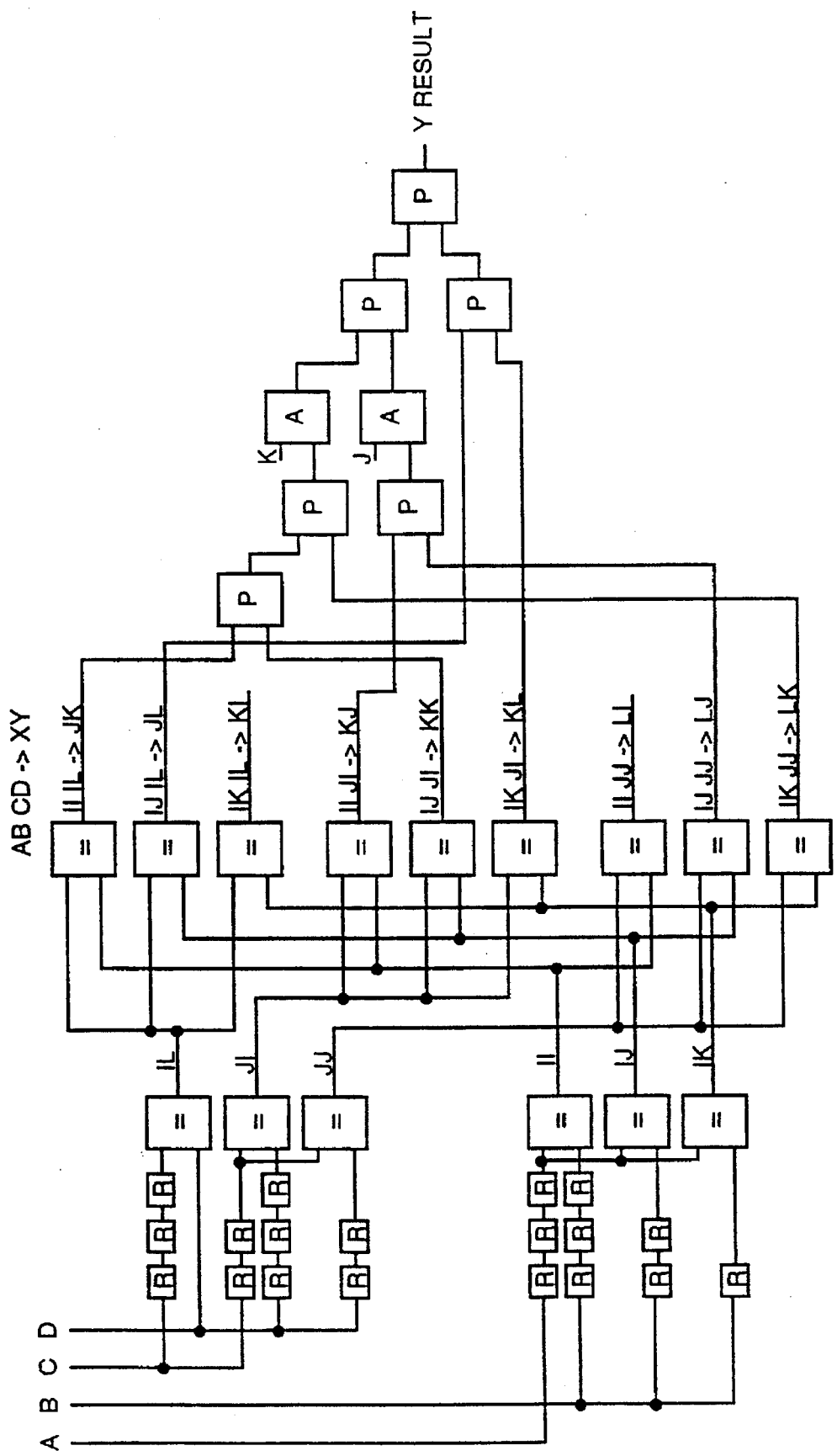
FIG. 20 shows the complete optimized expression to recognize 4 variable-4 value input names and assert 4 variable-4 value result names.

There is one more straightforward optimization that can be applied to eliminate redundant assertion loci. The logic values can be collected for each result value before asserting that result value. This allows the use of only one assertion locus per result value. The final optimized expression is shown in FIG. 20.

There are likely many other techniques that could be developed to achieve other optimizations. For instance, a Karnough-map-like technique might be possible to determine what minimal set of input names actually determine the result values. Such a technique might have shown that the arbitrary encoding left the A variable as a constant and that the input names might possibly be discriminated with only three variables.

D. RELATION TO BINARY LOGIC REPRESENTATIONS

This expression corresponds directly to the familiar binary circuit expressions. The rotate locus corresponds to the NOT gate. The equality locus corresponds to the AND gate. The priority collect locus corresponds to the OR gate. There is no counterpart of the assertion locus because binary expression does not have any intermediate nonlogical values to assert.

| I | J |
|---|---|
| J | K |
| K | L |
| L | I |

Rotate

| 0 | 1 |
|---|---|
| 1 | 0 |

NOT

|   | I | J | K | L |
|---|---|---|---|---|
| I | I | I | I | I |
| J | I | I | I | I |
| K | I | I | I | I |
| L | I | I | I | L |

Equal

|   | 0 | 1 |
|---|---|---|
| 0 | 0 | 0 |
| 1 | 0 | 1 |

AND

|   | I | J | K | L |
|---|---|---|---|---|
| I | I | J | K | L |
| J | J | J | K | L |
| K | K | K | K | L |
| L | L | L | L | L |

Priority

|   | 0 | 1 |
|---|---|---|
| 0 | 0 | 1 |
| 1 | 1 | 1 |

OR

The expression of a binary circuit follows the same strategy as the four value example expression. It recognizes input names and generates a unique result for each unique input name. The binary expression however has some unique advantages over a multivalue expression. There is complete intersection between its logic values and its expression proper values. If 0 is chosen as the default result value then any input name that results in all 0s need not even be recognized. Only input names that result in a 1 need be recognized. So the basic strategy for binary circuits is to recognize all input names that result in a 1. If 1 is assigned as the internal TRUE value the truth of the recognition is the direct result value. All the truth values from the recognition stages are collected and that is the result of the expression. This can be illustrated with the half adder circuit. The truth table for the halfadder circuit is shown below and the circuit itself is shown in FIG. 12.

| A | B | S | C |
|---|---|---|---|
| 0 | 0 | 0 | 0 |
| 0 | 1 | 1 | 0 |
| 1 | 0 | 1 | 0 |
| 1 | 1 | 0 | 1 |

There are only two input names 01 and 10 that generate a 1 for the S result variable and only one input name 11 that generates a 1 for the C result variable. These three input names are recognized by rotating the input names to the standard equality name (11) and determining equality with an AND gate. The truth value (1) of their recognition is collected through the OR gate as the result value. If none of these input names are recognized the FALSE value (0) of the recognizers will be asserted as the default result value. The binary logic circuit representation is constructed with exactly the same representation principles as the four value example expression.

E. DEFINABLE TRANSFORM SETS

Can the example process be expressed more directly with four values? Can there for instance be a more direct mapping from the input names to the result names without going through the internal logic? It seems a particularly inefficient use of expressive resources to have a locus assert only two result values when there are four possible result values.

This would mean that each recognition locus would have to discriminate three or four input names instead of just two input names. Since a single locus can only discriminate four input names and not all input names can be recognized by a single locus, one of the result values must be assigned a meaning of FALSE. So each locus can recognize only three possible input names. The only input names that a locus can unambiguously recognize are the input names with identical values II, JJ, KK and LL. If I is assigned to be the FALSE value then any three of the four unambiguous input names can be discriminated with the result values J, K and L. These names then are the standard recognition names for a locus and any input name can be recognized by rotating it to one of these recognition names.

A single locus cannot however recognize three arbitrary input names. Only one rotation can be applied to each of the two input variables of a locus so the three input names recognized by a single locus must be rotation neighbors. The same rotation must rotate one input name to JJ the second to KK and the third to LL. For example the input names IJ, JK and KL can be recognized by a single locus by applying a single rotate to the first variable. The following transform set will unambiguously recognize three input names that are rotation neighbors.

|   | I | J | K | L |
|---|---|---|---|---|
| I | I | J | K | L |
| J | J | J | K | L |
| K | K | K | K | L |
| L | L | L | L | L |

The internal loci are now presented with all possible combinations of the four values instead of the two logical values as in the first example. The internal expression stage is no longer logical. In short the internal loci are faced with the same name recognition problem that the input loci are presented with. Now however there are only two variables instead of four variables. The same rotation neighbor strategy can be applied to these internal names so that a single locus can recognize more than one input name.

The transform rules for each locus can be custom defined to assert the desired result value for the recognized input name directly. Assume the following input name to result value mapping JJ->K, KK->J and LL->J the following locus will generate the appropriate result values directly.

|   | I | J | K | L |
|---|---|---|---|---|
| I | I | I | I | I |
| J | I | K | I | I |
| K | I | I | J | I |
| L | I | I | I | J |

Other rotationally related groups of input names could be accommodated with similar custom loci. There must still be several of these stages and their result values must still be priority collected to the final result variables. So some advantage in the number of variables and loci can be gained with custom transform sets defined for specific loci.

More advantage can be gained by carefully encoding input names instead of arbitrarily assigning input names. FIG. 21b shows such an encoding to optimize the expression. In this example rotational neighbors are assigned to each of the two input variables. FIG. 21a shows the graphic representation of a custom interaction locus. The 3 letters in the rectangle indicate the setting of the diagonal values in the transform table. The complete optimized expression is shown in FIG. 21c.

Figures 22A, 22B:
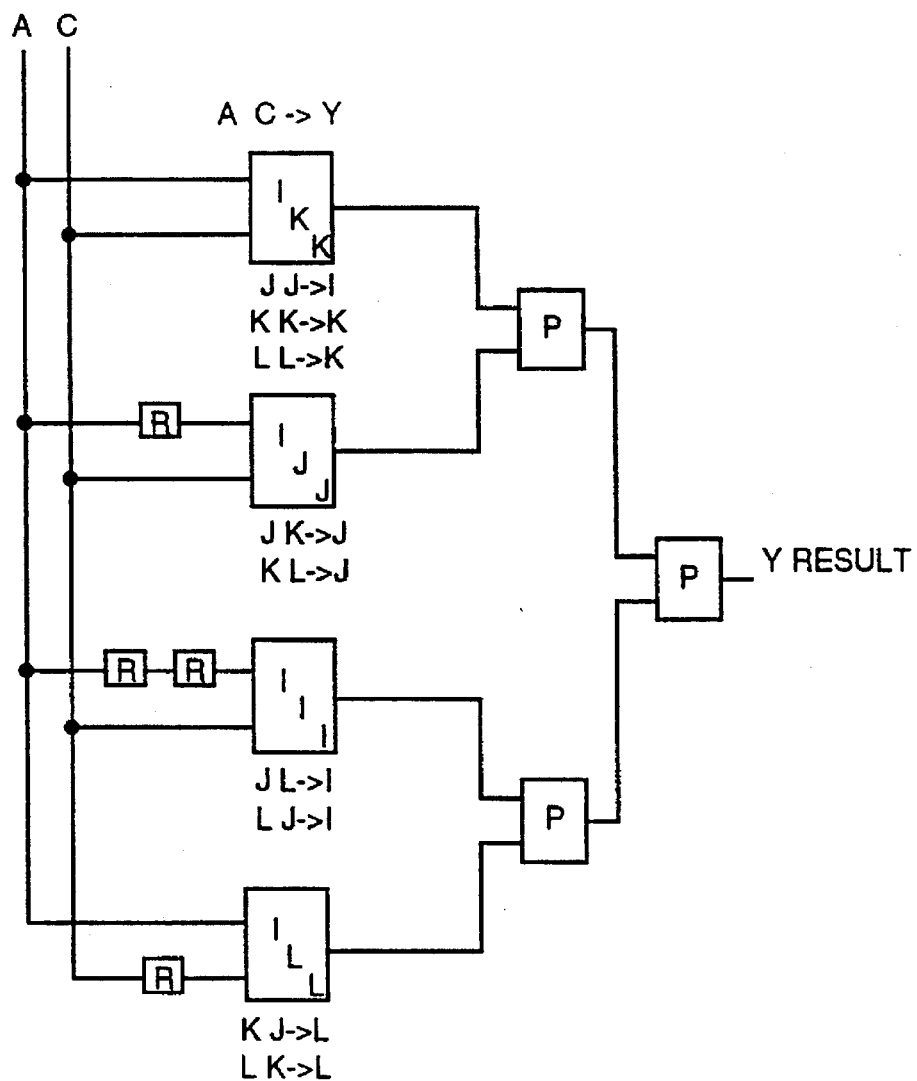
FIGS. 22a–b illustrate how the expression can be further optimized by reassigning the coding of the input names.

Differentiation resources have not heretofore been fully utilized. Since the variables AB and CD are differentiated by variables they do not need to be differentiated with unique values and can be assigned the same encoding input names with no ambiguity. The input distinctions can be differentiated with two variables with three values each as shown in FIG. 22a. Four variables are not needed to differentiate the input distinctions. So the encoding can be improved even more and a whole expression stage eliminated as shown in FIG. 22b.

For this particular expression the third recognition locus results in only is so it can be eliminated along with one priority locus. Apart from that, this is probably close to the minimal form of expression of the example process achievable with four values.

Whether a expression is rendered in terms of a few standard loci or in terms of custom definable loci is a matter of choice, possibility and practicality. The fancy interaction loci discussed here may not be possible in most practical expression environments. For instance it may only be possible to detect a threshold presence of a single value. Traditional electronic logic gates only recognize a voltage threshold.

F. MORE AVAILABLE VALUES

Figures 23A, 23B:
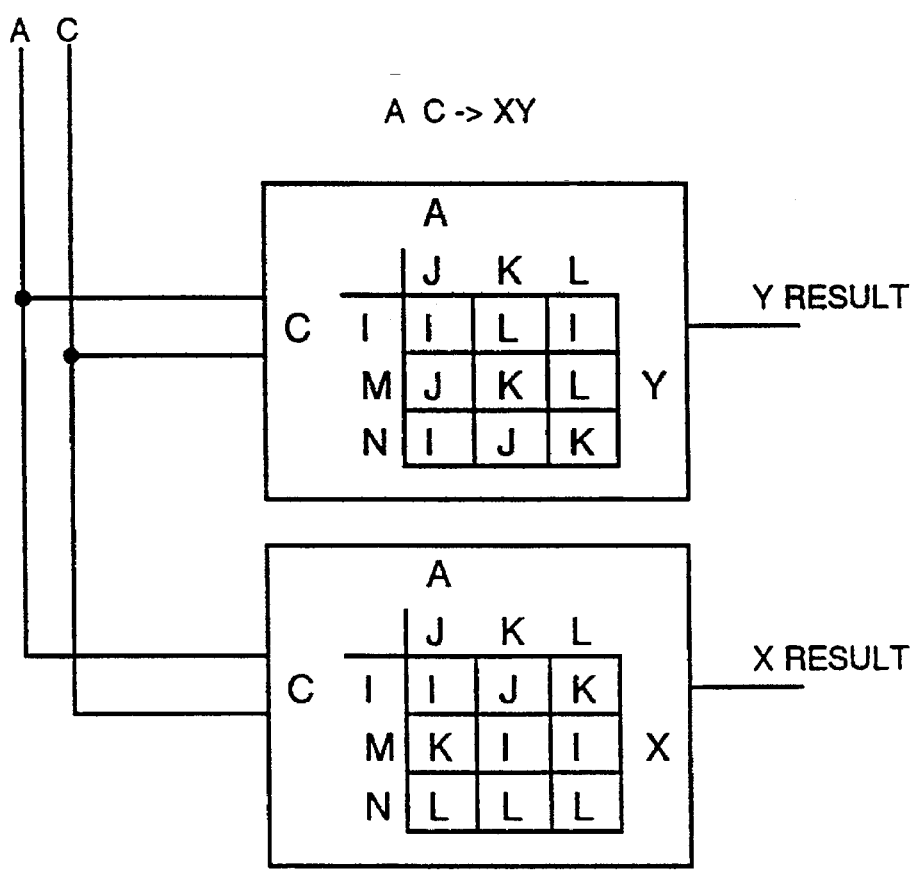
FIGS. 23a–b illustrate the expression of the example process if 6 values are available.

If more values are available, for example 6 values, the input names can be expressed without replication of values. This eliminates the ambiguity inside the interaction locus that limited input name recognition to input names of identical value. There no longer need be identical values presented to an interaction locus. The nine result distinctions must, however, still be encoded with two variables as shown in FIG. 23a. The entire example process with both X and Y result variables can now be expressed by two custom defined interaction loci as shown in FIG. 23b.

Figures 24A, 24B:
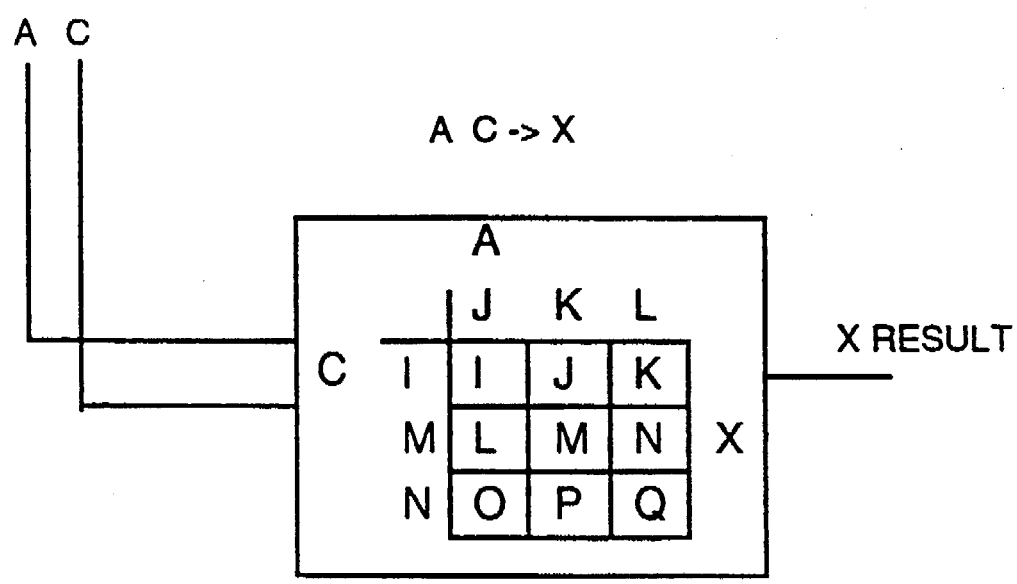
FIGS. 24a–b illustrate the expression of the example process if 9 values are available.

If 9 values are available the result values need no longer be encoded in two variables as shown in FIG. 24a and the entire process can be expressed in one custom interaction locus as shown in FIG. 24B.

With 15 values there is no longer a need for an interaction locus to discriminate input values from result values or to associate differentiated variables because variables do not need to be differentiated in the first place. A transform table with more letters is shown in FIG. 25a. The discussion has found its way back to the pure value expression as shown in FIG. 25b that defined the example process at the start.

G. FEWER AVAILABLE VALUES

If there are fewer available values, for example 3 values, the input distinctions can still be differentiated with 1 variable of three values and the result can still be expressed with 2 variables of three values. The only difference is that a single interaction locus can now only recognize 2 unambiguous input names instead of 3 unambiguous input names so some extra loci might be required in the expression. It should be noticed that three values are optimal for this process in that no value expression capacity is wasted. All the possible names for both input and result are used.

|   | A |    |    |    |    |
|---|---|----|----|----|----|
|   |   | J  | K  | L  |    |
| C | J | JJ | JK | JL |    |
|   | K | KJ | KK | KL | XY |
|   | L | LJ | LK | LL |    |

When only two values are available it becomes necessary to encode the input distinctions in 2 variables and the result distinctions in 4 variables. Furthermore a locus now can recognize only 1 unambiguous input name. The net result is that there are lots more variables and loci in the expression.

Figure 27:
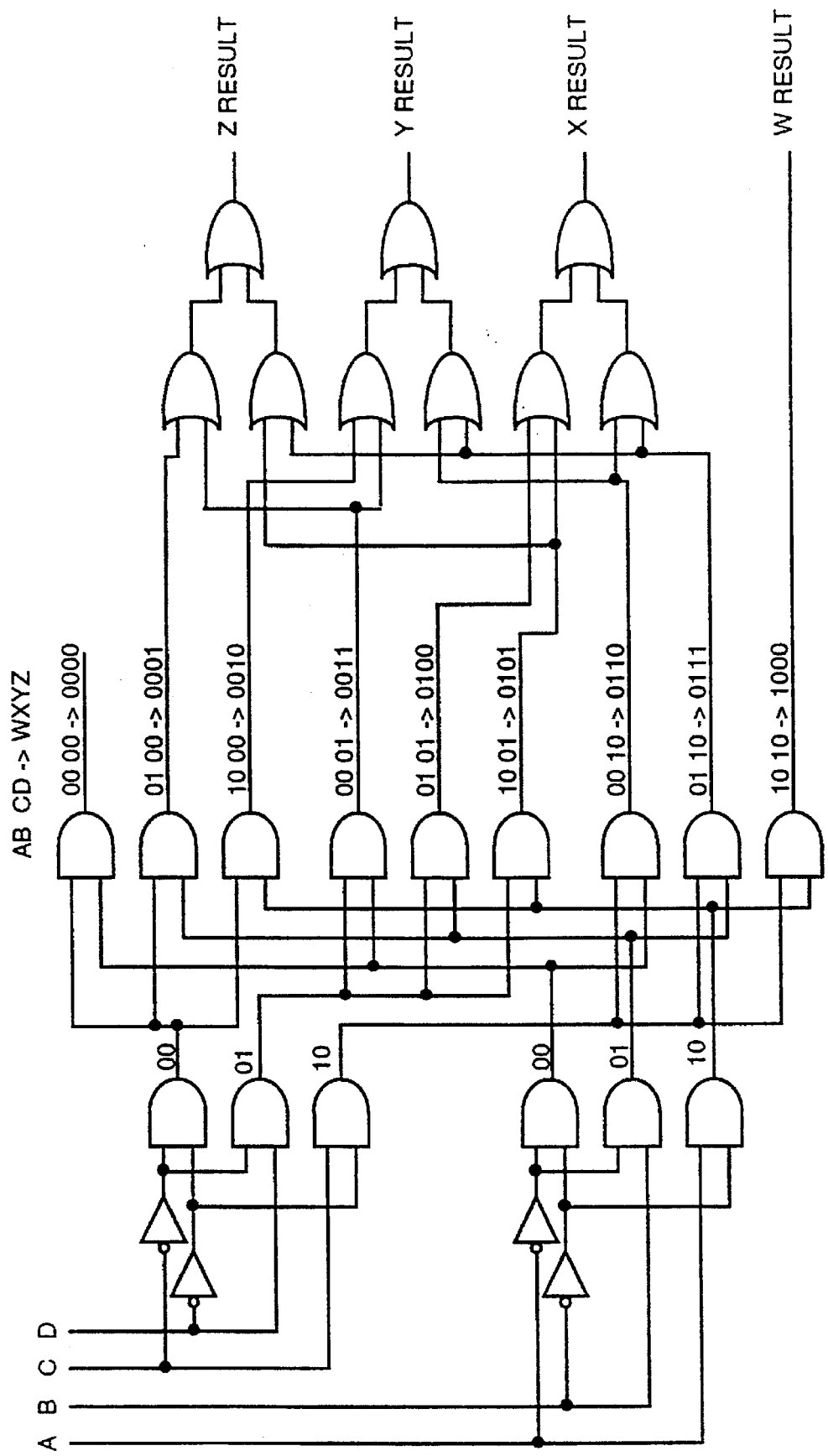
FIG. 27 shows the example process as a, prior art, standard logic circuit.

FIG. 26a shows the mapping for the example process with two value names. FIG. 26b shows the same process with more familiar symbols. FIG. 27 is a traditional, prior art, logic circuit expression of the example process that recognizes the presented input names and asserts the appropriate result names.

The logic circuit expression comprises an information processing unit which resolves names which are combinations of values, for example data values which represent various physical states. As shown, the logic circuit comprises a plurality of logic gates or information processing members which also resolve combinations of values. The unit or logic circuit further has a plurality of discreet conductors or information transmission elements which transmit combinations of values to and from the members or logic gates. The elements or conductors may be electrical, optical, magnetic or other conductors as known in the art. Combinations of values transmitted by the elements or conductors are presented to the members or gates and asserted from the the members or gates. Further, as shown, the unit maps from combinations of presented input combinations of values to combinations of asserted result values. The individual members resolve value combinations by asserting a result value for each presented combinations of values, the asserted value being dependent upon the particular combination of values presented.

H. NULL AGAIN

Although it was previously stated that the examples would ignore the NULL value convention, the issue itself of expressing meaninglessness within the expression could not be entirely ignored. In a traditional logic circuit expression, the meaningfulness and meaninglessness of the data values at the input and result interfaces of the expression are established by an external expression; usually the system clock. All values expressed external to the expression are considered to be expressing valid meaning on the clock edge.

Inside the logic circuit or information processing unit there is no external authority and variables have to express their own meaninglessness to the resolution of the expression themselves. This is why there was always a value internally assigned the meaning FALSE and a value internally assigned the meaning DEFAULT. FALSE means "I am not meaningful to this resolution". DEFAULT means "I may or may not be meaningful to this resolution depending on whether a nondefault value is asserted".

Although the NULL value can be used to serve as a FALSE or DEFAULT value it can also simply be added to the existing logic with its existing FALSE and DEFAULT values without disturbing the established logic of the expression. For instance the NULL convention can be added to the binary example by assigning the following transform value sets to the interaction loci.

|   | N | 0 | 1 |   |   | N | 0 | 1 |   |   | N | N |
|---|---|---|---|---|---|---|---|---|---|---|---|---|
| N | N | N | N |   | N | N | N | N |   | N | N |   |
| 0 | N | 0 | 0 |   | 0 | N | 0 | 1 |   | 0 | 1 |   |
| 1 | N | 0 | 1 |   | 1 | N | 1 | 1 |   | 1 | 1 |   |

AND OR NOT

Each locus now asserts a result value only when its input name is valid. An orderly wavefront of correct result values propagates through the expression until the expression is asserting all nonNULL valid result values. When all the result values are nonNULL the resolution is complete. There are no races and no spurious switching while the expression settles to a valid result state. Both the standard logic expression and the NULL convention expression will stabilize to the same value assertion state. They are both identical in terms of transforming data but the expression with the NULL value convention can autonomously express its own completion.

Input and result names can express validity or invalidity providing an autonomous interaction coordination capability among expressions. External control expressions such as the system clock are no longer required.

I. THE PURE VARIABLE REPRESENTATION

Two value binary expression is generally taken to be a minimal form of expression and might be expected to be the mentioned pure variable form of expression which uses minimal differentiation in terms of value because there must be at least two values in any expression. This is not the case however. Remember that at the beginning of this discussion the issue of autonomous control was raised and then ignored with the comment that if an example expression was expressing process proper distinction with N values then it really required N+1 values to be an autonomous expression. The traditional form of binary expression that expresses process proper distinction with two values is not an autonomous form of expression. It is really a three value form of autonomous expression. The missing control aspect of the expression that would be expressed by the third NULL value is traditionally expressed by carefully coordinated external expressions such as global clocks, delay lines or other timed events.

For an autonomous pure variable expression with two values one value must be the NULL value which leaves only one value for process proper distinction. This means that all process proper distinction must be expressed by variable differentiation. The only significance that a value can represent is whether a variable's distinction is asserted or not asserted; valid or invalid. A pure variable expression has the 2 values; ASSERT and NULL.

The pure variable expression could be considered a one value expression from the traditional point of view. Some readers may prefer to view it as a pure control expression. Since there is only one process proper differentiation value the only valid input names that can be formed are all the same value so all that can be done by an interaction locus to recognize a formed name is to count asserted values. So a pure variable expression is a discrete form of threshold logic.

The quickest way to grasp the pure variable expression is to compare it with the familiar example of the half adder logic circuit in FIG. 12. The 4 variables A, B, C and S of the logic circuit each with two values express 4 process proper input distinctions and 4 process proper result distinctions.

Figures 28A, 28B:
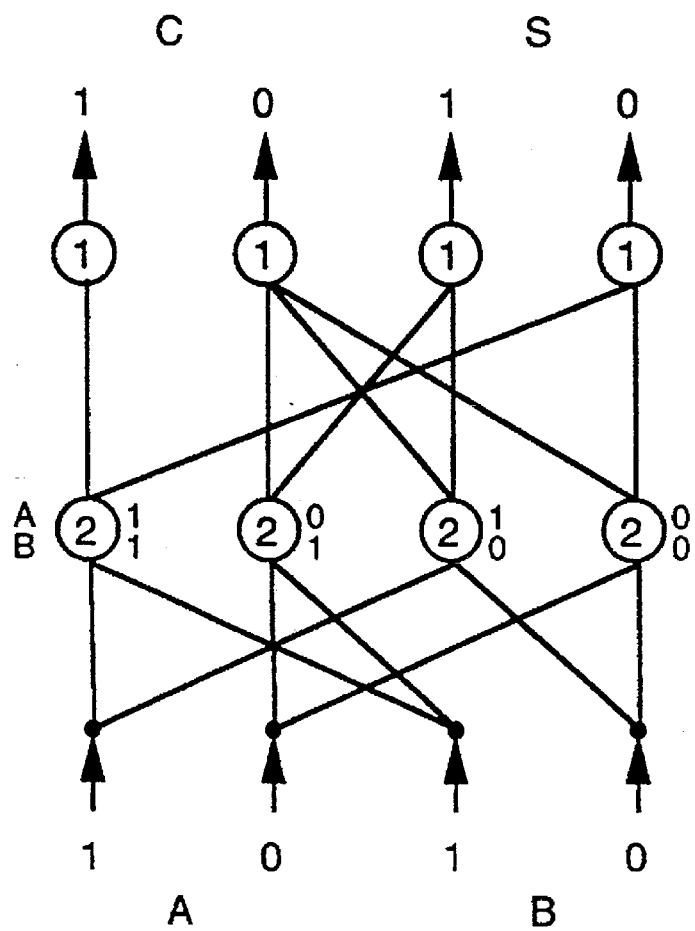
FIGS. 28a–b show the 2 value NULL convention expression of the simpler example process of FIG. 12.

FIG. 28a is the truth table for the halfadder process and FIG. 28b illustrates a pure variable expression of the half adder process. The number inside each interaction locus indicates how many ASSERTs are required to set the result variable to ASSERT. The value transform rule sets are as follows. A is ASSERT and N is NULL.

Threshold 1

|   | N | A |
|---|---|---|
| N | N | A |
| A | A | A |

Threshold 2

|   | N | A |
|---|---|---|
| N | N | N |
| A | N | A |

The four input and four result distinctions expressed with two variables and two proper values in the logic circuit are now expressed with four variables and one proper value. There must be a presentation convention that only two of the input variables, one for A group and one for B group can be asserted simultaneously. These two assertions will enable the assertion of only one of the 2 threshold loci. The result of the asserting 2 threshold locus will enable the assertion of the appropriate 1 threshold result loci to assert the correct result name.

Figure 29:
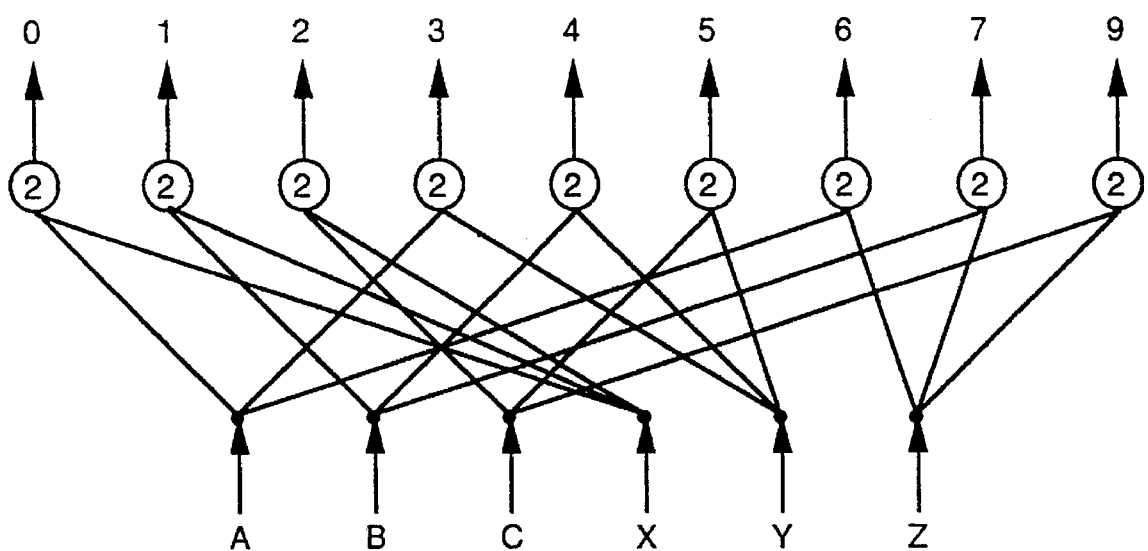
FIG. 29 shows the basic example process expressed as 2 value NULL convention logic.

FIG. 29 shows the baseline example process in a pure variable expression. The values from the pure value expression are overlaid on the pure variable expression to illustrate the correspondence between the two expressions. Only one variable from A, B, C and one variable from X, Y, Z will be asserted simultaneously. This is simply a expressional convention. This expression will assert only one of its result variables and expressions associated with its input name will also assert only one of their result variables.

The essence of any process is the possible interaction relationships among the existential distinctions. The measure of a process is the particular configuration of possible interactions among a specific quantity of existential differentiations. These two expressions express the same process in very different ways but there is still a direct correspondence between the pure value and the pure variable expression. There are 9 transform rules in the pure value expression and there are 9 associated interaction loci in the pure variable expression. Both expressions express six input distinctions with nine interaction possibilities producing nine possible result distinctions. The transform rules and the associated interaction loci express the same interaction relationships among 15 distinctions. These two expression both express the same process.

If one names the variables of a pure variable expression and associates the names in their interaction relationships then one has a set of values and their transform rules which is a pure value expression of the process. If one graphs the transform rules of a pure value expression then one gets a pure variable expression of the process.

J. SUMMARY

This section has been a mini-excursion through process expression from the pure value form to the pure variable form with emphasis on the intermediate territory. It was discovered that the discrimination power of an interaction locus, for example an information processing member such as a logic gate, could be considerably less than the expressivity of its input name and also that the input names to be resolved could be far larger than the input name of any single interaction locus. Consequently the coordinated cooperation of many interaction loci, each performing a small piece of resolution, was required in a dependent progression of partial resolution results to express the resolution of a larger input name. This progression of partial results manifests itself as a network of input name formation dependencies among interaction loci which determines the structure of the expression. Such expressions in terms of directly associated interaction loci will be called directly associated processes (DAP). An example of a DAP is an information processing unit such as a logic circuit.

The structure of name formation dependencies depends on how much resolution a single interaction locus can provide which in turn depends on the expressional resources available and the constraints imposed on the expression. The first example was limited to 4 values and to 4 transform rule sets for the interaction loci. This required a large network of name formation dependencies with lots of interaction loci. As the constraint on the number of transform rule sets was relaxed and transform sets were allowed to be custom defined fewer interaction loci were needed. Also as more values were allowed fewer interaction loci were needed until with enough values no interaction locus was required at all. As fewer values were allowed more interaction loci were required.

The expression landscape is not smooth but is punctuated with peaks of various optimalities. The significant expressional advantages accrue when the expressional resources best match the process to be expressed. For the example process the resources phased up with the process at 3, 6, 9 and 15 values. At 3 values all distinctions were expressed and all possible names were used. With 4 values many possible names were not used so the expressivity of the available values was not fully used. At 6 values the input names could be uniquely expressed so the discrimination inefficiency of the interaction locus was reduced. At 9 values both input and result could be uniquely expressed with single value names making the input name discrimination much easier. At 15 values all distinctions of the process were uniquely expressed and the expression became a pure value expression. A different process would exhibit different phasing relationships.

All the example expressions used the same strategy of expression to resolve an input name or combination of values. Each possible input name was individually recognized and that recognition directly generated the result value(s) for that input name. ADAP is a input name resolver. It determines or specifies which input name of a set of possible input names is present and generates the appropriate result for that input name.

The input name for a DAP is presented by a fixed set of input variables. Therefore all the input names of a recognition set for a particular DAP must be the same length. The set of input names is all the possible combinations of values assertable by the input variables. Any arbitrary set of input names or combinations of values can be mapped to any desired set of result distinctions by a DAP. ADAP is deterministic in that the same input name is always mapped to the same result distinctions.

A DAP is still, however, just associated variables asserting values that interact according to value transform rules. No new expression primitives needed to be postulated to achieve the expressional capabilities of the DAP.

An information processing system for use in manipulating and resolving data is constructed incorporating the NULL value. The system comprises one or more information processing units resolving combinations of values, such as a logic circuit. Each information processing circuit in turn comprises one or more information processing members, such as logic gates, for resolving combinations of allowed values, such members being communicatively connected via information transmission elements, for example electrical conductors, which transmit value (physical states) between members. Importantly the value combinations (information) comprise at least one data value and the NULL value. As previously discussed, multiple data values may be utilized. Additionally, the system may utilize additional non-data values, other than the NULL value such as the INTERMEDIATE value discussed in section V below.

The value combinations resolved via the information processing members, and transmitted via the information transmission elements may comprise at least one value, either data or non-data. Such value combinations include 1) the set including standard binary data values and the NULL value, 2) the set including only one data value and the NULL value, 3) the set including one data value, the NULL value, and the INTERMEDIATE value.

In an information processing unit which comprises multiple information processing members, the information processing unit maps from combinations of values presented to it to combinations of values it asserts. The information processing unit may perform a particular data resolution by asserting a specific combination of values for each combination of presented values.

Each information processing member resolves value combinations by asserting a values for each combination of values presented to it, such that (1) for VALID combinations of presented values the asserted value is a data value dependent upon the particular combination of presented values, and (2) for INVALID combinations of resented values the asserted value is a NULL value. Alternatively, member resolution may be accomplished by asserting a value such that (1) for VALID combinations of presented values the asserted value is a data value dependent upon the particular combination of presented values which remains asserted until the combination of presented values becomes all NULL, and (2) for all NULL combinations of presented values the asserted value is a NULL value which remains NULL until the combination of presented values becomes VALID, thus achieving hysteresis. Finally, with respect to systems utilizing intermediate values, the information processing member alternatively resolves value combinations by asserting a value such that (1) for VALID combinations of presented values the asserted value is a data value dependent on the particular combination of presented values, (2) for combinations of presented values that include data values and non-data values the asserted value is an intermediate value, and (3) for all NULL combinations of presented values the asserted value is a NULL value.

The information processing unit cycles through resolution and non-resolution states to allow determination by other information processing units of the information processing unit's (1) completion of a data resolution and (2) readiness to perform another data resolution. A resolution state occurring when the information processing unit is presented with a valid combination of values and is asserting a valid combination of values. A non-resolution state occurring when the information processing unit is presented with an all NULL combination of values and is asserting an all NULL combination of values.

IV. GENERALLY CONFIGURABLE PROCESS EXPRESSION

A generally configurable process is an already expressed process that can be configured to express any other arbitrary process. The discussion will initially focus on the expression of any arbitrary DAP. Expressing more complex processes than DAPs with a generally configurable process will be evident to the reader experienced in the art.

General configurability requires expressional capabilities that a DAP cannot fulfill. Once a DAP is expressed it cannot reconfigure itself to express a different process. DAPs can resolve very large names but each DAP can only resolve a specific set of possible names. The resolution of a different set of possible names would require a differently structured DAP. Conditionality can be added to the DAP to accommodate other configurations but to accommodate all possible configurations leads to intractable combinational explosion. So a generally configurable process must be expressive in ways that a DAP cannot accommodate.

The first requirement for general configurability is cyclic iteration. There cannot be an arbitrarily sufficient supply of interaction loci to accommodate any arbitrary DAP and even if enough loci were available they could not accommodate all possible association relationships. So an arbitrary DAP cannot be completely configured by any already expressed process. Only part of an arbitrary DAP can be configured by an already expressed process. Therefore the expression and resolution of the arbitrary DAP must occur a piece at a time within the already expressed generally configurable process.

This is directly analogous to the situation of interaction loci with limited input name resolution capabilities. Larger input names have to be resolved in a dependent progression of interaction loci that resolve the input name a piece at a time. A generally configurable process must be inherently limited in its immediate expressibility so it must express an arbitrary process as a sequence of pieces of expression. It must cycle through several configurations each of which contributes a partial resolution and the combination of which accumulates to a resolution of the complete arbitrary process.

A piece of expression might be larger or smaller depending on the capabilities of the generally configurable process. The size of the pieces is not important. What matters is that each configuration cycle is a single configuration piece of the arbitrary process. The generally configurable process can only do one configuration at a time. For the current discussion considering the expression of any arbitrary DAP the pieces of configuration will be individual interaction loci.

The next requirement is the independent maintenance of values within the generally configurable process. There must be name formation dependency relationships among these pieces of configuration and hence association relationships among them. The input name for each interaction locus is formed from the results of two or more other interaction loci. If interaction loci that are configured to resolve one piece of the arbitrary DAP must be reconfigured to resolve another piece of the arbitrary DAP then the loci cannot themselves maintain their result values to form the input names of other pieces that might be configured many cycles in the future. The result values to form any particular input name will be generated at different times and possibly by the same interaction locus. These result values that form input names for future configurations must be maintained through arbitrary time periods in the generally configurable process separately from the interaction loci that generated them. Name formation dependency association relationships among interaction loci of the arbitrary DAP can no longer be expressed by direct connections among loci.

If there is a separate means of maintaining result values apart from the interaction loci that are configured to resolve input names it follows that there must be a means of associating these separately maintained values to the proper interaction locus to be resolved and a means of associating the result of the interaction locus to the means of value maintenance. This general configurability of association relationships is the essence of the generally configurable process.

Each interaction of the arbitrary DAP must be individually configured within the generally configurable process. Each interaction requires the association of a validly formed input name to an interaction locus and the association of the result to the means of independently maintaining that result within the generally configurable process. There must be a means of specifying which maintained values are presented as the input name to which interaction locus and of specifying how the result of the interaction is maintained. There must also be a means of determining when an input name is validly formed by maintained result values.

The essence of a DAP expression is the input name formation dependency relationships among result values and input name values and how these formed names are resolved. The same process can be expressed by any means that specifies the input name formation dependencies and resolves with the correct progression of input name formations and resolutions.

There are many means of expressing these relationships. A DAP expresses the relationships by direct association between result values and their dependent input name values of interaction loci. A pure value expression expresses the dependency relationships as value correspondences among unique result values and uniquely named value transform rules. A generally configurable process must be able to express any configuration of name formation dependency relationships among name resolution elements (interaction loci) and to resolve the configured process with the correct progression of input name formations and resolutions.

The expression of the arbitrary DAP must be a specification of the sequence of configurations for the generally configurable process. This specification cannot be an inherent part of the generally configurable process so it must be supplied externally to the generally configurable process.

Figure 30:
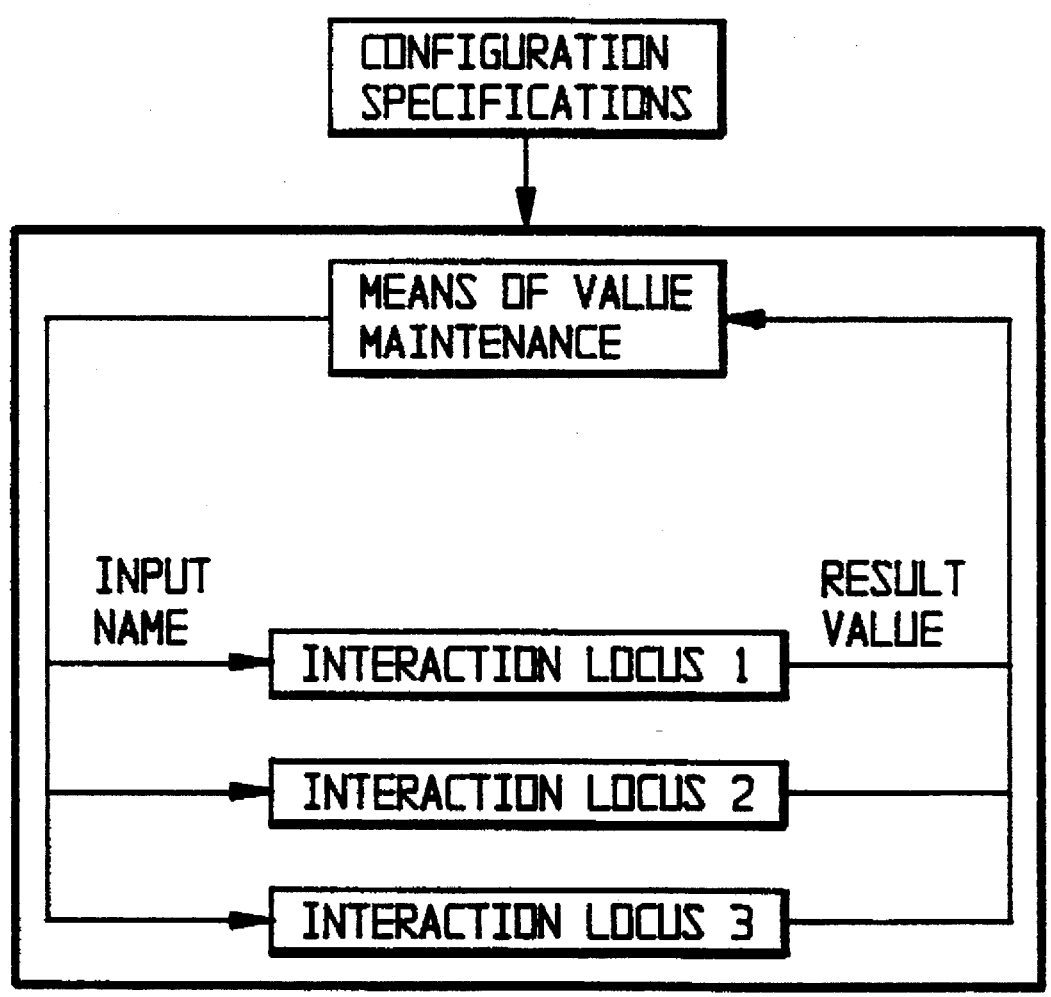
FIG. 30 illustrates the general form for a generally configurable process.

Referring to FIG. 30, a generally configurable process capable of expressing any arbitrary DAP must posses at least one of each type of interaction locus, a means of independently maintaining values and a means of configuring sequences of association relationships between the maintained values and the interaction loci in relation to externally presented specifications.

Several new conventions of expression are required to express the generally configurable process. There must be the means of independently maintaining values over indefinite periods. There must be the means of associating any maintained value with any interaction locus and the result with any value maintenance means. The entire expression must autonomously and continuously cycle through association configurations in relation to the configuration specifications. The first new convention to be defined will be a memory element which will provide the means to independently maintain values in the generally configurable process.

A. THE MEMORY ELEMENT

The first necessity is to establish islands of independent and stable value assertion within the larger expression. Process expression as discussed so far in the form of a DAP has no capability to stably assert a value independently of other expression elements. A DAP is continuously responding to its input and its asserted result cannot remain stable unless its presented input remains stable.

As long as an expression locality is completely dependent on external influences it cannot be independently assertive. The expression locality must be at least partially dependent on internal influences asserted by the locality itself. This can be achieved by associating a result variable to an input variable as shown in FIG. 31a forming a continuous association loop around a specific locality of expression which interacting with itself will form a local interaction domain that can sustain an asserted result independently of expressions external to that local domain of interaction that are providing the rest of the input name. The value transform rule set for the locality can be arranged such that sometimes external influence is effective and sometimes it is not. It will be remembered that the DAP was defined to be strictly directional and to not have any circular association relationships. The circular association relationship reintroduces a form of expression that was carefully eliminated by the interaction locus. But this time the circular association relationship is specifically structured through directionalized elements.

The value transform rule sets will be presented in the table format because many rule sets will have several input values and several result values. In FIG. 31b three variables A, B and 0 can assert three values X, Y and N (NULL).

In this example in FIG. 31b, there are two input variables and one result variable. The result variable is associated with the input variable B while the input variable A can be associated with any other variable in the larger expression. If A is NULL the result variable 0 stably maintains an asserted X or Y value. When A becomes nonNULL the 0 value is set to the value asserted by A. The value asserted by 0 propagates to B and 0's value assertion is locked by the interaction Iccp between B and 0. When A becomes NULL the last asserted value is independently maintained and stably asserted by this interaction loop. There is a time latency associated with the memory element. The value asserted by A must be maintained long enough for the result to propogate through the B variable. This may or may not be significant depending on the configuration of the larger expression.

The memory element expression convention provides an island of independent stable value assertion. As many memory elements as desired can be grouped together within a larger expression to provide for the stable maintenance of as many values as desired.

The responsibility of the group of memory elements is to independently maintain the assertion of result values until they are used to present formed input names to an interaction locus. Every result is destined to be part of an input name and it cannot be predetermined which memory elements are to be associated with which interaction locus for all possible arbitrary DAPs. So the asserted results of all memory elements must be associable with the input of each interaction locus. By the same token the asserted results of all interaction loci must be associable with the input of all the memory elements. There must be a general associability of the interaction loci's asserted results to memory element inputs and of the memory element's asserted values to the interaction loci's input.

B. THE SELECTOR ELEMENT

Selective configuration of association relationships between the memory elements and the interaction loci can be accommodated by two expression conventions. The first is a selector element which selects one of two input values to pass on as its result value. The second is a distributor element which determines which of several destinations a result value will go to.

As shown in FIG. 32a the input name of the selector element is formed by three variables. Two variables carry the candidate values to pass on and the third carries the value that determines which variable's value is passed on as the result value. The S variable carries the selecting value and the A and B variables carry the candidate input values to be asserted by the result variable O.

Referring to the transform table in FIG. 32b the input name to the selector element is VALID when S is nonNULL and the selected variable is nonNULL. The result variable O will assert the value asserted by the selected input variable. Otherwise the input name is not VALID and the result variable O will assert NULL. It does not matter what value the unselected variable is asserting.

Although the transform definition treats the input as a three value name to be resolved like any other DAP input name, the meta view of the input name in terms of the convention being established must view the name as composed of three separate parts. Two parts (A and B) are values that contribute directly to the result. The third part (S) does not contribute directly to the result value but specifies which value of the other two variables will form the result value. A and B are asserted from two different places in the expression. Since S is determining which value plays through as the result value it is specifying which place A or B in the expression is associated with the place of the result variable O. The value selecting A asserted on the variable S is the name of the place of assertion of the variable A in the expression. Similarly the value selecting B asserted by S is the name of the place of assertion of variable B in the expression. So the value asserted by S is the name of a place in the expression. The variable S specifies the association of one place A or another place B with the place of the result variable O in the context of the expression. S will be called a place name variable. A and B will be called data name variables.

Referring to FIG. 33, composite input names with multiple parts with different significances will be a common feature of conventions defined from now on. The input name of the selector element consists of a place name and two data names. As shown in FIG. 34, selector elements can be cascaded to accommodate arbitrarily large choice sets and they can be ganged to accommodate arbitrarily long data names.

In the cascaded tree of selector elements the place name that chooses among the many data names is itself a multiple value name. It is formed of the same values and is no different from the data names in any respect except for its role and its place in the expression. A place name can be manipulated, stored and transformed just like any data name.

Each input data name A, B, C and D comes from a different place in the expression and that place in the expression now has a name with which it can be referred to. Presenting a particular combination of values for the place name can mean "assert at place O the asserted result from the A place in the expression". This ability to refer to places in the expression by names expressed just like data names is a property that emerges through the convention of the selector and distributor element expressions and is the seed of the possibility of symbolic process expression.

C. THE DISTRIBUTOR ELEMENT

While the selector element expresses fan in association relationships that determine what place a result value will come from, the distributor element expresses fan out association relationships that determine what place a result value will go to. A single result value can be associated to many places in the expression through many distribute elements but only one of the distribute elements will be presented with a fully valid input name and pass its input value on as a VALID result value.

The input name of the distributor element is formed by two variables as shown in FIG. 35a. One variable is the data name and the other is the place name which determines whether the data name will be passed on as the result value.

As shown in FIG. 35b the result of the distributor elements is NULL if any input value is NULL. When a nonNULL value is presented on variable A and a nonNULL value is presented on the variable D the value of variable A will be asserted as the result value. The input cannot be fully valid unless the D variable is VALID. If the A variable is presented to several distribute elements but only one of the elements has a nonNULL D value then only that distributor element will pass the value asserted by the A variable on to whatever place in the expression the result variable O is directly associated with. The other distributor elements will assert NULL result values to the places their result variable is associated with.

Distributor elements can be grouped to accommodate arbitrarily large choice sets and they can be ganged to accommodate arbitrarily long data names as shown in FIG. 36.

The value of the A variable will be passed on only by the distributor elements that are presented with a VALID D variable value. Each place within the expression associated with the result of a distributor element has a name with which it can be referenced. The place name can mean "deliver the result from place A to the D3 place in the expression".

A selector element and a distributor element together can associate any two places in an expression and can move a data value from anywhere in an expression to anywhere else in an expression. The movement of the data value is controlled by the place names presented to the selector and distributor elements. The general associability of memory elements with interaction loci is now possible.

D. MEMORY-INTERACTION LOCUS ASSOCIATION

Figure 37:
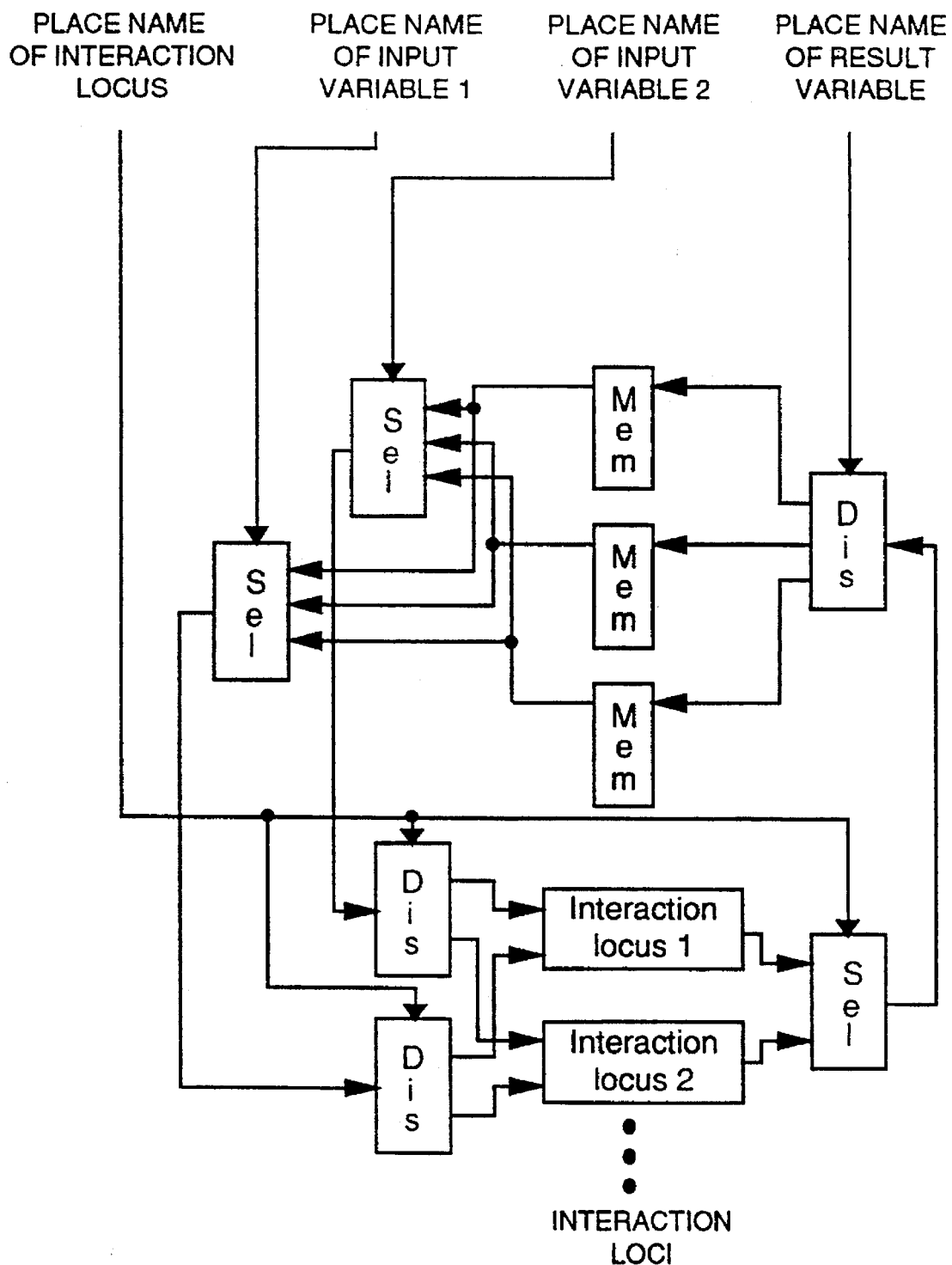
FIG. 37 illustrates the portion of a generally configurable process expression that configures association relationships for each interaction.

The memory elements and the interaction loci can be configured with selected association relationships through selector elements and distribute elements. The selector and distributor elements allow each memory element and each interaction locus to be accessed by name. Assuming that the input name of each interaction locus is two values long a set of four place names will completely specify which two memory elements supply the two values of the input name, which interaction locus resolves the input name and in which memory element the result value is stored. Each interaction of an arbitrary process can be specified by a different set of four place names. FIG. 37 shows the structure of an expression with configurable association relationships.

Assume for the time being that by some means the four place names are presented for a time. Then they become NULL for a time then four new place names are presented and this cycle just somehow continues. Assume also that the input name to be resolved is prestored in the memory.

The two input variable place names select two asserted values from two memory elements via two select elements. The selected values are presented to two distribute elements. The interaction locus place name directs the distribute elements to present the formed input name to one of the interaction loci. The interaction locus resolves the input name and asserts a result value. The asserted result value is selected by a select element also by means of the interaction locus place name. The result place name then directs the result through distribute elements to the input of a single memory element. This element stores the presented value and one interaction cycle is completed.

The expression begins with all values NULL except the values independently asserted by the memory elements. As soon as the place names of the input variables are nonNULL the input names to the two select elements become VALID because the memory elements are always asserting non-NULL values. As soon as the results of the select elements are nonNULL and the interaction locus place name is nonNULL then the input name to two of the distribute elements becomes VALID and their result values become VALID. This presents a VALID input name to one of the interaction loci which proceeds to resolve it. The result of the named interaction locus becomes nonNULL and the input name to the select element becomes VALID. The result of the select element becomes nonNULL and when the result variable place name is nonNULL the input to the distribute element becomes VALID. The result of one of the distribute elements becomes nonNULL and a nonNULL value is presented to the input of one memory element and the memory element stores the value.

The four place names become NULL and the NULL values propogate throughout the expression. Every asserted value in the expression becomes NULL except the values being independently asserted by the memory elements. The result value recently presented to one memory element becomes NULL and all of the input values to the memory elements are NULL. Then four new place names can be presented to the expression and a new cycle of valid names begin flowing through the expression to resolve the next interaction.

How this cycling place name presentation might be expressed is the next convention to be defined.

E. THE BOUNDARY ELEMENT

A single directly associated NULL convention expression can only resolve one input name at a time and that input name must be stably maintained on the input variables of the expression until it is fully resolved and the expression is asserting a VALID result value. This result value must be stably asserted until it has fulfilled its duties of forming other input names in the larger expression. When the result value need no longer be asserted by the expression itself the input name of the expression can become NULL which will propagate NULL values through the expression and eventually set the asserted result value to NULL. At this point a new input name can be presented to the expression for resolution.

The presentation of a sequence of input names to one expression by one or more other expressions must be sensitive to the NULL-VALID state of all involved expressions. This requires a new convention of expression residing between the expressions which can resolve questions concerning the state of the several sequentially interacting expressions and mediate the transfer of names between the expressions.

The essential interexpression event is the formation of a VALID input name. The essential concerns of a name resolving expression are when is a VALID input name presented and when is the resolution of a name completed. An expression can determine through its value transform rule set when an input name is valid but it cannot determine when a resolution is completed because that depends on when the expressions using its result value as part of their input name no longer need it to be asserted. A resolution is completed when the result value asserted by the expression has effectively contributed to all of its associated input names. There must be an agent associated with each name resolving expression that can answer these concerns for each expression and mediate the formation and resolution of input names among the name resolving expressions. Because the essential interexpression event is the formation of input names this agent is most conveniently viewed as a boundary element associated with the input of each name resolving expression. This boundary element will isolate and bound the expression and mediate all of its name commerce with other expressions. All expressions that exchange sequences of names with each other must interact through the services of a boundary element.

The boundary element must collect the input name, determine when it is VALID, store the input name and stably present it to the resolving expression, determine when resolution is complete, present a NULL input name to the resolving expression to reset the entire expression to NULL, recognize when the complete expression is reset and then collect a new input name. All of this can be achieved with a bit of memory, the ability to recognize completely NULL and completely nonNULL input names and a familiar two variable handshake protocol between boundary elements.

The memory is necessary to store the input name so that it can be stably presented to the resolving expression independently of the expressions that asserted the pieces of the input name. A presenting expression need only assert its result value until the input name is stored into the boundary element memory.

A completely VALID input name and a completely NULL input name are the two discrete boundaries of interexpression name transfer. A completely VALID input name means that an input name is formed and can be resolved. A completely NULL input name must occur before another input name can begin forming.

The two variable handshake protocol communicates between boundary elements these two interexpression states of input names. The unique aspect of the NULL convention boundary element is that the data name itself is one of the handshake variables with its logical states being completely NULL and completely nonNULL. The data name itself is the handshake communication from the presenter to the receiver. A single acknowledge variable communicates from the receiver to the presenter. The following conversation summarizes the exchange. The presenter is in bold text and the receiver is in plain text.

I am presenting a name to you. (valid result name presented to boundary element)

I have received your name (assert acknowledge when complete input name is VALID)

I understand you have the name (NULL result name presented to boundary element)

Thank you for the name (unassert acknowledge when complete input name is NULL)

Figure 38:
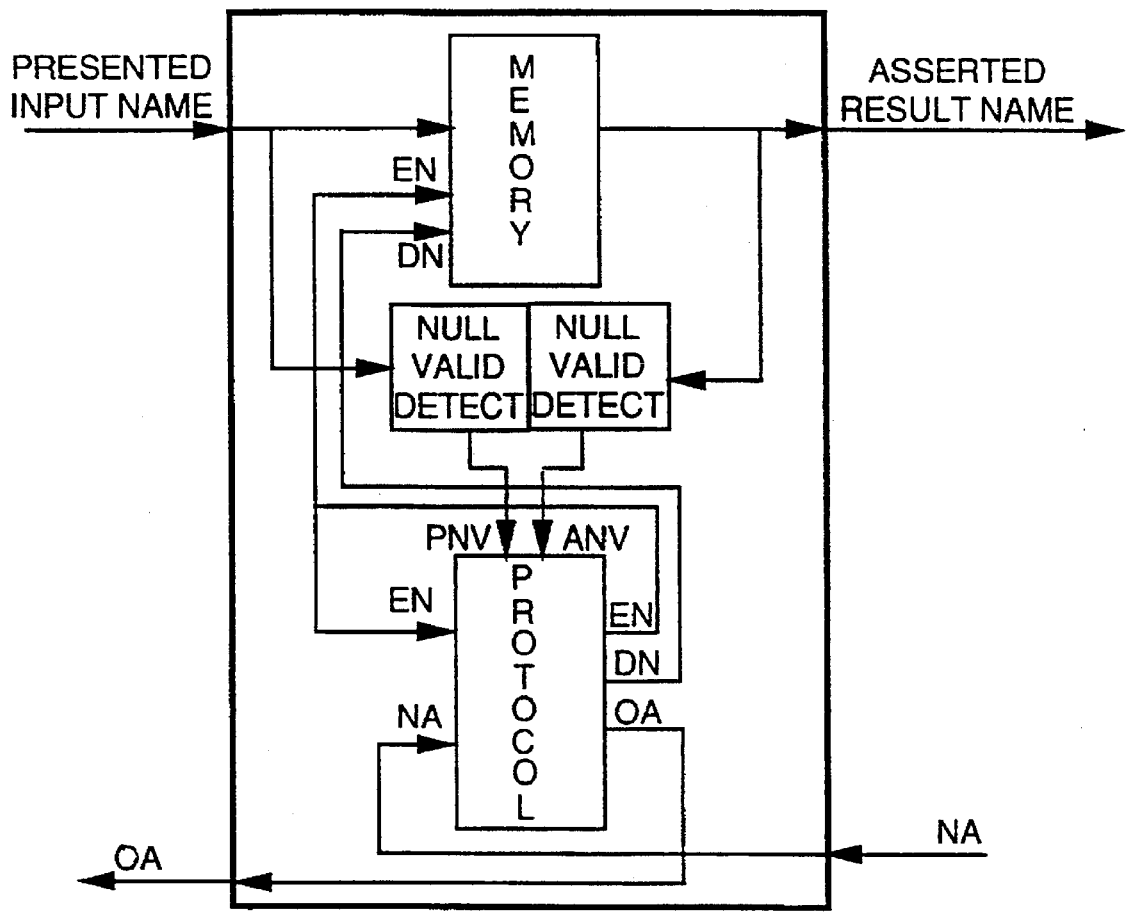
FIG. 38 shows the structure of the boundary element.

Referring to FIG. 38, a boundary element must consist of a memory element, a NULL-VALID detection element and a protocol resolution element. A boundary element operates via a cooperative interplay of these three expression elements.

1. The memory element

The memory element will accept and store any input name presented to it when the variable EN (Enable Name) is VALID (V) and stably assert the stored name. When EN is NULL (N) the externally presented input name is ignored by the memory. The last stored name is stably asserted until DN (Disable Name) is VALID which forces the asserted name to NULL. NULL is asserted until a new input name is accepted by EN becoming VALID. The name asserted by the memory element cycles between all NULL and all VALID.

2. The NULL-VALID Detection Element

The NULL-VALID detection element must establish the transitions between completely VALID names and completely NULL names for both presented input names and names asserted by the memory. When the entire presented input name is VALID the variable PNV (Presented Name VALID) will become VALID. When the presented input name is completely NULL PNV will become NULL. PNV must not change its value when the presented input name is part VALID and part NULL. When the asserted input name is VALID the variable ANV (Asserted Name VALID) will become VALID. When the asserted input name is completely NULL ANV will become NULL. ANV also must not change its value when the asserted input name is part VALID and part NULL.

This transition between completely NULL and completely VALID input names can be monitored with the expression element shown in FIG. 39a. The result variable is associated to the input to represent the current state of the determination.

Assuming an all NULL starting name the result variable O is NULL. As shown in FIG. 39b O will not change to VALID until both 11 and 12 are VALID. Once O is VALID it will not change back to NULL until both 11 and 12 are NULL. So the result variable O will indicate when the input name 1112 has changed from all NULL to all VALID or from all VALID to all NULL. These expression elements can be cascaded to accommodate any size input name as shown in FIG. 40.

IF the result variable O of the expression is NULL it will not switch to VALID until all 8 input variables are non-NULL. IF 1 input variable is NULL the result of its element will remain NULL and the next element in the network will remain NULL and so forth. The result O will not change from NULL to VALID until all asserted values in the network are nonNULL which means that all of the input variables must be asserting nonNULL values. Similarly the result variable O will not change from VALID to NULL until all asserted values in the network are NULL which means that all of the input values must be NULL. The NULL-VALID detect expression element insures that names presented to the boundary elements and asserted by the boundary elements are changing between completely VALID and completely NULL and can be used to assert the values for the variables PNV and ANV.

3. The Protocol Element

Referring to FIG. 41, the protocol expression element controls the memory and manages the handshake conversation between the boundary elements. This protocol conversation will be discussed in terms of the presenting, current and next boundary elements. The presenting boundary element is the previous boundary element presenting an input name to the current boundary element. The next boundary element is the succeeding boundary element that the current boundary element asserts its result name to. This discussion will ignore the fact that there is a name resolving expression between the boundary elements.

The protocol element's input variables are PNV, ANV, EN and NA. The input names that these variables form to the protocol element will be called state names. PNV, ANV and EN are asserted internally to the boundary element. NA (Next Acknowledge) is the acknowledge Variable from the next boundary element receiving the asserted result name of the current boundary element. The boundary element's result variables are EN, DN and OA. OA (Own Acknowledge) is the acknowledge variable from the current boundary element to the presenting boundary element that is asserting the presented input name to the current boundary element. OA of the current boundary element is NA for the presenting boundary element. The associated boundary elements with dependent result variables associated between each other constitute a sort of distributed state machine. Each boundary element is cycling through a distinct state name sequence that depends on the results of other boundary elements. The state name transform rule set for the protocol expression is presented in FIG. 42.

Figure 43:
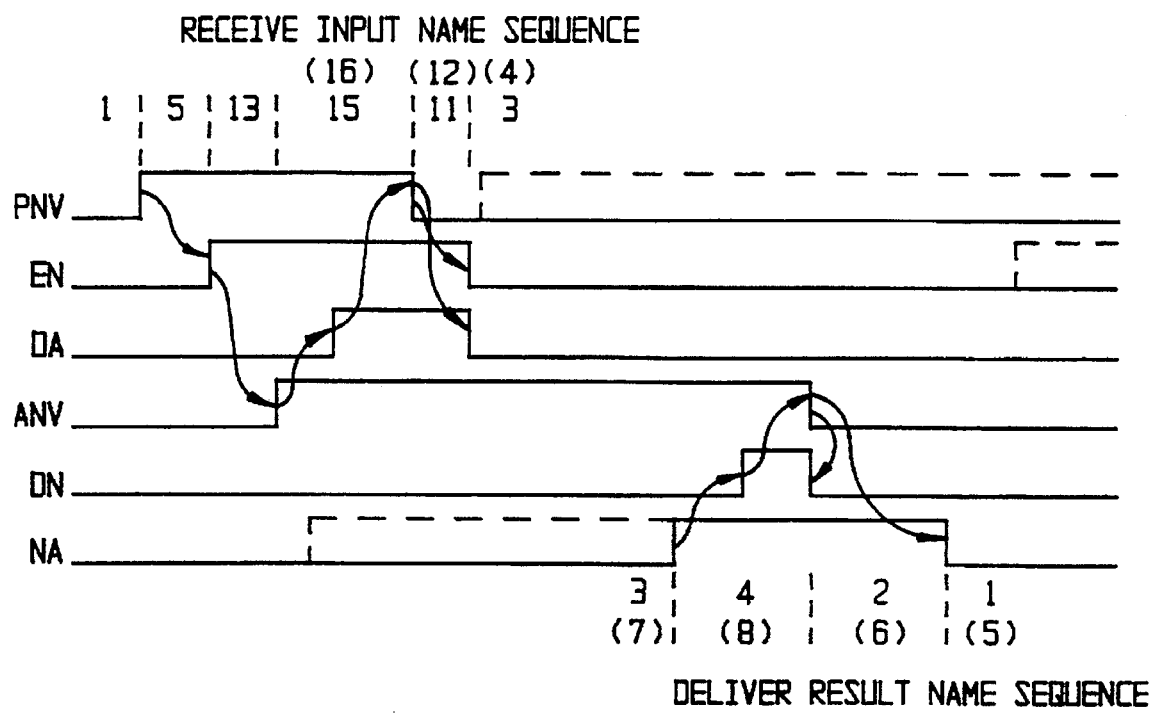
FIG. 43 shows the value change timing relationships among the variables of the boundary element.

These state name transformation rules establish a necessary sequence of state names for each boundary element which is illustrated in FIG. 43. Assuming that the entire expression begins with a NULL presented input name the boundary element is in state name I waiting to receive a VALID presented input name with a receive input name sequence. The first possible event is the presentation of a VALID input name to the boundary element which will cause PNV to become VALID. This will form state name 5 which will set EN VALID and cause the memory to store the presented input name and form state name 13. EN VALID and the memory storing the input name will eventually cause ANV to become VALID forming state name 15. The result of state name 15 will set OA VALID. This is the acknowledge to the boundary element presenting the input name to the current boundary element. OA VALID says to the presenting boundary element that the name has been received, that it no longer needs to be stably presented and that it can be set to NULL. Eventually the presenting element will set its asserted name to NULL and the presented input name of the current element will become completely NULL at which time PNV will become NULL and state name 11 will be formed. The result of state name 11 is to reset OA and EN to NULL forming state name 3 and the receive input name sequence is completed.

The protocol expression will remain in state name 3 until the acknowledge NA from the next boundary element becomes VALID and the deliver asserted name sequence is begun. The NA variable for the current boundary element is the CA variable asserted by the next boundary element. NA VALID means that the next boundary element has received the name and the current boundary element can unassert its result name by setting it to NULL. NA becoming VALID forms state name 4 which will set DN to VALID which will cause the memory to set its asserted name to NULL. The asserted name becoming NULL will cause ANV to become NULL which will form state name 2. When the NULL asserted name propagates to the next boundary element and its PNV variable becomes NULL it will set its CA variable to NULL which is NA for the current boundary element. When NA becomes NULL state name 1 will be formed. The deliver asserted name sequence is completed and the current boundary element is ready to receive another input name from the presenting boundary element.

There are two variables that are not directly or indirectly under the control of the current boundary element. The presented input name may become VALID at anytime after a receive input name sequence is completed and NA may become valid at anytime after the asserted name becomes VALID which is indicated by ANV becoming VALID. Both of these eventualities are accommodated by alternate state name sequences for both the receive input name sequence and the deliver asserted name sequence. During a receive input name sequence NA can become VALID anytime after the asserted name and ANV has become valid. The state name sequence 16, 12 and 4 incorporates the VALID NA and allows the receive input name sequence to complete without a deliver asserted name sequence starting. The last state name 4 begins a deliver asserted name sequence immediately after the receive input name sequence is completed.

Any time after a receive input name sequence is completed or during a deliver asserted name sequence the presented input name can become VALID and PNV will become VALID. A new presented input name cannot be received before the current asserted name has been delivered so the receive input name sequence must be suppressed until the deliver asserted name sequence is completed. The state name sequence 7, 8, 6 and 5 accommodates this by incorporating PNV VALID in the state names of the deliver asserted name sequence. With PNV VALID the deliver asserted name sequence will end in state name 5 which will immediately begin a receive input name sequence.

Figure 44:
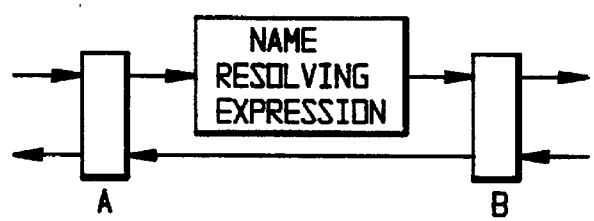
FIG. 44 illustrates how name resolving expressions are inserted between boundary elements to form larger expressions.

Referring to FIG. 44, a presented input name will be received and stored in the memory elements and stably asserted until the next boundary element can receive it. Then the current boundary element is freed up to receive another presented input name. Names flow through an expression as packets from boundary element to boundary element. Between the boundary elements there can be any name resolving expression. The names will flow through the name resolving expression and be transformed before reaching the next boundary element.

The name transmission path from boundary element A to boundary element B goes through a name resolving expression that will perform some transform on the name. A will complete a receive sequence and present a VALID asserted name. ANV will become VALID and the name will be asserted until the receive input name sequence is initiated by B. The asserted name will propagate through the name resolving expression. The initially NULL asserted result of the name resolving expression will at some time become all VALID and present a VALID input name to boundary element B. The presentation of a VALID name to the input initiates the receive input name sequence for B. When the receive input name sequence is initiated OA of B is set VALID which is NA for A and which initiates the deliver asserted name sequence for A. The asserted name of A is set to NULL and this NULL name propagates through the name resolving expression setting its result to NULL. The input name of B becomes NULL and PNV of B becomes NULL. This causes B to complete its receive input name sequence by setting OA to NULL which is NA for A and completes the deliver asserted name sequence for A. The name resolving expression has been reset to NULL so the boundary element can now receive another input name to assert to the name resolving expression for resolution. The boundary element protocol will properly resolve with any arbitrary delay in the data name transmission path.

A name resolving expression bounded by boundary elements will cycle through completely NULL states and completely VALID states so that the NULL convention criteria that allows determination of the completion of the resolution of a name resolving expression is satisfied.

4. Boundary Element Association Structures

Figure 45:
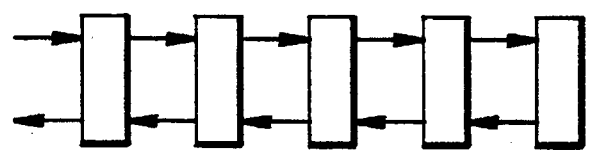
FIG. 45 illustrates how boundary elements can be pipelined.

Boundary elements can be associated in various structures. The simplest structure is a pipeline as shown in FIG. 45.

The pipeline is completely autonomous. A VALID input name presented to the first boundary element in the pipeline will begin a sequence of interactions that will propagate that name from element to element completely through the pipeline. As each element sees a valid input name it will receive it and assert it to the next element in the pipeline. Several names can be simultaneously propagating just like any other pipeline. The propagation rate of the pipeline is determined by the longest name transmission delay between two boundary elements.

Figure 46:
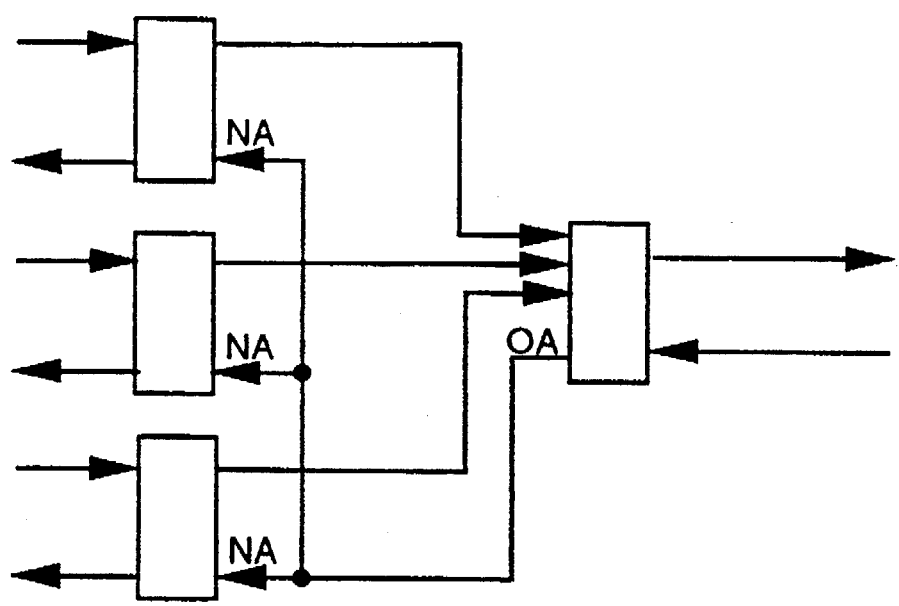
FIG. 46 shows a fan in configuration of boundary elements.

Boundary elements can be associated in a fan in configuration that builds an input name from several asserted names as shown in FIG. 46. The 3 boundary elements are combining their asserted names to form the input name for another boundary element. The receiving element will not recognize a VALID input name until all 3 asserted names are valid. It doesn't matter when these asserted names became valid each one will be stably asserted until it is acknowledged and its asserting boundary element goes through a deliver asserted name sequence. An acknowledge in the form of a VALID NA will not occur until the receiving boundary element sees a completely valid input name. When a completely VALID input name is presented the receiving element will initiate a receive input name sequence generating a VALID OA which is fanned out to be the NA for each asserting boundary element. Each asserting boundary element initiates a deliver asserted name sequence and resets its asserted name to NULL. When the NULL name has been received from each asserting boundary element and the complete input name is NULL the receiving boundary element will reset OA to NULL completing its receive input name sequence and completing the deliver asserted name sequence for each of the asserting boundary elements.

Figure 47:
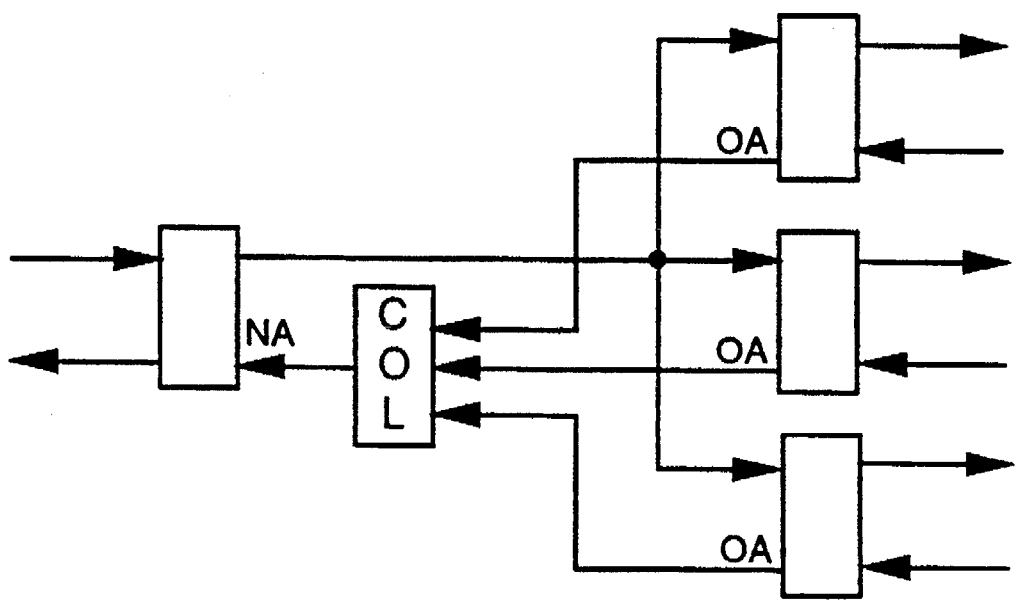
FIG. 47 shows a fan out configuration of boundary elements, FIG. 48 show the complete generally configurable process expression.

Referring to FIG. 47, a fan out association where 1 asserting boundary element delivers its asserted name to several other boundary elements requires an acknowledge collector to insure that all the receiving boundary elements have received the asserted name before resetting it to NULL.

The acknowledge collector is the same expression as the NULL- VALID detection element used in the boundary element. The input to the collector are the OA acknowledge variables from each receiving boundary element. When all of the OA variables are VALID indicating that all of the receiving boundary elements have seen a VALID input name the collector asserts a VALID result variable which is the NA variable for the asserting boundary element. The asserting boundary element can then set its asserted name to NULL. The result of the collector does not become NULL until all the OA variables from all the receiving boundary elements are NULL indicating that the receive input name sequence for all the receiving boundary elements has been completed. The deliver asserted name sequence for the asserting boundary element is then completed.

Complex association structures of boundary elements can be formed by interassociating these basic structures. Structures can be formed that will deadlock and livelock and otherwise misbehave but there is an inherent rationale for keeping the boundary element structures simple. If a boundary element association structure is complex in such a way that many expression elements must be tied up maintaining their result names until they have formed a VALID input name then that expression might as well be expressed as a single directly associated process.

Boundary elements are best used to partition an expression into discrete independently proceedable units that may be complex internally but that have fairly straightforward and simple interfaces between them. This allows many expression elements to be simultaneously resolving names increasing the throughput of the expression. So the appropriate place in the expression for a boundary element association is wherever there is a fairly simple name association relationship.

An expression of associated boundary element(s is like a chain reaction poised to be triggered. A valid input name will trigger the progression of events that is the expressed process. As the events proceed the expression resets itself to be triggered again. The expression is complete in itself. No external driving influence such as a clock is needed. There is nothing special or magic about the expression it is just a specific associational structure of expressional convention elements themselves structures of primitive expressional elements. Nothing new beyond variables, values, value transform rules and variable association rules has been postulated to achieve this autonomous behavior.

F. A GENERALLY CONFIGURABLE PROCESS

Figure 48:
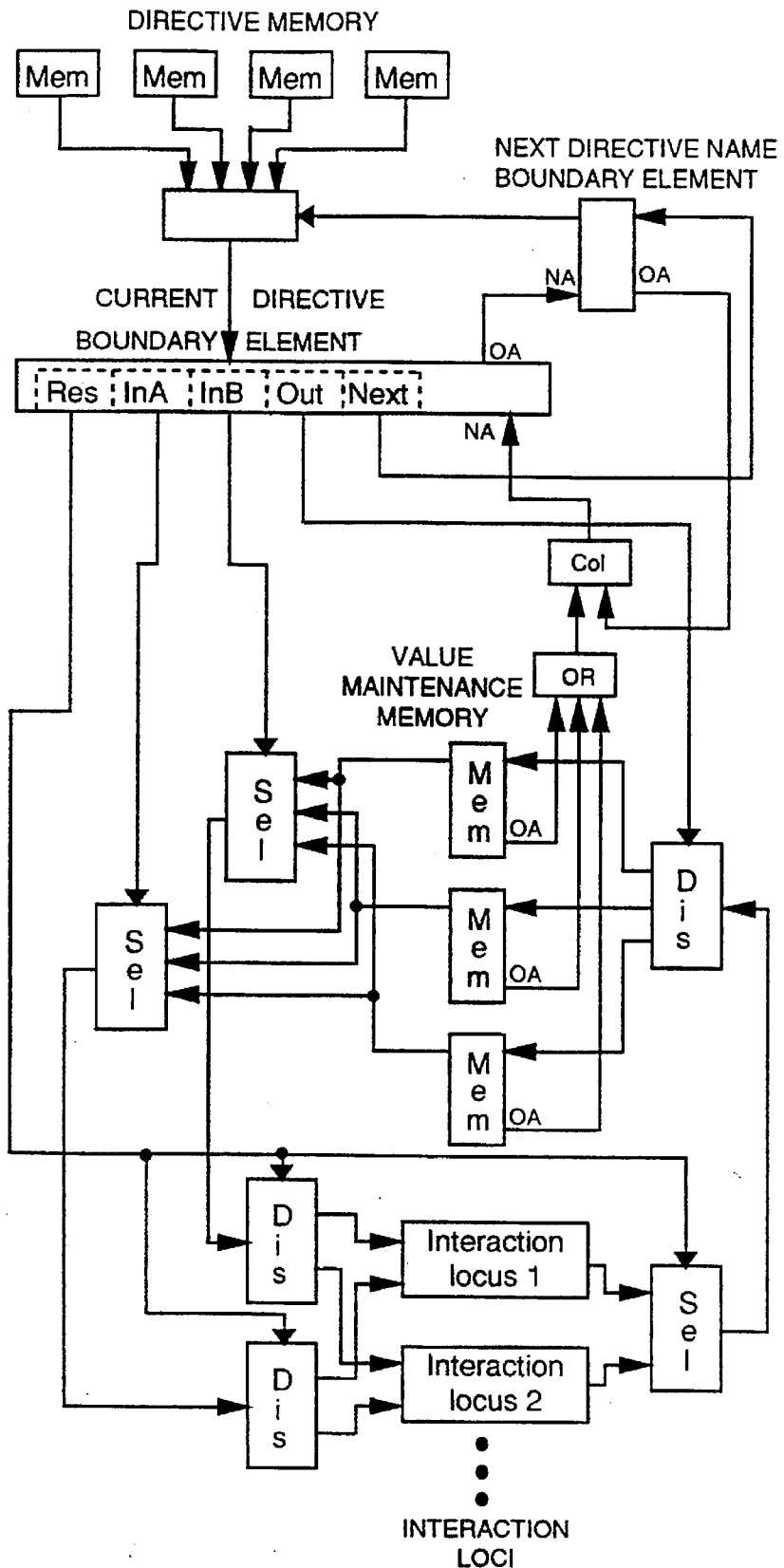

The boundary element convention completes the set of new conventions needed to express a generally configurable process. With the boundary element a sequence of directives, such as program instructions, each of which includes several place names can be properly presented to the memory-interaction locus expression. FIG. 48 shows a generally configurable process.

The generally configurable process expression is completed by adding to the memory-interaction locus expression two boundary elements and a memory to maintain the directives that specify the progression of association relationships. Each directive consists of the set of the four place names discussed earlier. At the top of the expression is a loop of two boundary elements that forms the control aspects of the expression. One boundary element maintains the name of the next directire and one boundary element maintains the current directive. The boundary elements are associated in a Iccp that will remain actively cycling through consecutive directives as long as there is a valid next directive name.

Since the issue of I/O is being ignored by this example it will be assumed that the directive memory is properly set and that that the input name to be resolved is already in the value maintenance memory. Activity is initiated when the next directive name boundary element asserts an invalid next directire name. This name resolves the select element to pass the asserted contents of one of the directive memory elements. This name becomes VALID to the current directive boundary element which receives the directive with a receive input name sequence which completes the deliver asserted name sequence of the next directive name boundary element. This frees up the next directive name boundary element to receive a new name. This new name is the next field of the directive just received by the current directive boundary element. The next directive name boundary element receives this name, presents it to the select element which resolves the next directive from the named directive memory element and asserts it to the input of the current directive boundary element.

Further activity is blocked until the current directive is resolved through the memory-interaction locus expression. The next directive boundary element and current directive boundary element are stuck in the middle of their respective deliver asserted name and receive input name protocol sequences.

The current directive boundary element stably presents the place names of the current directive to the memory-interaction locus expression until the directive is fully resolved. This full resolution is determined by the presentation of a valid result value to a value maintenance memory element. The value maintenance memory elements can now be defined to be partial boundary elements. Enough protocol is associated with each memory element so that it can perform a receive input name sequence. Since the memory elements do not do deliver asserted name sequences the receive input name sequences are not dependent on the completion of a deliver asserted name sequence. The result is that whenever a valid value is presented to a value maintenance memory element that name will be received and stored and a receive input name sequence will be initiated without delay. The value maintenance memory elements, then, are protocol sinks. They receive and resolve protocol transactions but do not originate any protocol transactions.

The assertion of OA VALID by any memory element through the OR element means that a VALID result name has been received and the resolution of the asserted directive by the memory-interaction locus expression is complete. In other words the directive has done its job and can be removed. But the directive cannot be removed until the next name has also been received. So the OA acknowledge from the name formation memory element is associated through a collector element with the OA acknowledge from the next directive name boundary element which means that the next directive name has been stored by next directive name boundary element. These two acknowledges means that the entire contents of the directive have been resolved and the directive can be unasserted and the next directive received by the current directive boundary element.

The current directive boundary element sets the current directive to NULL. This NULL name propagates through the memory-IL element and gets to the memory element which unasserts OA. Similarly the protocol sequence with the next directive name boundary element is completed and the result of the collector becomes NULL. The deliver asserted name sequence for the current directive boundary element is completed and the new directive that is already presented to its input can be received and presented to the memory-interaction locus expression. As each directive is presented and resolved the arbitrary DAP is resolved one interaction at a time and the result is left in the value maintenance memory.

Given a properly formed set of directives any desired structure of association relationships among the available interaction loci can be expressed. Once the expression is set up and the first directive name is inserted into the next directive name boundary element the expression will begin cycling through directives and resolve the expression quite autonomously.

G. THE DIRECTIVE EXPRESSION

To keep the discussion in somewhat familiar territory, the binary logic expression of the example DAP as previously discussed in relation to FIG. 26b and FIG. 27 will be used as the example for this discussion.

Figure 49:
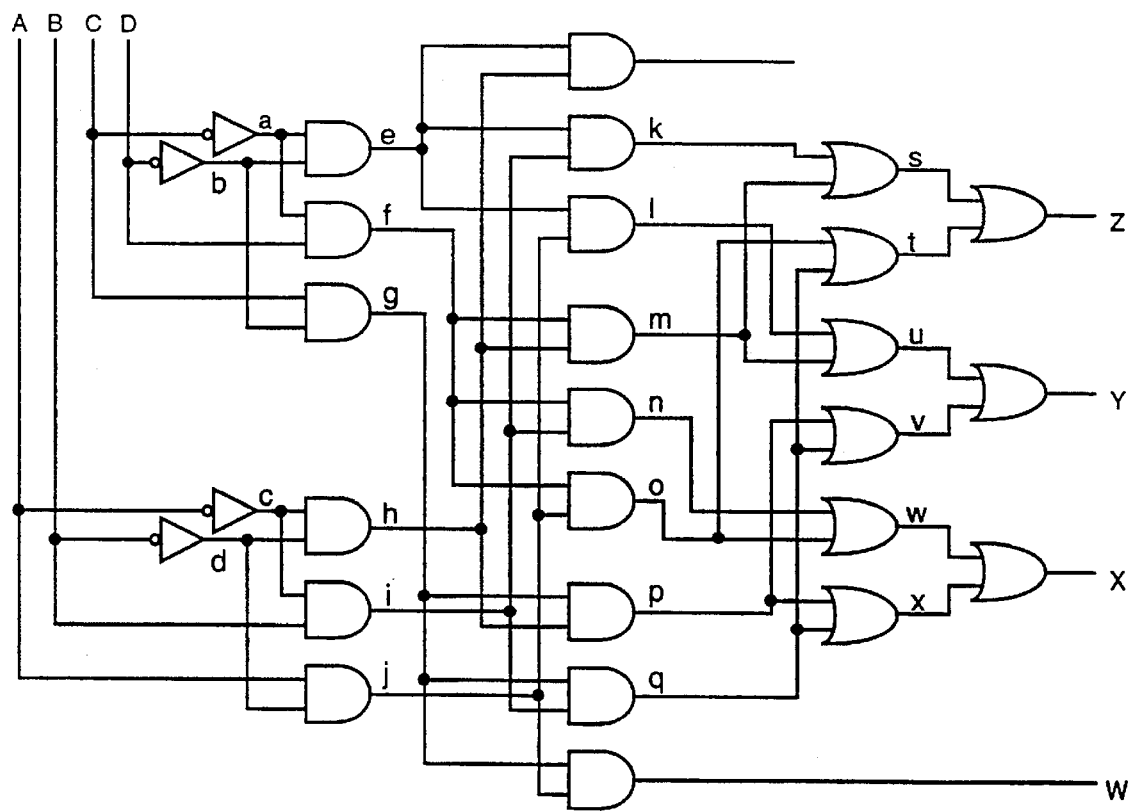
FIG. 49 is an example process expression to be mapped into the generally configurable process.

For this example the set of interaction loci are AND, OR and NOT. The data name to be resolved must be stored in the value maintenance memory so the first step is to assign the input variables and each result variable in the expression the place name of a memory element. It will be assumed for the example that the place names of the name formation memory elements are the letters of the alphabet. An arbitrary assignment of letter place names to results for the example is illustrated in FIG. 49.

This completely defines the memory assignments necessary to express the example DAP. There must be one directive for each interaction locus in the DAP.

The general format for a directive is as follows.

| locus name | input 1 name | input 2 name | result name | next directive name |
| --- | --- | --- | --- | --- |

The directive for the resolution of the input name in memory elements f and i by an AND gate with its result assigned to n would be;

AND f i n next

The results stored in f and i form the input data name for resolution by the AND gate and the result of the resolution is stored in n the name next signifies the place name in the directive memory element which contains the next directive.

Figure 50:
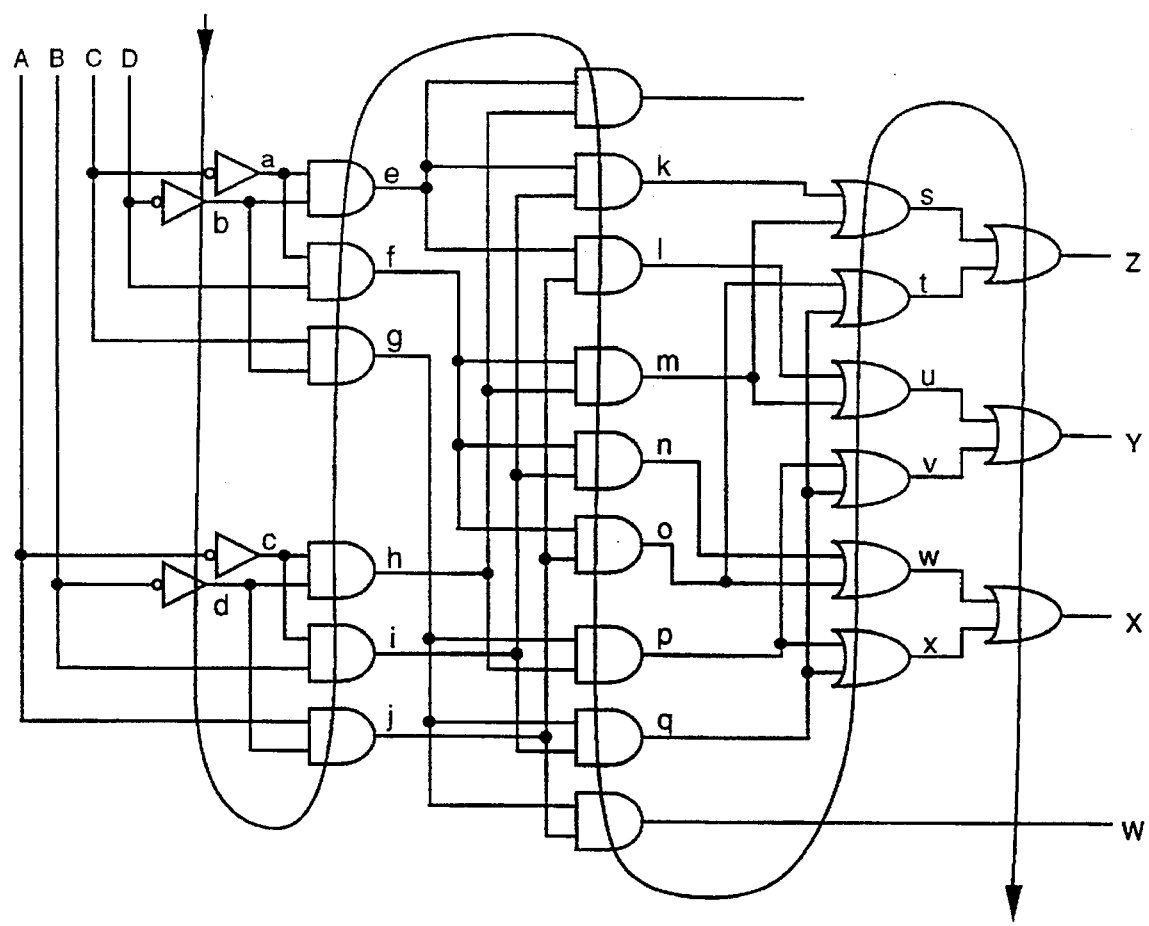
FIG. 50 shows the sequence thread of interactions for the generally configurable process to perform one at a time.

Since the generally configurable process can only resolve one directive at a time the next step in mapping a DAP into directives is to sequentialize the progression of data name formations and resolutions. There are many sequences that will suffice. The criteria as with any other form of expression is that each input data name is validly formed before it is resolved so any sequence that always generates the result components of an input data name before that input data name is resolved is adequate and correct. One such sequence is illustrated in FIG. 50 with a sequence thread passing through the example DAP.

There are lots of sequence threads that will not suffice. For instance the reverse of the example thread would be completely wrong. No input data name would be validly formed when its resolution was directed. The structural essence of any process expression whether it's expressed sequentially or concurrently is the name formation dependencies among the name resolutions. The following list is the complete sequence of directives to express the example DAP.

| directive memory element name | DAP name | name formation memory element name | name formation memory element name | name formation memory element name | directive memory element name |
| --- | --- | --- | --- | --- | --- |
| 1 | NOT | C | | a | 2 |
| 2 | NOT | D | | b | 3 |
| 3 | NOT | A | | c | 4 |
| 4 | NOT | B | | d | 5 |
| 5 | AND | A | d | j | 6 |
| 6 | AND | B | c | i | 7 |
| 7 | AND | c | d | h | 8 |
| 8 | AND | C | b | g | 9 |
| 9 | AND | D | a | f | 10 |
| 10 | AND | a | b | e | 11 |
| 11 | AND | e | i | k | 12 |
| 12 | AND | e | j | l | 13 |
| 13 | AND | f | h | m | 14 |
| 14 | AND | f | i | n | 15 |
| 15 | AND | f | j | o | 16 |
| 16 | AND | g | h | p | 17 |
| 17 | AND | g | i | q | 18 |
| 18 | AND | g | j | W | 19 |
| 19 | OR | q | p | x | 20 |
| 20 | OR | o | n | w | 21 |
| 21 | OR | q | p | v | 22 |
| 22 | OR | m | l | u | 23 |
| 23 | OR | q | o | t | 24 |
| 24 | OR | k | m | s | 25 |
| 25 | OR | s | t | Z | 26 |
| 26 | OR | u | v | Y | 27 |
| 27 | OR | w | x | X | NULL |

The sequence of directives along with the generally configurable process and the input data form a complete process expression. A completely different process can be expressed by presenting a different sequence of directives to the generally configurable process.

1. Enhancements

Now that the issues of local stable value expression and cyclic name presentation have been resolved the example generally configurable process can be straightforwardly enhanced to a generally configurable process equivalent to the modern computer.

Straightforward extensions to the example expression can bring it more in line with the current vision of a processing architecture. The memory and data paths can be widened to accommodate larger names and the interaction loci replaced with a set of larger directly associated processes such as arithmetic-logic operations to resolve the larger names. The name resolution elements are just pieces of preexpressed process that the arbitrary processes can use in their own expression. A resolution element can be as small as an interaction locus or as large as another cycling expression such as an array processor. All control is asynchronous and a resolution element can be bounded and configured to return its own handshake value to indicate completion.

A second alternative next directive name can be specified in the directive and the actual next directive chosen conditionally on a resolution result value. Another means to the same end is to define the directive memory place names to be consecutive numbers and arrange the directives such that the implicit next directive name is almost always one greater than the current directive name. An implicit next directive name can be maintained in a small specialized memory element that automatically increments its value each cycle. Only alternative conditional directive names need be explicitly specified in the directive itself.

The value maintenance memory can also be named with consecutive numbers and values can be referenced relative to indirect relationships or even to arithmetic formulas so that the configuration of association relationships between the value maintenance memory and the name resolution elements can be relative to previous configurations or even conditional on the values of input data name from the actuality expression of the arbitrary process. Small memory elements at various places in the expression can maintain and manipulate place names forming a register set with indexing capability. Directives can indirectly refer to actual place names in the memory by referring directly to these smaller memory places and arithmetic functions on their asserted values.

The directive memory and the data memory can be made the same memory. It should be evident to the knowledgeable reader that the only aspect of contemporary processing architectures that cannot be conveniently accommodated by the example is the imposition of a global system clock.

With the addition of conditionality relative to the input data name in both the determination of the next directive and the determination of the association relationships between value maintenance memory and the resolution elements the generally configurable process establishes a new realm of expressivity that was not attainable with just a DAP or with the nonconditional generally configurable process. This is the capability to resolve indefinite length names.

2. The Advantage of Progressive Iteration

Sequential iteration while not expressionally primitive still fills an important and essential place in the expression and resolution of processes. There are input names that cannot be resolved any other way except with conditional iteration.

The generally configurable process resolves an expressed arbitrary process by iterating through its expression a piece at a time. The actual expression of the arbitrary process is literally composed during resolution. Because the arbitrary process expression is effectively composed piece by piece during resolution its composition can be conditionally redirected during resolution based on values in the input data name. The expression of the process can within limits adjust to the form of its input data in a way that a DAP could not possibly provide. A DAP cannot grow larger or smaller but a generally configurable process can easily accommodate more or fewer iterations. A new dimension of expression of process is available with the conditional iterative resolution provided by the generally configurable process.

In particular the generally configurable processor can resolve names of indefinite length. If the size of the input data name cannot be predetermined its resolution must be inherently iterative. The name must be resolved in an unpredeterminable number of partial resolution stages. Its resolution requires conditional iteration.

H. TWO NEW FORMS OF EXPRESSION

Two dramatically different forms of process expression have emerged with the generally configurable process. The first form of expression is one step at a time sequential expression and resolution. This leads to the possibility of conditional iteration which is a necessary form of expression for certain classes of processes. The second form of expression is the expression of the association structures and interaction relationships of process as association relationships among names represented exactly the same way that input data is represented.

While both of these forms of expression are essential, neither is conceptually primitive. They are derived forms that emerge from a significant body of expressional conventions some of which had to appeal to circular variable association relationships. Association loops around interaction loci provided the memory and NULL-VALID detectors with local stability of value assertion. Association loops between boundary elements provided continuous autonomous cyclic activity. These two new forms of expression cannot be achieved without the circular association relationships introduced with the conventions of the generally configurable process. In other words they can only be derived in terms of directly associated generally concurrent process expressions.

1. Strict Sequentiality

Strict sequentiality is generally considered to be a process expression primitive. Far from being primitive it has emerged late in the game by virtue of a rather complex structure of concurrently resolving DAPs and expression conventions with circular association relationships.

Why did strict sequentiality suddenly emerge from expression forms that were generally concurrent? It arose primarily because any DAP of whatever size can resolve only one input name at a time. Internally a DAP is generally concurrent but at its input interface it must be strictly sequential. Each input name must be VALIDly presented and resolved then unpresented and a new input name VALIDly presented.

Strict sequentiality is also the easiest way to generally configure any arbitrary process by configuring the association relationships of one resolution step at a time. Each resolution step has all the resources of the generally configurable process devoted to it. Also a correctly sequenced expression eliminates the need for explicit VALIDation of input name formation. As soon as more than one resolution step is allowed to simultaneously proceed in the generally configurable process complicated issues of resource allocation and input name VALIDation must be considered.

Strict sequentiality is possible because certain forms of expression can be reduced to a progression of independently proceedable name resolutions. This reducibility stems primarily from the expressional convention of the interaction locus that imposed directionality of interaction influence on variable association expressions and the NULL value convention that imposed discrete resolution events. The only influence on an interaction locus is its input name, if the input name is stable the interaction is a discrete resolution event that can proceed quite independently at its own pace. This makes the interaction locus an independently resolvable unit of expression.

A directionalized process expression can be reduced to its independently resolvable units of expression and those units can be carried out one at a time sequentially. The sequential expression is an exact behavioral emulation of the directionalized expression. A directionalized process such as a DAP can be expressed and resolved with full concurrency as directly associated interaction loci or it can be expressed and resolved one interaction at a time using memory to maintain result values and form input names. The resolution events of one expression are directly mappable to resolution events of the other expression and both expression deliver the identical final result.

Expressions that are not strictly directional such as non-directionalized variable associations or direct circular association relationships similar to those of the boundary element cannot be similarly reduced to a sequence of independent resolution steps because there are no independent steps of resolution. If interactions are mutually influential in both directions then there are no clean boundaries of influence and therefore no conveniently separable and independently proceedable pieces of the expression. These expressions are not and cannot be algorithmic.

There are many forms of process expression with nondirectional mutually influential association relationships that cannot be directly reduced to independently proceedable resolution steps. These process expressions can be approximately simulated in terms of discrete time steps with differential equations but they cannot be mapped directly to independently proceedable resolution steps. They cannot be exactly emulated by a sequential step by step expression. The fact that a process expression can be approximately simulated algorithmically does not mean that the process expression itself is algorithmic.

Particles in atoms and atoms in molecules are primitive variable association expressions that are continuously and mutually influential. In a Hopfield neural net, every resolution element receives its input name from all the other resolution elements so that every resolution is dependent on every other resolution. These expressions rely on multiple simultaneous associative resolution. No piece of the expression can be resolved independently from the other pieces of the expression. It cannot be reduced to a sequence of partial resolutions that accumulate to a total resolution. These process expressions are not algorithmic and the notion of the algorithm cannot directly encompass their resolution behavior.

The claim commonly expressed in discussions of cognition or artificial intelligence that any parallel expression can be sequentialized and that therefore parallelism or concurrency can be conveniently ignored in attempts to understand the workings of human mentation is simply mistaken. While sequential resolution is essential to an important class of processes it is neither primitive nor is it universally sufficient as a form of process expression.

2. Name Relationship Expression

Perhaps the most dramatic new form of process expression that has emerged with the generally configurable process is the expression of process as deferred specifications in exactly the same way that the input names are deferred specifications for DAPs. Process can be expressed as a configuration of values in exactly the same way that the input data name is expressed as a configuration of values.

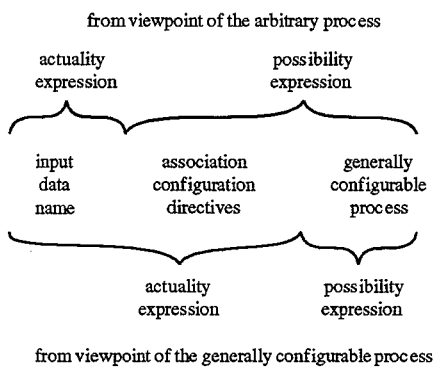

As shown in the above table, a generally configurable process is a process that manages to defer almost all specification. From the point of view of the generally configurable process its actuality expression provides almost all of the expression of the arbitrary process being expressed including its input data name. From the point of view of the arbitrary process the generally configurable process may express as little of the arbitrary process as a few interaction loci. The rest of the possibility expression of the arbitrary process can be expressed in terms of relationships among names of places in the generally configurable process. These place names are formed as combinations of values in exactly the same way that input data is formed.

The names presented directly to the generally configurable process must of course be in terms of the values and combinations of values that the select and distribute elements recognize. A name, however, is just an expression of correspondence whether it is a set of voltage values, a string of characters or a protein shape. Relationships among correspondence references can mirror relationships among the actual things they correspond to.

The place names in the generally configurable process can be assigned a more conveniently human readable form such as a string of alphanumeric characters. These names are of course not understandable by the generally configurable process but there is a one to one mapping between these names and the names that are understandable by the generally configurable process. The same relationships among internal names that are expressed by the directives can be expressed by syntactic relationships among these external alphanumeric names. An arbitrary process can be conveniently expressed externally by humans in terms of relationships among alphanumeric names and then directly mapped into the internal directives understandable by the generally configurable process.

The form of external expressions can be even further decoupled from the form of internal expressions. Since any memory element can be associated with any name resolution element there is no particular structure to the memory. Any internal memory name can be mapped to any external name as long as the mapping is one to one. Therefore external names can be chosen quite arbitrarily. They do not have to correspond in any way to the internal memory names. So external process expressions can express association relationships among arbitrarily chosen external names which can be mapped into relationships among arbitrarily assigned internal memory element names. There must still, however, be a direct relationship between the internal and external names of the resolution elements. This is similar to the traditional form of external expression known as assembly language.

With conditional next directive and with relative memory name reference it is possible to resolve the same group of directives representing a piece of expression multiple times each time with a different data association configuration. This means that a group of directives in memory representing a piece of expression can be treated exactly as the directly associated name resolution elements of the generally configurable process are treated. That is, the same piece of process expression in memory can be presented over and over with different configurations of association relationships to its input data name and its result place in memory. Just like the interaction loci of the example each resolution step can resolve a different name and put the result at a different place in memory. But these resolution steps are for arbitrarily defined pieces of process expressed as directives in memory.

This means that processes expressed as hierarchically nested pieces of process, expression can be mapped directly into a generally configurable process. A group of directives can be mapped anywhere in memory and the data to be associated with it can be mapped anywhere into memory and the correct association relationships among these pieces can be internally expressed by the generally configurable process.

The generally configurable process with generally associable memory, conditional directive sequencing and relative memory name generation is a universal process. Directly associated name resolving elements are not even necessary. The transform rule set for any interaction locus can be expressed in memory as a look up table accessed with relative memory name formation. A value transform rule is just another form of association relationship among names. Any directionalized process expressed in any external form of expression that specifies association relationships among names can be mapped to an internal expression and resolved in a generally configurable process.

The possibility of expressing processes solely in terms of relationships among names has emerged from the convention of the generally configurable process. Processes can be expressed as association relationships among names in forms radically different from the form of their direct resolution. The expression of relationships among names may be in the form of DNA, a character string, an audible utterance, a pattern of neurons or a mathematical formula.

I. SUMMARY

Several new expression conventions were introduced which combined to form the convention of the generally configurable process. The generally configurable process led to the possibility of expressing processes entirely in terms of relationships among names and sponsored the first appearance of strict sequentiality in process expression. This was all achieved with the introduction of expression conventions with closed association loops of directionalized expression elements which provided the local value assertion stability and cyclic behavior required for a generally configurable process.

No new primitives were postulated. It is all still just associated variables asserting values that are changing according to value transform rules.

Information processing units can be constructed to perform a variety of functions, and the NULL value convention information processing system discussed earlier is generally configurable, such that it can reconfigure value presentation relationships among several information processing units relative to directives.

With respect to the capabilities of information processing unit function it was first discussed that such units could perform particular data resolution functions. Memory information processing units can store data values by asserting a combination of values equal to a previously presented combination of values. The selector information processing unit can select data values by asserting a combination of values which are a subset of a first combination of values relative to a second combination of presented values. Finally, the distributor information processing unit can distribute data by asserting a combination of values equal to a first combination of presented values as a subset of its combination of asserted values relative to a second combination of presented values.

The information processing system also comprises bounding information processing units to asynchronously coordinate value presentation between information processing units. The bounding elements comprise one or more NULL-VALiD detectors between information processing units for determining an information processing unit's (1) completion of a data resolution and (2) readiness to perform another data resolution. The bounding element also comprises an information processing unit for storing presented value combinations and an information processing unit for communicating with other bounding means. The NULL-VALID detector is an information processing unit which asserts a NULL value when its combination of presented values is all NULL, and continues asserting a NULL value until its combination of presented values becomes VALID. It then asserts a data value and continues asserting a data value until its combination of presented values becomes all NULL.

The communication unit comprises an information processing unit for informing all existing preceding bounding elements that a first NULL-VALID; detector has detected a valid combination of presented values, the valid combination of presented values has been stored in the storing unit, and that all existing preceding bounding elements can now assert an all NULL combination of values. The communication unit further has means for informing all existing preceding bounding elements that the first NULL-VALID detector has detected an all NULL combination of presented values and all existing preceding bounding melementseans can now assert a valid combination of values. The communication unit further has an information processing unit for detecting that all existing succeeding bounding elements have detected and stored a valid combination of values resulting from the valid combination of values stored in the storing units and asserted by the bounding elements, whereupon an all NULL combination of values can be asserted by the bounding elements. The communication unit further has an information processing unit for detecting that all existing succeeding bounding elements have detected the all NULL combination of values asserted by the bounding elements, whereupon a valid combination of values can be asserted by the bounding elements.

The generally configurable system for manipulating and resolving data comprises at least one information processing unit for resolving combinations of values, at least one information processing unit for storing combinations of values, at least one information processing unit for configuring value presentation relationships relative to a second combination of values and bounding means for asynchronously coordinating value presentation.

The configuring information processing units, for example selectors and distributors, configure value presentation relationships among the resolving information processing units and the storing information processing units relative to a combination of directive values which are asserted by a first bounding means and presented as the second combination of values of the configuring information processing units. A resolution configuration involves the presentation of a valid combination of directive values to the configuring information processing unit resulting in the presentation of a valid combination of values to the storing information processing unit. A non-resolution configuration involves the presentation of an all NULL combination of directive values to the configuring information processing unit resulting in the presentation of an all NULL combination of values to the storing information processing unit. Data resolution is accomplished by a progression of alternating resolution configurations and non-resolution configurations relative to a progression of combinations of directive values.

The information processing system further comprises a second storing information processing unit which asserts a plurality of combinations of directive values to a configuring information processing unit such that any combination of directive values asserted by the second storing information processing unit can be conditionally selected for presentation to the first bounding means relative to a second combination of values presented to the configuring information processing unit by at least one second bounding means. Preferably the second bounding means is presented a combination of values asserted by a configuring information processing unit relative to a combination of values asserted by at least one function information processing unit.

V. COMPLETION INTEGRITY OF THE NULL VALUE WAVEFRONT

The configuration previously presented for expressions that are used iteratively to resolve multiple successive input names includes the expression itself and at least one boundary element receiving the results of the expression as shown in FIG. 51.

The role of the boundary element is to determine when the resolution of a combination of input DATA values (an input name) being performed by the expression is complete and also when the expression is completely reset to NULL and ready to accept another input combination of DATA values to resolve. The boundary element accomplishes this by monitoring the result values of the expression with a NULL-VALID detector expression. When some or all of the result values of a resolving expression change from all NULL values to DATA values the asserted result of the expression is VALID and the resolution of the presented input DATA values is complete. It has been assumed that when the result values change from all DATA to all NULL then the expression is reset and ready to accept another combination of input DATA values to resolve but this is not necessarily always the case.

For an expression that is reused iteratively to resolve successive input names the resolution iterations must be discretely bounded. The DATA values from one resolution must not get mixed up with the DATA values from a previous resolution. This is accomplished by alternately presenting DATA values and NULL values to the expression. These alternate presentations create alternating wavefronts of DATA values and NULL values through the expression.

These alternating wavefronts through the expression result in successive cycles of the expression asserting all NULL values and asserting all DATA values. There must not be any residual DATA values lingering in the expression from a previous resolution when a new combination of DATA values is presented for resolution. It is the responsibility of the NULL wavefront to completely isolate successive DATA wavefronts. The entire expression must be reliably asserting NULL values at the time of presentation of a new combination of input DATA values.

The expressions discussed so far can guarantee the completion integrity of a wavefront of DATA values propagating through a NULL valued expression. It has been implicitly assumed so far that NULL values presented to the input of the expression propagate through the DATA values of the expression just like the DATA values propagated through the NULL values and that when all the result values are NULL then the entire expression is NULL. But this is not always true as can be seen in the example in FIG. 52a and FIG. 52b.

The fundamental problem is a failure of a completeness of input criteria to each interaction locus when NULL values are presented. The value transform set associated with each interaction locus guarantees that if the input and result values are all NULL then the result value will not become DATA until all the presented input values are DATA. This insures that when the result values for the interaction locus become DATA that the presented input values of the interaction locus are DATA. As can be seen in the transform table of FIG. 52b the interaction locus does not, however, guarantee that if the input values and the result value are all DATA that the result value will not become NULL until all of the input values are NULL. So the interaction locus does not enforce a completeness of NULL input before asserting a NULL result value.

FIG. 53 illustrates the difficulty for an expression composed of multiple interaction loci. Assume that all input values are DATA and the result values are DATA. If only one input variable changes to NULL and the others remain DATA both result variables will switch to NULL. If input variable D goes NULL the result variables of interaction locus 2 are set to NULL. They present NULL input values to interaction loci 3 and 4 and the values of result variables S and T of 3 and 4 are set to NULL. The result values indicate that the NULL wavefront propagation is completed but the entire expression has not been set to NULL. The input variables A, B and C are still presenting DATA values to the expression and the interaction locus 1 is still asserting a DATA value when the result values all become NULL.

The NULL wavefront racing ahead of the DATA values can occur even if all the input variables are set to NULL. Assume that the variable connecting loci 1 and 3 is very slow at propagating its value. The NULL value from locus 2 will determine the result value of result variable S. The result values will indicate that the NULL value wavefront is completely propagated and that new DATA values can be presented to the expression but there is still a DATA. value from the old data wavefront lingering in the expression on the 1-3 variable. This lingering DATA value cannot cause further switching of the result values associated with the NULL value wavefront but if it lingers long enough it could get confused with the values of the next DATA value wavefront.

When asserting a DATA result value an interaction locus must establish the completeness of NULL value input before asserting a NULL result value. Similarly, when asserting a NULL result value an interaction locus must establish the completeness of DATA value input before asserting a DATA result value. The completion integrity of the NULL value wavefront through DATA values of an expression must be established in the same sense that the completion integrity of the DATA value wavefront through NULL values of an expression is established. This extra complexity requires extra specification. The extra specification can be in terms of more variables or in terms of more values. Both approaches involve different value transform sets for the interaction loci.

A. THE EXTRA VARIABLE SOLUTION

The extra quantity of specification necessary to establish the integrity of the NULL value wavefront can be accommodated by keeping the same quantity of value differentiation but adding more variables to increase variable differentiation and association. The extra variable in this case provides feedback association of the result value to the input of an interaction locus as shown in FIG. 54a.

The extra variable solution makes every interaction locus a state machine that can take account of its own result value in its behavior. The extra variable feeds the result value back to the input of the interaction locus. What was an interaction locus with 2 input variables now becomes an interaction locus with 3 input variables. The value transform rule set has to accommodate this increase in domain. In the case of 3 value representation with 2 DATA values and 1 NULL value the set of transform rules shown in FIG. 54b provides a generic rule set that will accommodate any 2 DATA value transform function.

The transform rules establish that if the result value is NULL it will not change value until both input values are DATA. If the result value is a DATA value it will not change value until both input values are NULL. The DATA transform function is defined within the bold cells of the above diagram. Any desired mapping can be specified in these cells.

There is still a time issue with this configuration because once the result value is asserted the result value must propagate to the input to establish the stable state of the interaction locus. The result value is propagating through other interaction loci of the expression before the interaction locus itself is stabilized. If this back propagation time is comparable to the time between wavefronts then the next wavefront could arrive before the interaction locus has stabilized in relation to the previous wavefront. To avoid this eventuality the back propagation time must be much shorter than the time between wavefronts.

1. 2 Value Expressions with Feedback

For 2 value representation using 1 DATA value and 1 NULL value the solution is simple and direct. An interaction locus for single DATA value expressions can only discriminate how many data values are present so it is a discrete threshold. All that is necessary to create the proper state machine with 2 value locus is to feed the result value back one less times than the threshold of the locus. FIG. 55 shows a state machine locus with a threshold of 3.

Beginning in the NULL state the locus will not assert a DATA value until there are 3 DATA values on its input variables. The result value is set to DATA and provides 2 more DATA values at the input of the locus. The result value will not become NULL until the number Of asserted DATA values at its input falls below 3. With the 2 feedback DATA values the number of presented DATA values will not fall below 3 until the last actual input variable becomes NULL. In an initial NULL state the interaction locus does not assert a DATA result until 3 actual input variables present DATA values. Once the result variable asserts a DATA value it will not assert a NULL value until all of the actual input variables are asserting NULL values.

The state machine approach of feeding back the result value to an input variable provides the NULL-VALID detector of the boundary element with the expression behavior it expects. When all of the result variables having been NULL become DATA then a resolution is completed. When all of the result variables having been DATA become NULL then the expression is completely reset and ready to receive another input name to resolve.

2. Breakdown of completeness of input criteria with 1 DATA value

With the single DATA value expression the completion criteria for presented input and asserted results breaks down. For a threshold interaction locus there need be only enough DATA values presented at the input to equal the threshold for the input to be VALID. Some of the presented input values may remain NULL and the combination of presented input values will still be VALID. Similarly the asserted result values of an expression may not be all DATA when the asserted result is actually VALID.

Because of this inherent inability to enforce completeness of presented input or of asserted results the integrity of the DATA wavefront cannot be enforced. If the VALID detector itself is a threshold function then when the detector declares the results to be VALID there might still be unpropagated DATA values lingering in the expression. This can affect the NULL value wavefront also. If a locus is very slow to assert its DATA value and is still asserting NULL when the NULL wavefront passes then the result values will become NULL but the DATA value from the previous resolution will still be lingering in the expression. So the completion integrity of the NULL wavefront cannot be enforced either.

The difficulty has to do with the nature of the exclusively single DATA value expression and its limitation to threshold functions. If a single DATA value expression pretends to be a multiple DATA value expression with some conventions of DATA presentation and representation the enforcement of completion integrity can be regained.

Figures 56, 57:
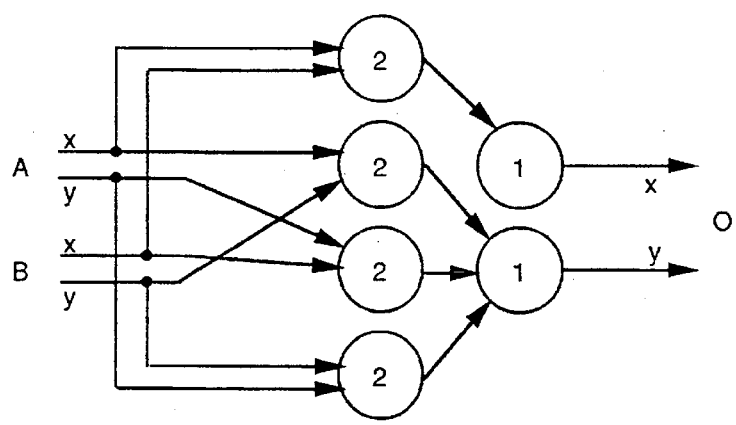
FIG. 56 illustrates an expression with encoded values and hysteresis interaction loci.
FIG. 57 shows how a NULL-VALID detector can be specified with INTERMEDIATE values.

Referring to FIG. 56 composite variables with 2 encoded DATA values and 1 encoded NULL value are expressed in terms of 2 real variables each of which can assert 1 DATA value and 1 NULL value. Composite variable A can assert values x,y and NULL. The composite variable is composed of two real 1 DATA value 1 NULL value variables. One variable represents x and the other represents y. The convention is followed that only one of the real variables can assert a DATA value at a time. If the x variable asserts a DATA value and the y variable asserts a NULL value then the asserted value for the composite variable is x. If the y variable asserts a DATA value and the x variable asserts a NULL value then the asserted value for the composite variables is y.

If only 1 variable of composite variable A asserts a DATA value and only one real variable of composite variable B asserts a DATA value then only one of the threshold 2 interaction loci will be presented with 2 DATA values and hence assert a DATA value itself. Only one DATA value assertion from the threshold 2 loci will be presented to the threshold 1 loci and only one of the threshold 1 loci will itself assert a DATA value. Thus only one real result variable will assert a DATA value for the composite result variable O. If the convention of asserting a DATA value for only one real variable associated with a composite variable at a time is followed then the expression will maintain the convention on its result variables.

Completeness of input presentation can be established because exactly one real variable from each composite variable must assert a DATA value for the presented input to be VALID. The completion of the resolution can be established because exactly one real variable of the composite result variable must assert a DATA value.

Composite variables with more values can be represented by simply grouping more real variables together in a mutually exclusive DATA value assertion convention. A composite variable asserting 3 encoded values would simply consist of 3 real variable asserting 1 DATA value and 1 NULL value. The dual rail encoding associated with Muller speed independent circuits is one example of 2 encoded DATA values in terms of 2 variables with 1 real value and 1 NULL value. The following table shows the correspondence between dual rail encoding and 2 DATA values encoded with 2 variables each asserting 1 DATA value and 1 NULL value.

|  x  y | |
|---|---|
| x -> DATA NULL | true -> 0 1 |
| y -> NULL DATA | false -> 1 0 |
| NULL -> NULL NULL | spacer -> 0 0 |

B. THE EXTRA VALUE SOLUTION

The extra quantity of specification necessary to establish the integrity of the NULL value wavefront can also be accommodated by keeping the same quantity of and association relationships among variables but adding more values to achieve added differentiation. In this case an extra value is added to represent intermediate states between DATA and NULL.

The intermediate value provides a solution with no time dependencies whatever but the NULL-VALID detect expression must be modified to accommodate the added value. The extra value represents intermediate states between all DATA and all NULL. Starting with a 3 value representation with 2 DATA values and one NULL value an extra value designated 1 (INTERMEDIATE) is added to make a total of 4 values. An interaction locus still has 2 input variables and 1 result variable but the value transform rules must be modified to accommodate the extra value in such a way that a NULL result value is asserted only when all input values are NULL and a data result value is asserted only when all input values are DATA. For all cases where a mix of NULL and DATA values are presented to the input variables the result variable must assert an INTERMEDIATE value. The following set of value transform rules establishes the indicated interaction locus behavior.

|  | X | Y | I | N |
|---|---|---|---|---|
| X | X | X | I | I |
| Y | X | Y | I | I |
| I | I | I | I | I |
| N | I | I | I | N |

Any desired DATA transform can be specified by the values in the bold portion of the transform table. It can be seen directly that a DATA result value is asserted only if both input values are DATA and that a NULL result value is asserted only if both input values are NULL. For all other cases an INTERMEDIATE result value is asserted. The criterion for input completion is enforced for both DATA and NULL input for each interaction locus.

It now becomes the responsibility of the NULL-VALID detect expression of the boundary element to accommodate the new INTERMEDIATE result value in its value transform rule set.

The values of the result variables begin all NULL and some may become INTERMEDIATE before all become DATA. Similarly beginning as all DATA some result variables may become INTERMEDIATE before all become NULL. The NULL-VALID detect expression must still determine when all result values are NULL and when all result values are DATA but it must also accommodate the combinations of result values with INTERMEDIATE values.

To accommodate the INTERMEDIATE value from the interaction loci of the expression asserting the result values the first rank of interaction loci of the NULL-VALID detect tree shown in FIG. 40 must include the INTERMEDIATE value (1) in its input value set. The set of value transform rules shown in FIG. 57 will accommodate result values directly from the resolving expression.

Once the first rank of interaction loci have accommodated the INTERMEDIATE values then the interaction loci in later ranks need not accommodate INTERMEDIATE values. Since the first rank interaction loci do not assert INTERMEDIATE result values the interaction loci in succeeding ranks can be the NULL-VALID interaction loci previously presented.

1. 3 value expressions with INTERMEDIATE value

In a 3 value expression with INTERMEDIATE values there is 1 DATA value, 1 INTERMEDIATE value and 1 NULL value. Like the 1 DATA value interaction loci previously presented the interaction loci can recognize only quantities of DATA values and are strictly discrete threshold functions. The transform criteria is still the same. An interaction locus should assert a DATA result value only when complete DATA input is present which in this case means enough presented DATA values to match or exceed the threshold and should only assert a NULL result value when all of the presented input values are NULL. For all other cases it should assert the INTERMEDIATE value. The value transform rule set shown in FIG. 58 implements a threshold 3 interaction locus with 3 input variables. Y is DATA, 1 is INTERMEDIATE and N is NULL. The value transform rule set shown in FIG. 59 implements a threshold 2 interaction locus with 3 input variables.

The result variables of an expression composed of such interaction loci can be handled exactly as in the previous example. The first rank of NULL-VALID interaction loci in the NULL-VALID detector expression must accommodate the INTERMEDIATE value from the resolving expression in exactly the same way as before.

2. 3 value INTERMEDIATE value expressions encoded with 2 real values

A composite variable asserting 3 encoded values; DATA, INTERMEDIATE and NULL can be represented in terms of 2 real values and 2 real variables similarly to the way that Muller dual rail logic encodes 3 values (2 DATA values and a spacer (NULL) value on 2 real variables with 2 real values. The specific encoding and the logical consequences of the encoding are, however, quite different from dual rail logic. Each encoded value is expressed in terms of 2 real variables and 2 real values with the following encoding.
00—>NULL

01—>INTERMEDIATE
10—>INTERMEDIATE
11—>DATA

Figures 58, 59, 60:
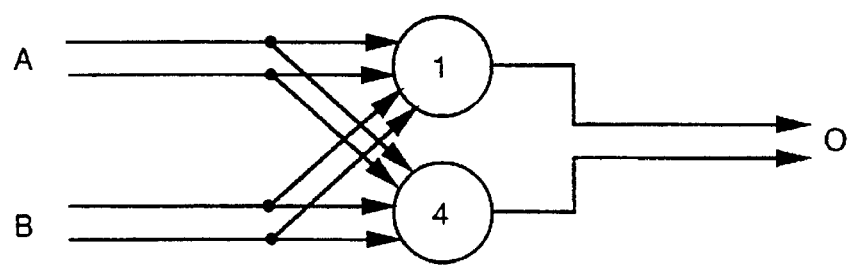
FIG. 58 shows a threshold 3 INTERMEDIATE value interaction locus with 3 input variables.
FIG. 59 shows a threshold 2 INTERMEDIATE value interaction locus with 3 input variables.
FIG. 60 illustrates an intermediate expression with 2 composite input variables.

Referring to FIG. 60 a composite threshold 2 function can be expressed in the following manner with a real threshold 1 interaction locus and a real threshold 4 interaction locus. As long as the presented real input values are all 0 (NULL) the real result variables will assert 0,0 which is a NULL encoded result value. As encoded DATA values are presented to the composite input variables the real input variables become 1. As soon a one real input variable becomes 1 the top interaction locus asserts a 1 real result value. The bottom interaction locus does not assert a 1 real result value until all of the real input values are 1. So while the encoded input values are changing from NULL to DATA the real input values change from 0 to 1 the composite result variable asserts an intermediate encoded value until both composite variables present a valid encoded DATA input at which time the real result values become 1,1 asserting an encoded result DATA value on the composite result variable.

Figure 61:
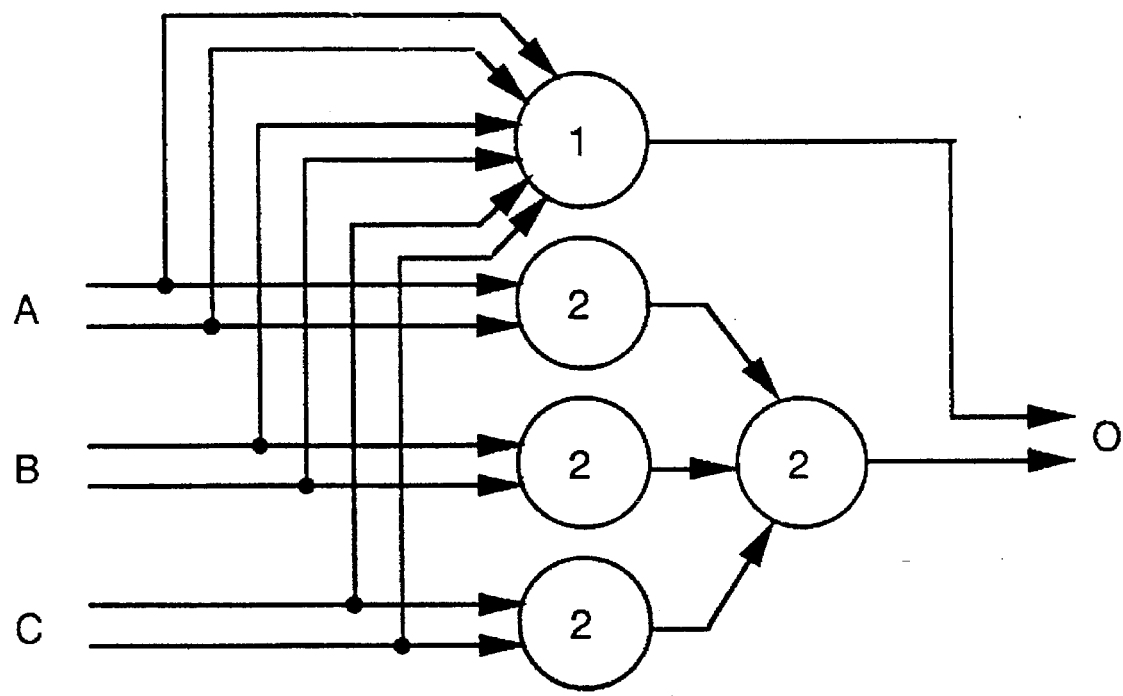
FIG. 61 illustrates a threshold 2 expression with 3 composite input variables.
Figure 62:
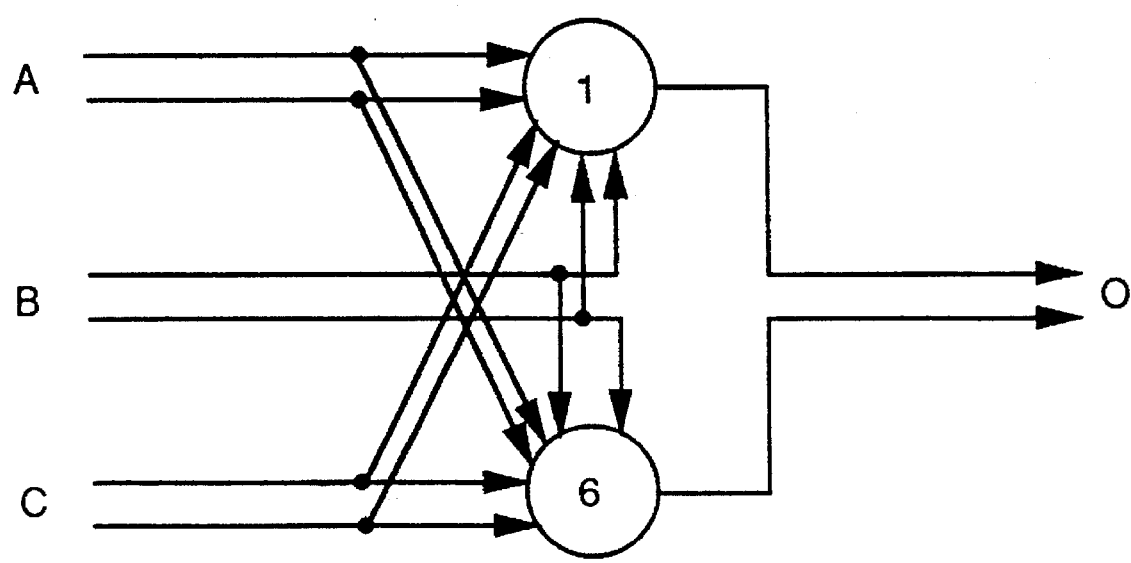
FIG. 62 shows a threshold 3 expression with 3 composite input variables.

Referring to FIG. 61 a composite threshold 2 locus with 3 composite input variables. Several real interaction loci are required but their behavior is the same as a single interaction locus. If any two or more composite variables A or B or C become DATA then the result composite variable will become DATA. Otherwise the composite result variable will remain INTERMEDIATE or NULL. Once the composite result variable becomes DATA it will remain DATA or INTERMEDIATE until all of the composite input variables become NULL. As can be seen from this example composite threshold functions can be expressed for any threshold and any number of composite input variables FIG. 62 shows a threshold 3 locus with 3 composite input variables.

C. Summary

As has been shown it is essential to the integrity of the iterative resolution process to be able to determine the completeness of the resolution of the value wavefronts. Both of the general solutions presented above allow for the determination of the completion of both the DATA value wavefront and the NULL value wavefront. In so doing they insure the integrity of the iterative resolution of succeeding combinations of DATA values.

It should be noted that both of these solutions are completely logical in nature. In both solutions the validity of a DATA value is determinable by the arrival of the DATA value itself. Neither solution requires any external control or timing variables and are independent of their own internal prorogation delays.

As many changes are possible to the embodiments of this invention utilizing the teachings thereof, the descriptions above, and the accompanying drawings should be interpreted in the illustrative and not the limited sense.

That which is claimed:

1. A null convention threshold element in a null convention circuit, signals in the null convention circuit characterized by having a discrete number of allowed values including at least a null value and a non-null value, the threshold element, comprising:

an output interface presenting a null convention output signal, a feedback-input interface receiving the null convention output signal, and a plurality of data-input interfaces, each receiving an input null convention signal;

wherein the threshold element switches the output signal according to a set of transform rules specifying that:

1) the output signal switches from a null value to non-null value when the number of non-null signals presented to the data-inputs exceeds a threshold value, 2) the output signal switches from a non-null value to a null value when all signals presented to the data-inputs are null signals, and 3) there is at least one condition for which the number of non-null signals presented to the data-inputs is less than the threshold value and the output signal retains a non-null value.

2. The threshold element of claim 1 further comprising a plurality of feedback-input interfaces, each receiving the null convention output signal.

3. The threshold element of claim 1 further comprising a number of feedback-input interfaces, each receiving the null convention output signal, the number of feedback connections equal to one less than the threshold value.

4. A logic system comprising:

electronic signal processing elements; and transmission elements interconnecting said processing elements and transmitting allowed values from processing element outputs to processing element inputs, said allowed values including at least a data value and a NULL value which is a non-data value;

wherein a plurality of processing elements are NULL convention processing members having inputs and outputs, each processing member characterized by a total number of at least three inputs and a threshold number, each processing member resolving input allowed values to an output allowed value such that each:

(a) asserts a data value as the output allowed value when a number of input data values is greater-than-or-equal-to the threshold number and less than the total number of inputs;

(b) asserts a NULL value as the output allowed value when all input data values are NULL; and (c) does not switch its output allowed value to the NULL value when the count of input data values is greater than zero and less than the threshold number.

5. The logic system of claim 4 wherein a first group of inputs to a NULL convention processing member are characterized as a first mutually exclusive assertion group in which at most one input asserts a date value at a time.

6. The logic system of claim 4 wherein transmitted allowed values for a single transmission element include at most one data value and one NULL value.

7. The logic system of claim 4 wherein a processing member includes at least one feedback input derived from the processing member output.

8. The logic system of claim 4 wherein a processing member includes at least one feedback input derived from the processing member output, and said feedback input is counted as an input when resolving input allowed values to an output allowed value.

9. The logic system of claim 4 wherein processing members and transmission elements are interconnected to express an arithmetic process.

10. The logic system of claim 4 wherein processing members and transmission elements are interconnected to express a combinational logic process.

11. The logic system of claim 4 wherein processing members and transmission elements are interconnected to express a sequential logic process.

12. The logic system of claim 4 wherein processing members and transmission elements are interconnected to express a boolean logic process.

13. The logic system of claim 4 wherein processing members and transmission elements are interconnected to express an asynchronous process.

14. A NULL convention logic system comprising:

a plurality of processing elements; and a plurality of transmission elements interconnecting said processing elements and transmitting allowed values from processing element outputs to processing element inputs, said allowed values including at least a data value, an intermediate value, and a NULL value;

wherein a plurality of processing elements are NULL convention processing members having inputs and outputs, each processing member characterized by a total number of at least three inputs and a threshold number, each processing member resolving input allowed values to an output allowed value such that each processing member:

(a) asserts a data value as the output allowed value when a number of input data values is greater-than-or-equal-to the threshold number and less than the total number of inputs;

(b) asserts a NULL value as the output allowed value when all input data values are NULL; and (c) exhibits hysteresis such that it maintains an asserted data value or an intermediate value until all inputs become NULL.

15. The logic system of claim 14 wherein a first group of inputs to a NULL convention processing member are characterized as a first mutually exclusive assertion group in which at most one input asserts a date value at a time.

16. The logic system of claim 14 wherein transmitted allowed values for a single transmission element include at most one data value, one NULL value and one intermediate value.

17. The logic system of claim 14 wherein a processing member includes at least one feedback input derived from the processing member output.

18. The logic system of claim 14 wherein a processing member includes at least one feedback input derived from the processing member output, and said feedback input is counted as an input when resolving input allowed values to an output allowed value.

19. The logic system of claim 14 wherein processing members and transmission elements are interconnected to express an arithmetic process.

20. The logic system of claim 14 wherein processing members and transmission elements are interconnected to express a combinatorial logic process.

21. The logic system of claim 14 wherein processing members and transmission elements are interconnected to express a sequential logic process.

22. The logic system of claim 14 wherein processing members and transmission elements are interconnected to express a boolean logic process.

23. The logic system of claim 14 wherein processing members and transmission elements are interconnected to express an asynchronous process.

24. An electronic processing element for performing processing operations on NULL convention signals, said NULL convention signals having at least one meaningful value indicative of a data value and at least one NULL value having no data significance, said processing element comprising:

a plural number of inputs, each input receiving one of a plural number of NULL convention input signals, said plural number being greater than two; and a threshold switching element with hysteresis responsive to the values of the NULL convention input signals to generate a NULL convention output signal, wherein said switching element with hysteresis is characterized as:

(i) switching the output signal to the NULL value when all input signals have the NULL value;

(ii) switching the output signal from the NULL value to a data value when a number of inputs having a data value increases from less than a threshold number to greater-than-or-equal-to the threshold number, said threshold number being less than the plural number of inputs; and holding the output in a non-NULL value when the number of inputs having data values decreases from the threshold number to a non-zero number less than the threshold number.

25. A processing element as in claim 24 wherein said hysteresis switching element includes:

a threshold processing element characterized as (i) generating a data value at an output when a number of input signals having a data value increases from less than a threshold number to greater than the threshold number, and (ii) generating a non-data value at the output when a number of input signals having a data value decreases from greater than the threshold number to less than the threshold; and a feedback connection connecting the output to a feedback input, said feedback input counting as in input for switching.

26. A processing element as in claim 25 further including a plurality of feedback connections connecting the output to a plurality of feedback inputs, each feedback input counting as an input for switching.

27. A processing element as in claim 24 wherein said switching element with hysteresis comprises a state machine.

28. An electronic processing system for performing processing operations on NULL convention signals, said NULL convention signals having at least one meaningful value indicative of a data value and at least one NULL value having no data significance, said system comprising a plurality of interconnected processing element, each said element comprising:

a plural number of inputs, each input receiving one of a plural number of NULL convention input signals, said plural number being greater than two; and a threshold switching element with hysteresis responsive to the values of the NULL convention input signals to generate a NULL convention output signal, wherein said switching element with hysteresis is characterized as:

(i) switching the output signal to the NULL value when all input signals have the NULL value;

(ii) switching the output signal from the NULL value to a data value when a number of inputs having a data value increases from less than a threshold number to greater-than-or-equal-to the threshold number, said threshold number being less than the plural number of inputs; and holding the output in a non-NULL value when the number of inputs having data values decreases from the threshold number to a non-zero number less than the threshold number.

29. A processing element as in claim 28 wherein the NULL convention signals are further characterized as having two values, wherein a first value constitutes a data value, and a second value constitutes the NULL value.

30. A system as in claim 28 wherein the NULL convention signals are further characterized as having three values, wherein a first value constitutes a first data value, a second value constitutes a second data value, and a third value constitutes the NULL value.

31. A processing system as in claim 28 wherein each value is represented as a different voltage level.

32. A processing system as in claim 28 wherein the NULL convention signals are further characterized has having three values, wherein a first value constitutes a first data value, a second value constitutes the NULL value, and a third value constitutes an intermediate value which is neither the NULL value nor a data value.

33. A processing system as in claim 28 wherein the NULL convention signals are further characterized has having four values, wherein a first value constitutes a first data value, a second value constitutes a second data value, a third value constitutes the NULL value, and a fourth value constitutes an intermediate value which constitutes neither the NULL value nor a logical value.

34. The processing system of claim 28 wherein said data values represent logic values.

35. The processing system of claim 28 wherein said data values represent numeric values.

36. The processing system of claim 28 wherein:

threshold elements are connected to form a mutually exclusive assertion group of at least three NULL convention signals;

the NULL convention signals of said group each have a NULL value and a data value; and only one signal of the group asserts a data value at time.

* * * * *